(12) United States Patent
Toda

(10) Patent No.: US 7,529,130 B2
(45) Date of Patent: *May 5, 2009

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

This patent is subject to a terminal disclaimer.

(21) Appl. No.: 11/389,252

(22) Filed: Mar. 27, 2006

(65) Prior Publication Data

US 2006/0239073 A1    Oct. 26, 2006

(30) Foreign Application Priority Data

Apr. 15, 2005   (JP) ............................. 2005-118535

(51) Int. Cl.
*G11C 16/06* (2006.01)
(52) U.S. Cl. ............................. 365/185.12; 365/185.03; 365/185.17
(58) Field of Classification Search ............ 365/185.21, 365/185.03, 185.17
See application file for complete search history.

(56) References Cited

U.S. PATENT DOCUMENTS

| 5,594,691 | A |   | 1/1997 | Bashir |   |
|---|---|---|---|---|---|
| 5,986,929 | A | * | 11/1999 | Sugiura et al. | ......... 365/185.03 |
| 6,038,169 | A | * | 3/2000 | Ogura et al. | ............ 365/185.11 |
| 6,191,977 | B1 | * | 2/2001 | Lee | ........................ 365/185.21 |
| 6,288,935 | B1 |   | 9/2001 | Shibata et al. |   |
| 6,807,096 | B2 |   | 10/2004 | Toda |   |
| 6,847,555 | B2 |   | 1/2005 | Toda |   |
| 2005/0213387 | A1 | * | 9/2005 | Kubo et al. | ............ 365/185.21 |

FOREIGN PATENT DOCUMENTS

| JP | 8-180693 | 7/1996 |
|---|---|---|
| JP | 9-91971 | 4/1997 |
| JP | 10-92186 | 4/1998 |
| JP | 2004-206833 | 7/2004 |
| JP | 2004-319007 | 11/2004 |

OTHER PUBLICATIONS

U.S. Appl. No. 11/561,194, filed Nov. 17, 2006, Toda.
U.S. Appl. No. 11/623,907, filed Jan. 17, 2007, Suzuki et al.
U.S. Appl. No. 11/625,160, filed Jan. 19, 2007, Toda.
U.S. Appl. No. 11/692,501, filed Mar. 28, 2007, Edahiro et al.
U.S. Appl. No. 11/750,052, filed May 17, 2007, Suzuki et al.
U.S. Appl. No. 11/832,987, filed Aug. 2, 2007, Toda.

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes: a memory cell array with electrically rewritable and non-volatile memory cells arranged therein; and a sense amplifier circuit configured to read out data of the memory cell array, wherein a plurality of information cells, in each of which one of $M(M \geq 2)$ physical quantity levels is written, and at least one reference cell, in which a reference physical quantity level is written, are defined in the memory cell array, and the sense amplifier circuit detects a cell current difference between the information cell and the reference cell selected simultaneously in the memory cell array to sense data defined by the M physical quantity levels of the information cell.

20 Claims, 39 Drawing Sheets

FIG. 16

| (HB , LB) | t1 | t2 | t3 |
|---|---|---|---|
| (0 , 0) | 0 | 0 | 0 |
| (0 , 1) | 0 | 1 | 0 |
| (1 , 1) | 1 | 1 | 0 |
| (1 , 0) | 1 | 1 | 1 |

|  | vpo(1) | vpo(2) | vpr(1) | vpr(2) |
|---|---|---|---|---|
| LAT | 1 | 0 | 1 | 0 |

|  | CLK /CLK Generation Step |
|---|---|
| HB Sense | t1 |
| LB Sense | t2 and t3 |

|  | vp0(1) | vp0(2) |
|---|---|---|
| HBL | 0 |  |
| LBL |  | 1 |

|  | vpr(1) | vpr(2) |
|---|---|---|
| HBL | 0 |  |
| LBL |  | 1 |

|  | vp1 | | vp2 | | vp3 | |
|---|---|---|---|---|---|---|
| HBL | 0 | 1 | 0 | 1 | 0 | 1 |
| LBL | 0 1 | 0 1 | 0 1 | 0 1 | 0 1 | 0 1 |

SEMICONDUCTOR MEMORY DEVICE

CROSS-REFERENCE TO RELATED APPLICATION

This application is based on and claims the benefit of priority from the prior Japanese Patent Application No. 2005-118535, filed on Apr. 15, 2005, the entire contents of which are incorporated herein by reference.

BACKGROUND OF THE INVENTION

1. Field of the Invention

This invention relates to a semiconductor memory device, in which electrically rewritable and non-volatile memory cells are arranged.

2. Description of Related Art

EEPROM flash memories are generally classified into NAND-type and NOR-type ones. A NAND-type flash memory is formed of NAND strings (i.e., NAND cell units) each having plural memory cells connected in series in such a way that adjacent cells share source/drain diffusion layers. Therefore, the cell density is higher than that of a NOR-type one. Besides the NAND-type flash memory has a feature with low power consumption because plural memory cells may be written in a lump by use of FN tunnel current. Considering these features, the NAND-type flash memory is mainly applied to a file memory with a large capacity.

By contrast, since a NOR-type flash memory has, in spite of the large power consumption, a possibility of high speed access, it is mainly applied to mobile apparatuses.

Recently, however, a mobile apparatus tends to deal with an image data and the like with a large quantity of data. Therefore it is required of the mobile apparatus to contain a flash memory which has a high-speed performance and a large capacitance with the same level as a file memory. Accordingly, to adapt a NAND-type flash memory to a high-speed system with a buffer memory such as DRAMs, there has been provided a method of improving the data transmission rate, in which, for example, cell data is read out to a page buffer and then serially transferred and output.

Even the above-described method is used, there is a limit for improving the speed of the NAND-type flash memory because cell current thereof is one several tenth of that of a NOR-type flash memory, so that it is difficult to sense data at a high rate as in the NOR-type flash memory with a reference level. Since the sense amplifier used in a NAND-type flash-memory senses cell data with detecting whether the bit line voltage is discharged or not in accordance with cell data, it takes a time by the micro second for data-sensing.

To increase the cell current of the NAND-type flash memory, it is useful to increase the cell size (i.e., channel width), but this will dilute such a feature of the NAND-type flash memory that the cell area is small.

For the purpose of making possible to store a large quantity of data, there has been provided a flash memory with a multi-value data storage scheme. Further, there has been provided a method of reducing the read time by reducing the read number in the multi-value data storage scheme (for example, refer to Unexamined Japanese Patent Application Publication No. 2001-93288).

Also, there has been provided a memory device with a multi-value data storage scheme, in which two memory cells connected to a pair of bit lines constitute a pair cell, and multi-value data is stored as been defined by a combination of different threshold voltages in the pair cell (for example, refer to Unexamined Japanese Patent Application Publication No. 2004-319007).

SUMMARY OF THE INVENTION

According to an aspect of the present invention, there is provided a semiconductor device including:

a memory cell array with electrically rewritable and non-volatile memory cells arranged therein; and a sense amplifier circuit configured to read out data of the memory cell array, wherein a plurality of information cells, in each of which one of $M(M \geq 2)$ physical quantity levels is written, and at least one reference cell, in which a reference physical quantity level is written, are defined in the memory cell array, and the sense amplifier circuit detects a cell current difference between the information cell and the reference cell selected simultaneously in the memory cell array to sense data defined by the M physical quantity levels of the information cell.

According to another aspect of the present invention, there is provided a semiconductor memory device including:

first and second cell arrays each having electrically rewritable and non-volatile memory cells arranged therein and a plurality of information cell blocks and at least one reference cell block defined therein, each memory cell in the information cell blocks serving as a information cell to be written into one of M physical quantity levels, where $M=2^n$ (n: an integer equal to or more than 2), each memory cell in the reference cell block serving as a reference cell to be written into a reference physical quantity level; and a sense amplifier circuit configured to detect a cell current of an information cell selected in one of the first and second cell arrays in comparison with a reference current of a reference cell selected in the other cell array, thereby sensing M-value data defined by the M physical quantity levels.

BRIEF DESCRIPTION OF THE DRAWINGS

FIG. 16 shows read data bits in the 4-value data storage scheme (part 1).

DETAILED DESCRIPTION OF THE EMBODIMENTS

Illustrative embodiments of this invention will be explained with reference to the accompanying drawings below.

In a semiconductor memory device in accordance with this embodiment, the main portion of the memory cell array is set as an area of "information cells", into each of which one of plural physical quantity levels (i.e., data levels) is written while the remaining portion is set as an area of "reference cell(s)", into which a fixed reference physical quantity level (i.e., reference level) is written for serving for detecting the data levels. In other words, for plural information cells, there is prepared a common reference cell, which constitutes a pair with each of the plural information cells.

As a result, the semiconductor memory in accordance with this embodiment generally stores M-value data (where, $M \geq 2$) on the assumption that an information cell is set to be in a state selected in M levels. That is, in case of M=2, binary data storage is achieved; and in case of M=3, three-value data storage is achieved.

In consideration of data processing, multi-value data is preferably set to have the number of data states defined by a power of 2. Therefore, to perform a preferable multi-value data storage scheme, levels to be set in one information cell are selected as being $M=2^n$ (where, n=2, 3, 4, . . . ).

In the embodiments described below, cell's threshold voltage levels are used as the physical quantity levels (data levels).

[Memory Chip Configuration]

Figure 1:
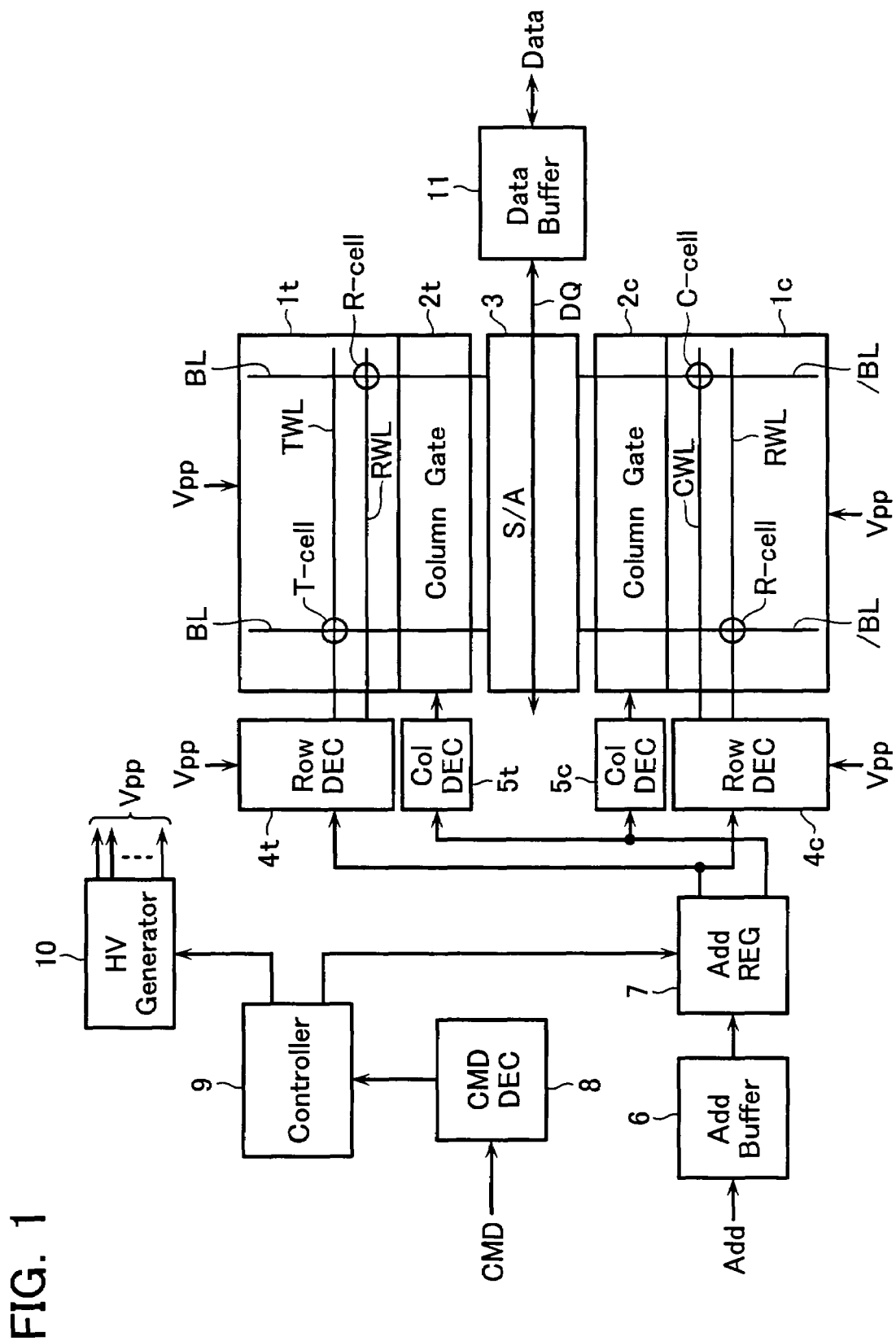
FIG. 1 shows a functional block configuration of a NAND-type flash memory in accordance with an embodiment of the present invention.

FIG. 1 shows a NAND-type flash memory configuration in accordance with an embodiment. A memory cell array 1 is divided into two cell arrays 1t and 1c, which share a sense amplifier circuit 3. In this cell array configuration, it is used such an open bit line scheme that bit lines BL and /BL are simultaneously selected in the cell arrays 1t and 1c, and constitute a pair.

Main memory cells arranged in each cell array 1t, 1c are used as "information cells" for storing data, and the remaining cell(s) is used as "reference cell(s)" for storing a reference level for data-reading. Data in the cell arrays 1t and 1c are reversed in logic. In the below-description, an information cell in the cell array 1t is referred to as "T-cell" while one in the cell array 1c is referred to as "C-cell". There is prepared at least one reference cell, "R-cell", in each cell array 1t, 1c.

At a data read time, while an information cell T-cell is selected in one cell array 1t with a word line TWL and the bit line BL in a pair of bit lines BL and /BL, a reference cell R-cell is selected in the other cell array 1c with a reference word line RWL, which is selected simultaneously with the word line TWL, and the bit line /BL, and these cells T-cell and R-cell constitute a pair.

Similarly, while an information cell C-cell is selected in one cell array 1c with a word line CWL and the bit line /BL in a pair of bit lines BL and /BL, a reference cell R-cell is selected in the other cell array 1t with a reference word line RWL, which is selected simultaneously with the word line CWL, and the bit line BL, and these cells C-cell and R-cell constitute a pair.

There is no difference in structure between the information cells T-cell, C-cell and the reference cell R-cell. One reference cell R-cell is fixedly selected in the cell array 1c in correspondence with plural information cells T-cell in the cell array 1t; and one reference cell R-cell is fixedly selected in the cell array 1t in correspondence with plural information cells C-cell in the cell array 1c.

The reason why the open bit line scheme is used in this embodiment is that, as explained later, it is in need of applying different voltages to a word line (TWL or CWL) and a reference word line RWL, which are simultaneously selected.

A pair of bit lines BL and /BL in the cell arrays 1t and 1c are selected with column gates 2t and 2c to be coupled to the sense amplifier circuit 3. Data transferring between the sense amplifier circuit 3 and external input/output terminals is performed via a data bus DQ disposed on the area of the sense amplifier circuit 3 and a data buffer 11.

The column gates 2t and 2c are controlled with column decoders 5t and 5c, respectively. There are prepared word line select/drive circuits (i.e., row decoders) 4t and 4c for selectively driving word lines in the cell arrays 1t and 1c, respectively.

Address, Add, is supplied to the row decoders 4t, 4c and column decoders 2t, 2c via address buffer 6 and address register 7.

Command, CMD, supplied from the outside of the chip for defining an operation mode, is decoded in a command decoder 8 and supplied to a controller 9, which controls write and erase sequences and a data read operation.

It is required of the cell arrays 1t, 1c and row decoders 4t, 4c and so on to be applied with various high voltages Vpp serving as write voltage Vpgm, verify voltage Vr, pass voltages Vpass, Vread and the like used in accordance with operation modes. To generate such the high voltages Vpp, there is prepared a high voltage generation circuit 10, which is also controlled with the controller 9.

Figure 2:
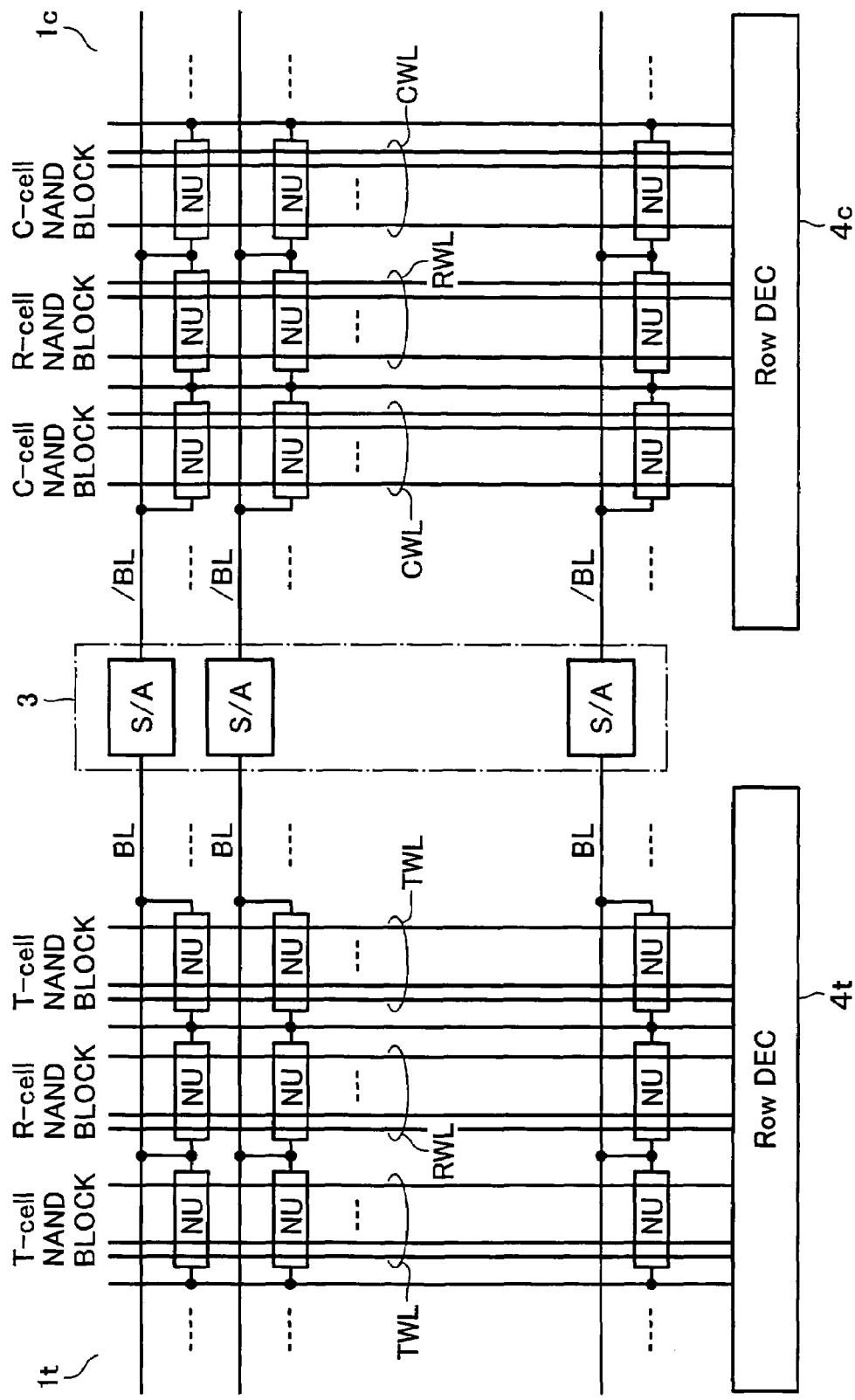
FIG. 2 shows a layout of the cell array and the sense amplifier circuit of the flash memory.
Figure 3:
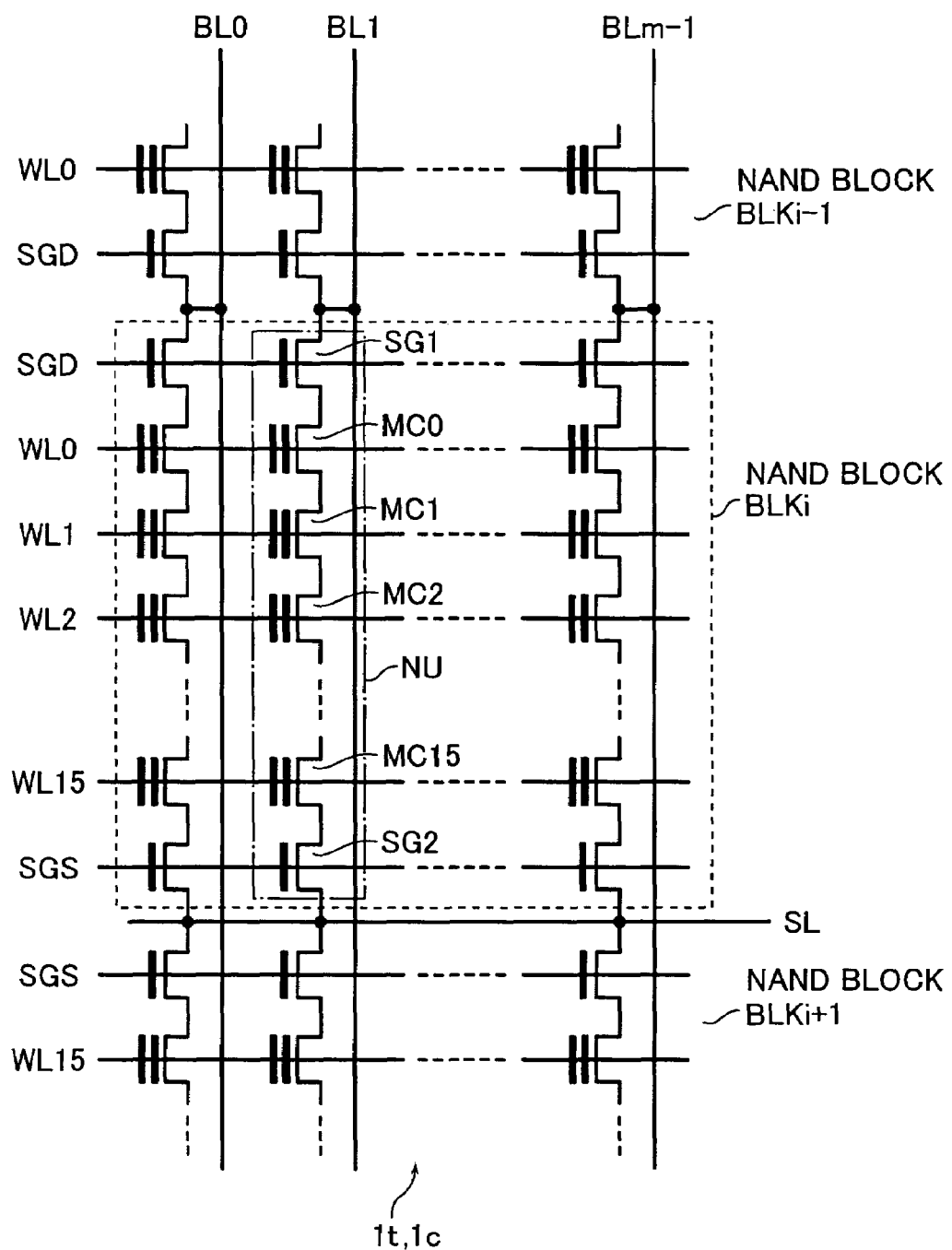
FIG. 3 shows a detailed configuration of the cell array.

FIGS. 2 and 3 show a detailed internal configuration of the cell arrays 1t and 1c. As shown in FIG. 2, each of the cell arrays 1t and 1c is formed of a plurality of NAND cell units (i.e., NAND strings), NU, arranged in a matrix manner. Each NAND string NU has, as shown in FIG. 3, a plurality of (sixteen in the example shown in the drawing) electrically rewritable and non-volatile semiconductor memory cells, MC0-MC15, connected in series. Each memory cell is a MOS transistor with a stacked gate structure of a floating gate and a control gate, which stores data in accordance with the carrier storage state of the floating gate in a non-volatile manner.

One end of a NAND string NU is coupled to a bit line BL via a select gate transistor SG1; and the other end to a common source line SL via another select transistor SG2.

Control gates of the memory cells are coupled to different word lines WL0-WL15. Gates of the select gate transistors SG1 and SG2 are coupled to select gate lines SGD and SGS, respectively, which are disposed in parallel with the word lines. A set of NAND strings sharing the word lines WL0-WL15 constitutes a "block" serving as a unit of data erase. Usually, there are prepared plural blocks (BLKi−1, BLKi, BLKi+1,) in the direction of the bit line BL.

As shown in FIG. 2, each one selected in blocks arranged in each of cell arrays 1t and 1c is set as a reference cell(R-cell) block (i.e., R-cell NAND block); and the remaining blocks as information cell(T-cell, C-cell) blocks (i.e., T-cell, C-cell NAND blocks). Which NAND block is used as a reference cell block is optional, but once a reference cell block is selected, it should be used fixedly as the reference cell block hereinafter.

The row decoders 4t and 4c select blocks as follows: when one of the information cell blocks is selected in the cell array 1t, a reference cell block is selected simultaneously in the cell array 1c; and when one of the information cell blocks is selected in the cell array 1c, a reference cell block is selected simultaneously in the cell array 1t.

Suppose that, for example, the uppermost bit "0" and "1" of the block address are assigned to the cell arrays 1t and 1c, respectively. Further, the row decoders 4t and 4c are configured to have such a selection mode that in case of the uppermost bit="0", the reference cell block on the cell array 1c side is selected while in case of the uppermost bit="1", the reference cell block on the cell array 1t side is selected.

With respect to address in a block, i.e., address portion for selecting word lines in a block, it may be dealt with that the same address is assigned to the information cell block and the reference cell block. With this address assignment, it is possible to select a word line TWL (or CWL) and a corresponding reference word line RWL in the information cell block and the reference cell block, respectively.

Figure 4:
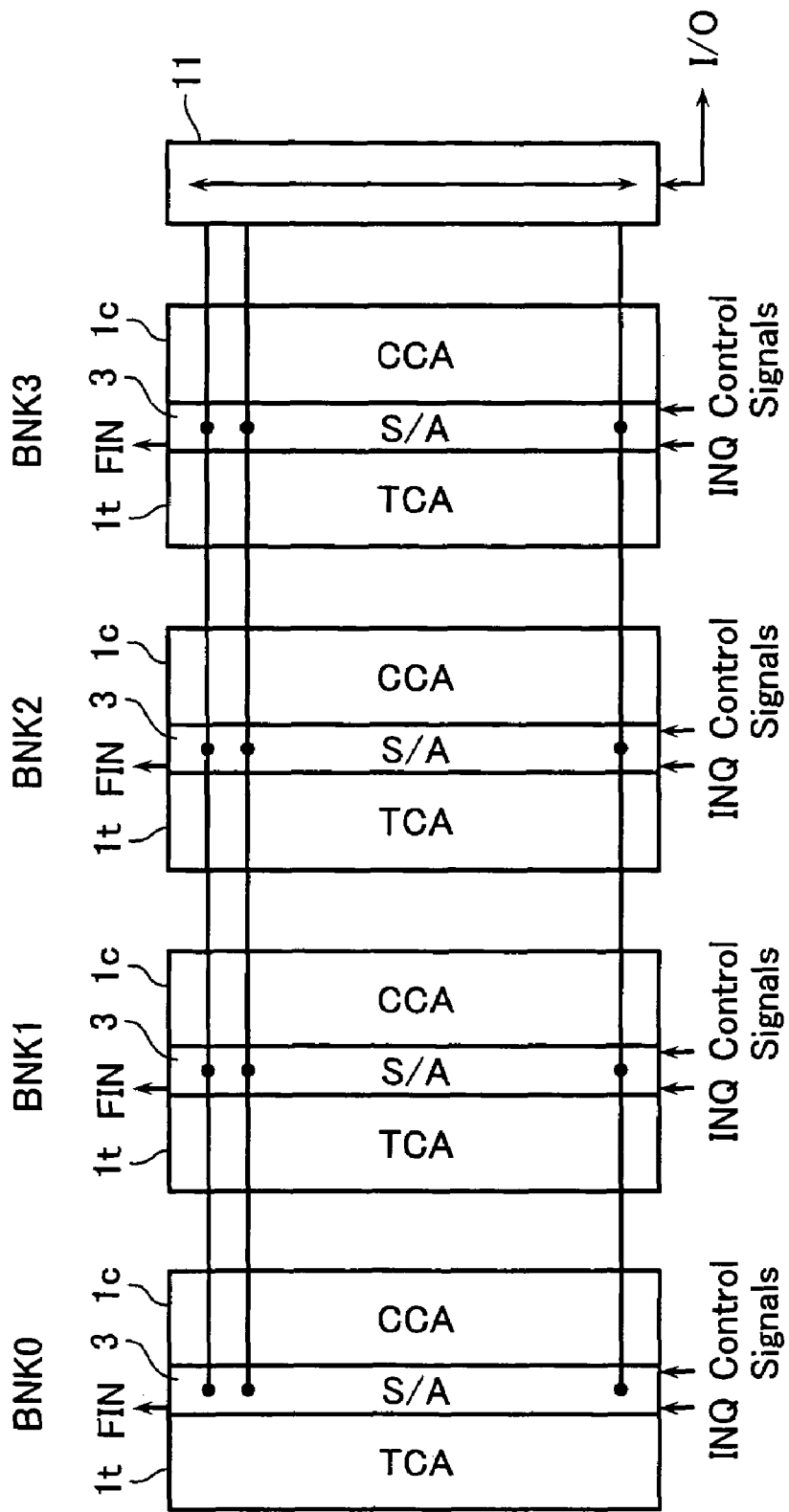
FIG. 4 shows a layout example of plural page banks.

FIG. 1 shows only one sense amplifier circuit serving as a page buffer and two cell arrays 1t and 1c sharing it. In a practical memory chip, as shown in FIG. 4, one sense amplifier circuit 3 for reading one page data and two cell arrays 1t and 1c sharing it constitute a unit serving as a "page bank", and a plurality of page banks, four page banks BNK0-BNK3 in the example shown in FIG. 4, are arranged as sharing data lines DQ and /DQ. With this arrangement, it becomes possible to do an interleave operation among the page banks, thereby being possible to do continuous page access.

Figure 5:
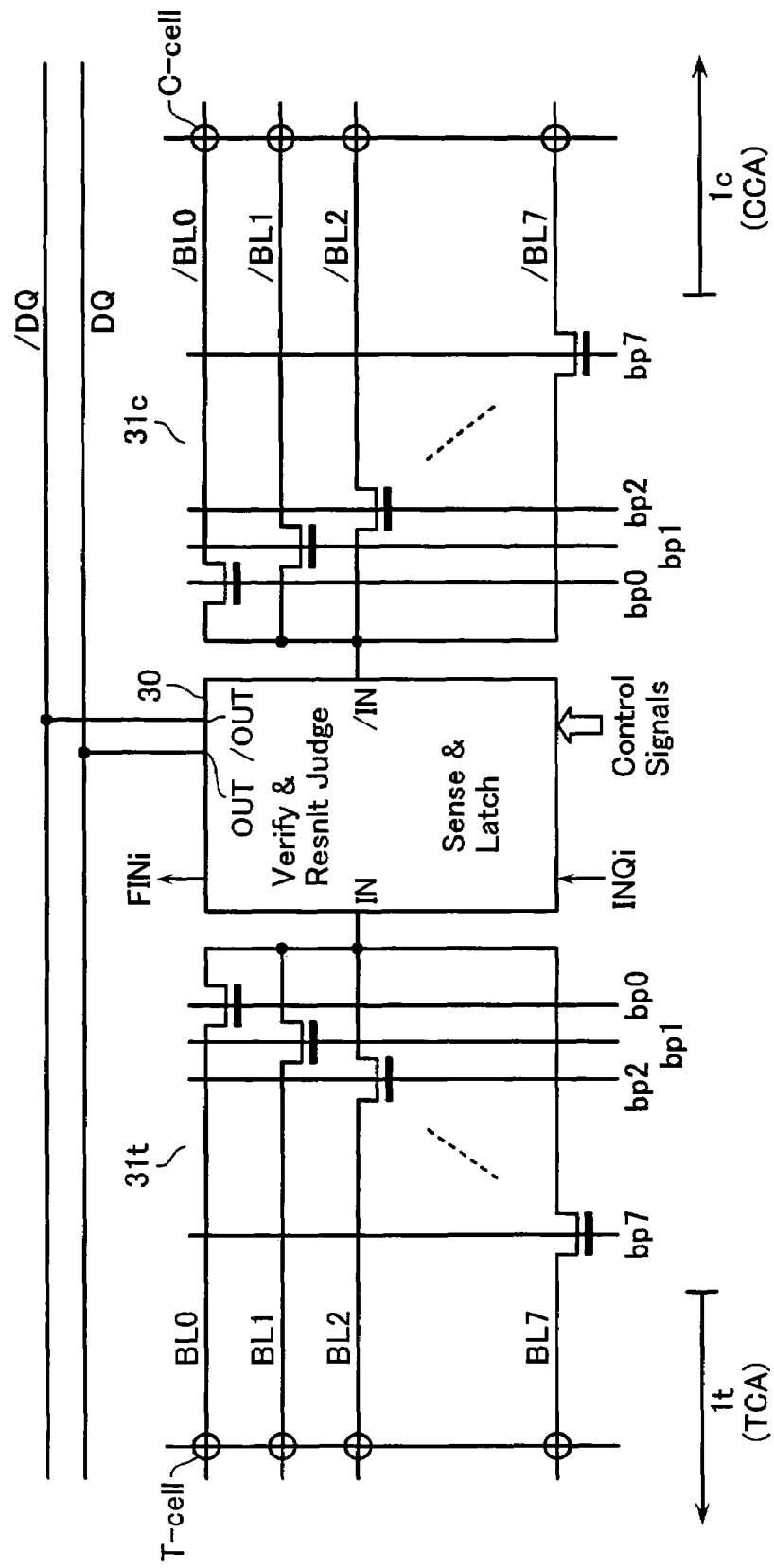
FIG. 5 shows bit line select circuits disposed between the cell arrays and the sense amplifier circuit.

FIG. 5 shows a sense unit 30 and bit line select circuits 31t and 31c for selecting a bit line pair in the sense amplifier circuit 3. The sense unit 30 has, as described later, a sense-latch system for sensing and holding data and a verify-judge system for verifying data write or erase and judging the verified result.

Each of the bit line select circuits 31t and 31c selects one in eight bit lines BL0-BL7 in the cell arrays 1t and 1c, respectively, based on select signals bp0-bp7, and couples it to the sense unit 30. That is, the select circuits 31t and 31c select one of eight pairs of bit lines. Select signals bp0-bp7 constitute a part of a page address signal.

To the sense unit 30, various control signals are input. INQi and FINi are input and output signals, respectively, used for judging the verified result at a data write time or an erase time. The sense-latch system is selectively connectable to the data lines DQ and /DQ, which serve as global data lines. The pair of data lines DQ, /DQ are, as shown in FIG. 4, disposed over the entire page banks, and serve for data-transferring between selected page banks.

With the input and output signals INQi and FINi used for judging verified result, a verify-judging circuit is configured for each page bank with satisfying such a relationship that output signal FINi from a certain sense unit serves as input signal INQi+1 for the following sense unit. In a verify-write or verify-erase sequence, when data write or erase for a page bank has been finished in its entirety, the final output signal FIN(="H") is output as a pass flag.

Each pair of data lines DQ and /DQ is suitably selected in the data buffer 11, so that output data is transferred terminals I/O of the memory chip, and if necessary bit width conversion may be performed in the data buffer 11.

Figure 6:
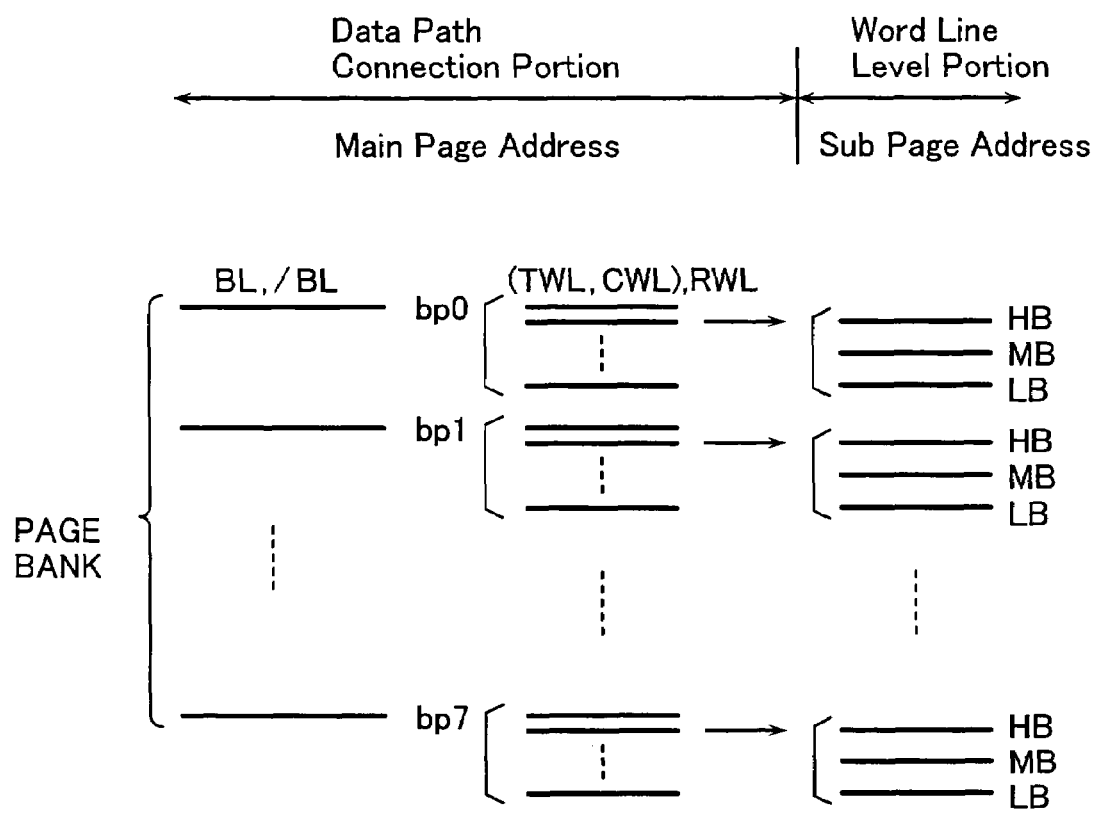
FIG. 6 shows a page address structure.

Each of erase-verify, write and read is performed in a lump for the entire memory cells in each page in a page bank. An address structure for page-selecting as described above is shown schematically in FIG. 6.

Address includes a data path connection portion for defining what information cell is to be connected to a sense unit and a word line level portion for defining how to set the level of a selected pair of word lines. The data path connecting portion is a main page address for selecting pairs of bit lines BL, /BL, the number of which corresponds to that of sense units in a page bank, and a pair of word lines TWL (or CWL) and RWL. A set of memory information cells simultaneously selected with the main address constitutes one page serving as a unit of data write and read.

The word line level portion is a sub-page address set in the main page address in case of multi-value data storage scheme. This sub-page address selects one of the level combinations between the word lines TWL (or CWL) and CWL, thereby designating bit information of the multi-value data. In detail, in case of a four-value data storage scheme, the sub-page address designates two-bit data of a higher page (higher bit) HB and a lower page (lower bit) LB while in case of an eight-value data storage scheme, the sub-page address designates three-bit data of a higher bit HB, a middle bit MB and a lower bit LB.

Page data is accessed at a time. It should be determined in accordance with the application system of the memory whether bit data of a page are transferred as multi-bit data as it is or subjected to random accessing. Access another page bank during page data is transferred, and it becomes possible to execute a bank interleave operation, so that continuous data transferring may be performed without interrupting.

Since, in case of four-value data write, the history of level setting the four-value data is indispensable, there is such a restriction with respect to the order for selecting the sub-page address in the main page address that the higher page write should be performed in advance of the lower page. So long as this restriction is kept, there is no need of continuously programming the higher bit and lower bit, and it is possible to insert a read operation between the higher bit write and the lower bit write.

With respect to data read, there are two cases as follows: one case where there is a restriction of sub-page selection order; and another case where sub-pages are read out optionally, i.e., independently of each other. Preferably, it is used such a data bit assignment that the sub-pages are read out independently of each other.

[Binary Data Storage Scheme (part 1)]

Figure 7:
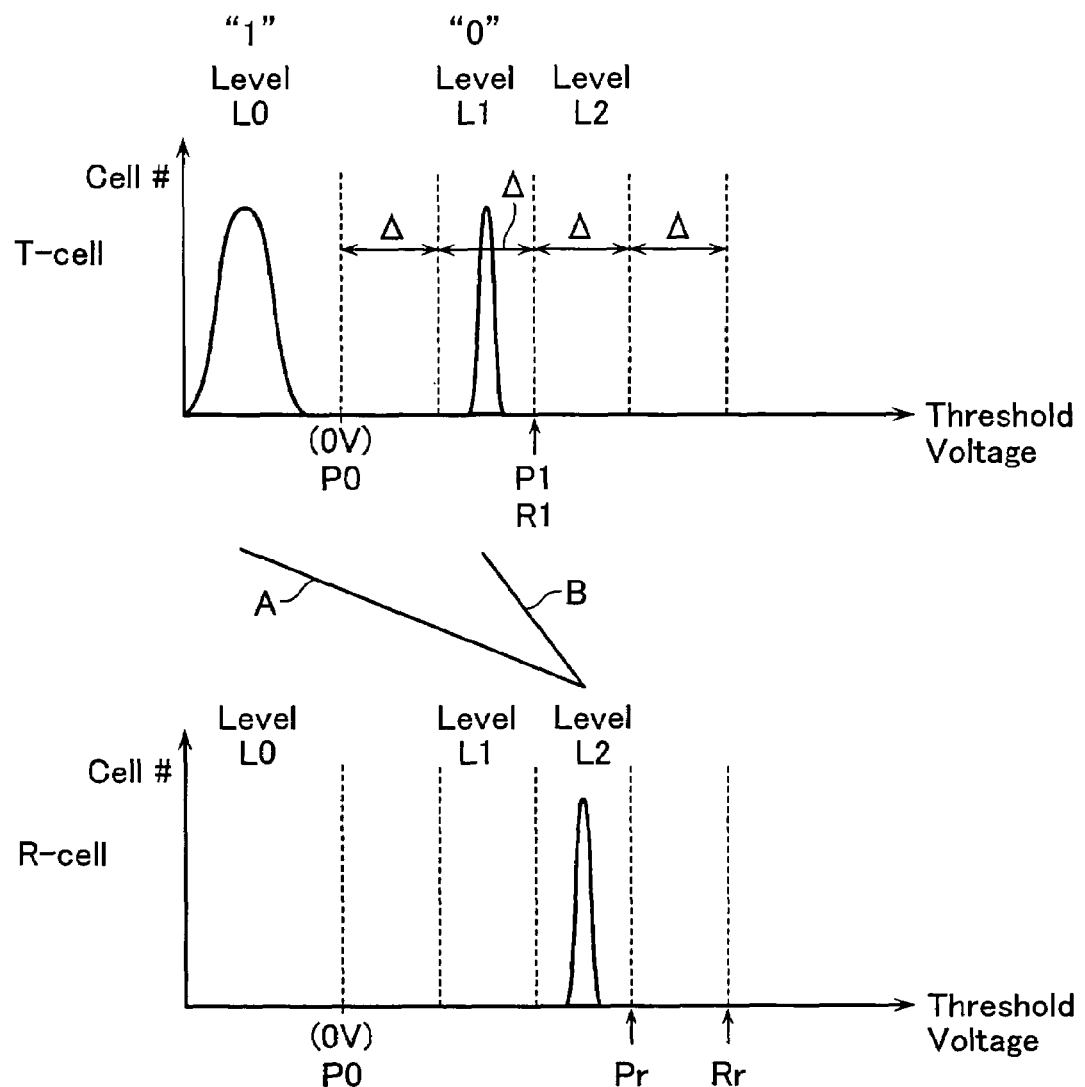
FIG. 7 shows level setting and a data bit assignment method with reference to T-cell and C-cell in a binary data storage scheme (part 1).
Figure 8:
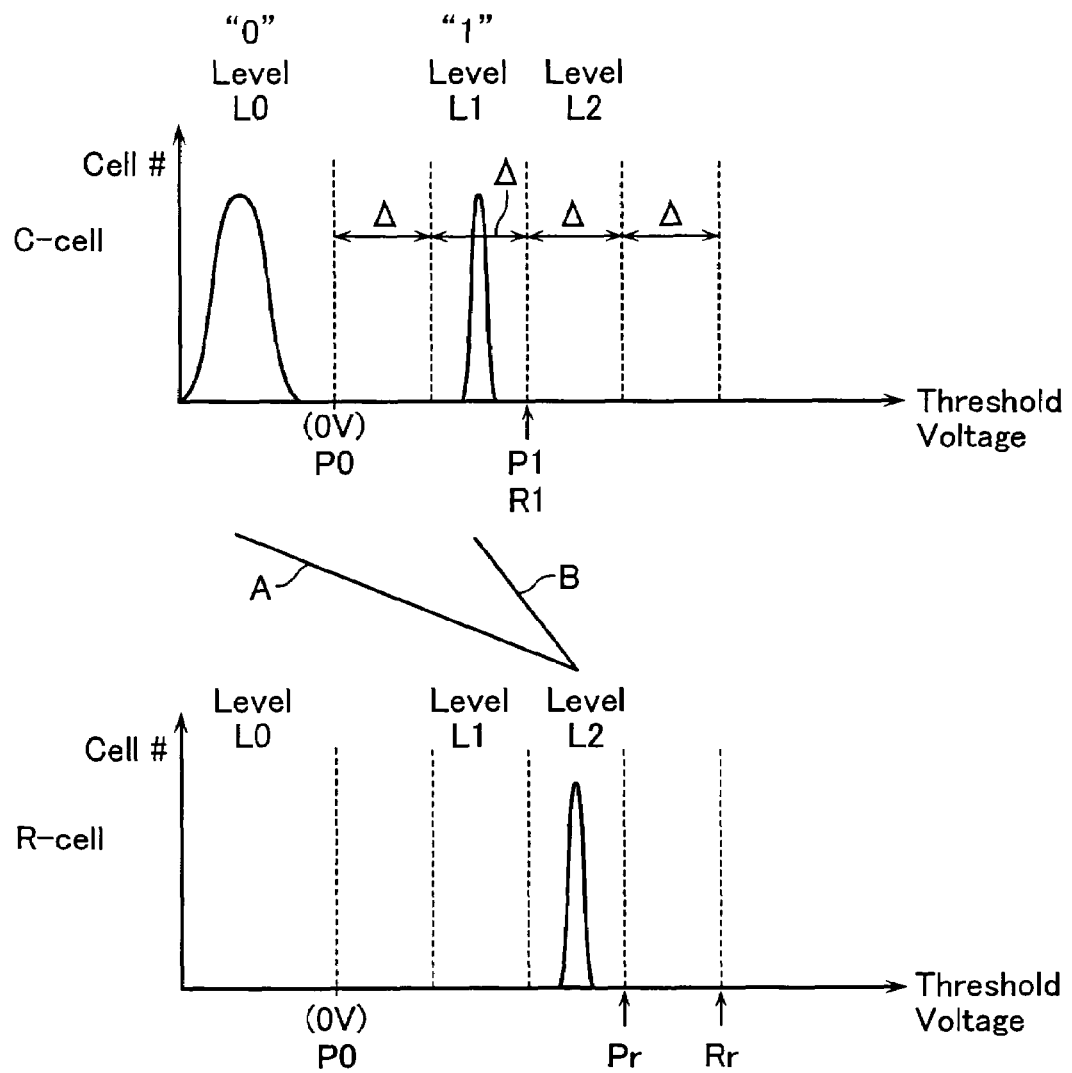
FIG. 8 shows level setting and the data bit assignment method with reference to T-cell and C-cell in the binary data storage scheme (part 1).

FIGS. 7 and 8 show data threshold level distributions and bit assignment of a binary data storage scheme with respect to information cells, T-cell, C-cell and a reference cell R-cell. The information cell T-cell or C-cell is set to have either one of two threshold levels L0 and L1 while the reference cell R-cell is fixedly written to have a threshold level L2 higher than the upper level L1 in the information cell.

L0 is, as described later, an erased state with a negative threshold voltage while L1 and L2 are written states with positive threshold voltages. The erased threshold level L0 is set through an erase operation with erase-verify read voltage P0(=0V). The level L1 is distributed in the negative direction from Vss, but it will not be finely defined by a narrow distribution. The reason is as follows. As explained in detail later, a verify operation in a whole erase mode is performed in such a way that cells are driven with Vss applied to word lines thereof, and the cell current is compared with the reference current. If the cell current is larger than the reference current, it is judged that the erase has been completed. Therefore, no additional operations are performed for narrowing the cell threshold distribution.

By contrast, with respect to the levels L1 and L2, the write verify mode is performed with an operation for narrowing the threshold distribution. That is, each of these levels L1 and L2 has a constant threshold distribution narrower than L0, the upper limit of which is defined by write-verify voltage P1 or Pr and the reference current of the reference cell (described later).

As shown in FIG. 7, a combination state A between the lower level L0 of T-cell and reference level L2 of R-cell is defined as data "1" while another combination state B between the higher level L1 of T-cell and reference level L2 of R-cell is defined as data "0". As shown in FIG. 8, the combination states between C-cell and R-cell are defined by logic data reversed to those shown in FIG. 7. With these cell level states, it is possible to store binary data.

Figure 9:
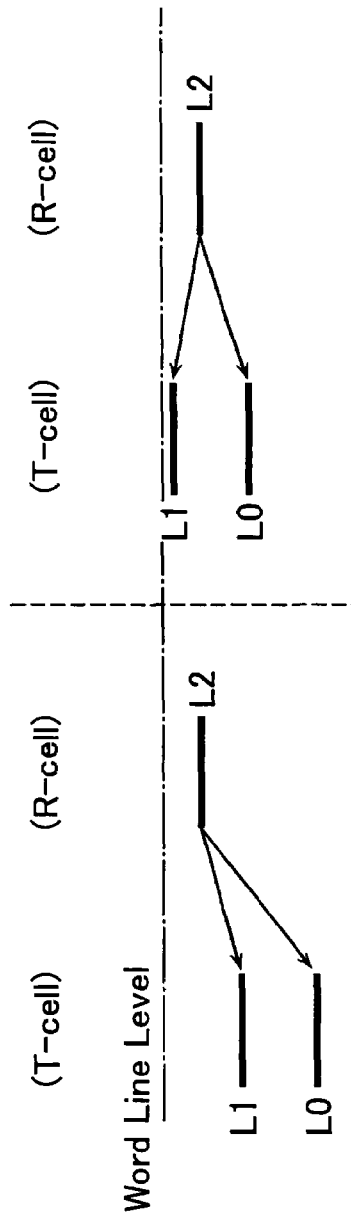
FIG. 9 shows a level relationship of the binary data storage scheme (part 1) viewed from a word line level base and a Vss base.
Figure 9:
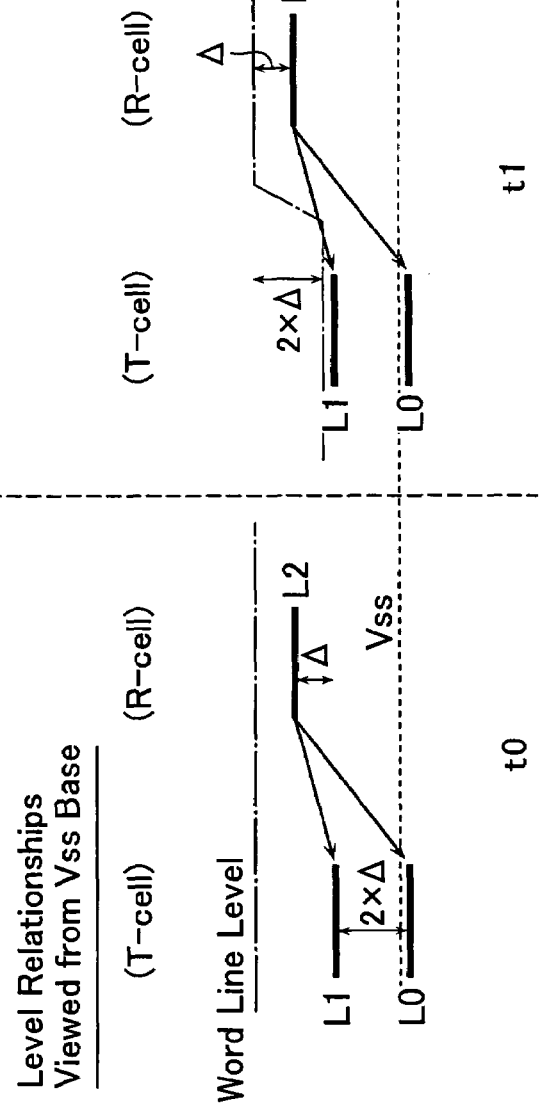

FIG. 9 shows level relationships for reading the binary data with respect to T-cell and R-cell. The upper column in FIG. 9 shows that binary data may be sensed with relative biases applied to levels of T-cell and R-cell on the assumption that the read voltage (i.e., word line level) applied to a selected word line TWL and the reference word line RWL is kept constant through read cycles.

By contrast, the lower column in FIG. 9 shows that the binary data may be practically sensed with word line levels exchanged in accordance with read cycles.

In the initial state (data shrinking time) "t0", level L2 of the reference cell R-cell is near the word line level, and levels L0 and L1 of T-cell are positioned as lower than it. Therefore, supposing that the reference cell current of R-cell is Icell(r), and the information cell currents of T-cell with levels L0 and L1 are I-cell(0) and Icell(1), respectively, a relationship is obtained as follows: Icell(r)<Icell(1)<Icell(0). Therefore, supposing that it is detected a difference between cell currents of T-cell and R-cell, it is impossible to distinguish between levels L0 and L1 of T-cell.

At a read time "t1", the word line level of the information cell T-cell becomes relatively lower than that of R-cell, and the cell current relationship will be changed as follows: Icell(1)<Icell(r)<Icell(0). Therefore, detect the cell current difference between the information cell T-cell and the reference cell R-cell, and it is able to distinguish between levels L0 and L1 of T-cell.

In FIGS. 7 and 8, verify voltage P0 for verifying the erased threshold level L0 is set to be 0V; verify-read voltage P1 at a write time of level L1 is set to be equal to P0+2Δ; and verify-read voltage Pr at a write time of level L2 to P0+3 Δ. These verify voltages P0, P1 and Pr are set to define the upper limits of the respective threshold levels in consideration of variations of the distributions of threshold levels L0, L1 and L2.

At the read time, read voltage R1 applied to the information cell, T-cell or C-cell, is set to be equal to verify-read voltage P1, which is equal to or near the threshold level L1 while read voltage Rr applied to the reference cell R-cell is set to be higher than the verify-voltage Pr for the level L2 by Δ, as defined by: Rr=P1+2Δ (=4Δ).

As a result, the following expressions (1) and (2), which are required for data reading, will be satisfied.

$$R1-L0>Rr-L2 \quad (1)$$

$$Rr-L2>R1-L1 \quad (2)$$

As a result of that the expressions (1) and (2) are satisfied, in case that the information cell T-cell and the reference cell R-cell are selected, cell current Icell(0) and Icell(l) of T-cell in levels L0 and L1, respectively, and cell current Icell(r) of R-cell are satisfied with the following expressions (3) and (4).

$$I\text{cell}(0) > I\text{cell}(r) \quad (3)$$

$$I\text{cell}(1) < I\text{cell}(r) \quad (4)$$

Detecting the cell current difference between the information cell T-cell and the reference cell R-cell based on the above-described expressions (3) and (4), data "0" and "1" of T-cell may be distinguished from each other. Further, detecting the cell current difference between another information cell C-cell and the reference cell R-cell, logically inverted data will be read out.

Note here that in a practical memory operation, there is no need of using the word line bias condition at the initial state (data shrinking period) t0 shown in FIG. 9 because a memory cell is coupled to a bit line via a select gate transistor, which is selectively turned on or off. That is, in a non-selected mode, word lines TWL, CWL and RWL may be set at Vss(=0V) on the condition that the select gate transistor is off. By contrast, at a read time, read voltages R1 and Rr are applied to word lines TWL (or CWL) and RWL, respectively, in such a state that the select gate transistor is on, so that it may be detected the cell current difference.

Figure 10:
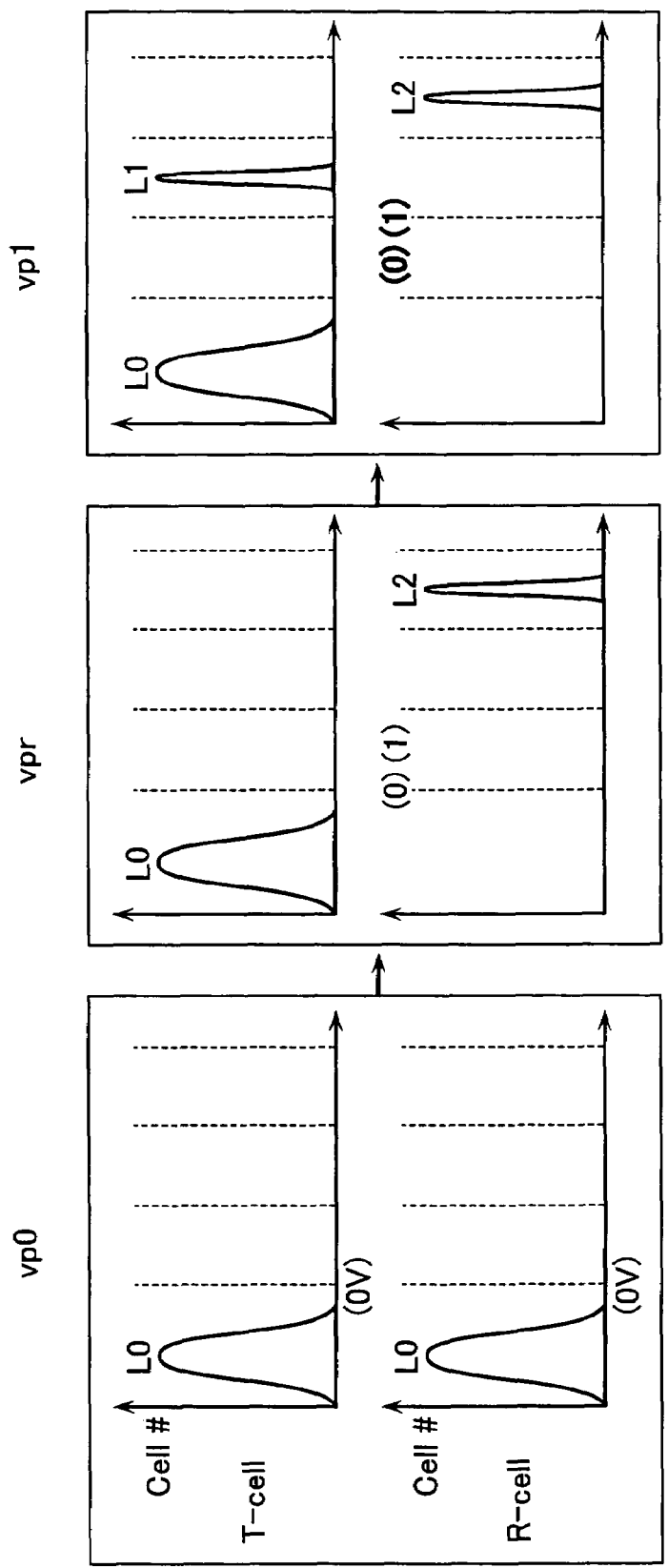
FIG. 10 shows a write sequence in the binary data storage scheme (part 1).

FIG. 10 shows an erase/write sequence in the above-described binary data storage scheme (part 1) by giving attention to the information cell T-cell and the reference cell R-cell. With respect to the information cell C-cell, the same sequence will be used as shown in FIG. 10.

"vp0" is an erase-verify step of cells. At this erase step vp0, as described in detail later, an erase voltage applying operation for cells in a selected block and an erase-verify operation are repeatedly performed. The erase-verify operation is executed in such a way as to compare a cell current on the condition that Vss is applied to word lines in the selected block with a reference cell current of a reference transistor prepared in the sense amplifier circuit, effective threshold voltage of which is Vref. As a result, the entire cells in the selected block are set to be in a state of the lowest threshold level L0, i.e., a state where cell current is certainly detected as "1".

"vpr" and "vp1" are verify-write steps for sequentially writing the reference cell R-cell and the information cell T-cell with the erased threshold distribution. At these steps, write data "0" or "1" is transformed to a cell level, and then applied to a selected cell.

At the reference cell write step "vpr", write data "0" or "1" is applied, so that the threshold level of the reference cell R-cell is increased to L2. In detail, write data is loaded in the data latch in the sense unit 30, and a selected bit line is coupled to the sense unit, whereby data write is performed.

Data write is performed with write-verify and write voltage application repeated. After write-verify, verify-check is performed for judging whether there is an insufficiently written cell or not.

As shown in FIG. 2, one NAND block in the cell array 1t and another NAND block in the cell array 1c are selected as reference cell blocks, respectively. These reference cell blocks are sequentially selected to be subjected to such a data write operation that the entire word lines (i.e., reference word lines) are sequentially selected in the block, and the entire reference cells are sequentially written into the level L2.

That is, when the write step "vpr" ends, the entire reference cells will be set to have the threshold level L2.

At the following write step "vp1", the information cells, T-cell and C-cell, are selectively written into the level L1 from level L0 in accordance with write data "0" and "1". With this write step "vp1", the data write sequence ends.

[Binary Data Storage Scheme (part 2)]

In the above-described binary data storage scheme (part 1), the threshold level of the reference cell R-cell is set to be higher than the upper threshold level of the information cells T-cell and C-cell. By contrast, it is permitted to select another suitable threshold level as that of the reference cell R-cell.

Figure 11:
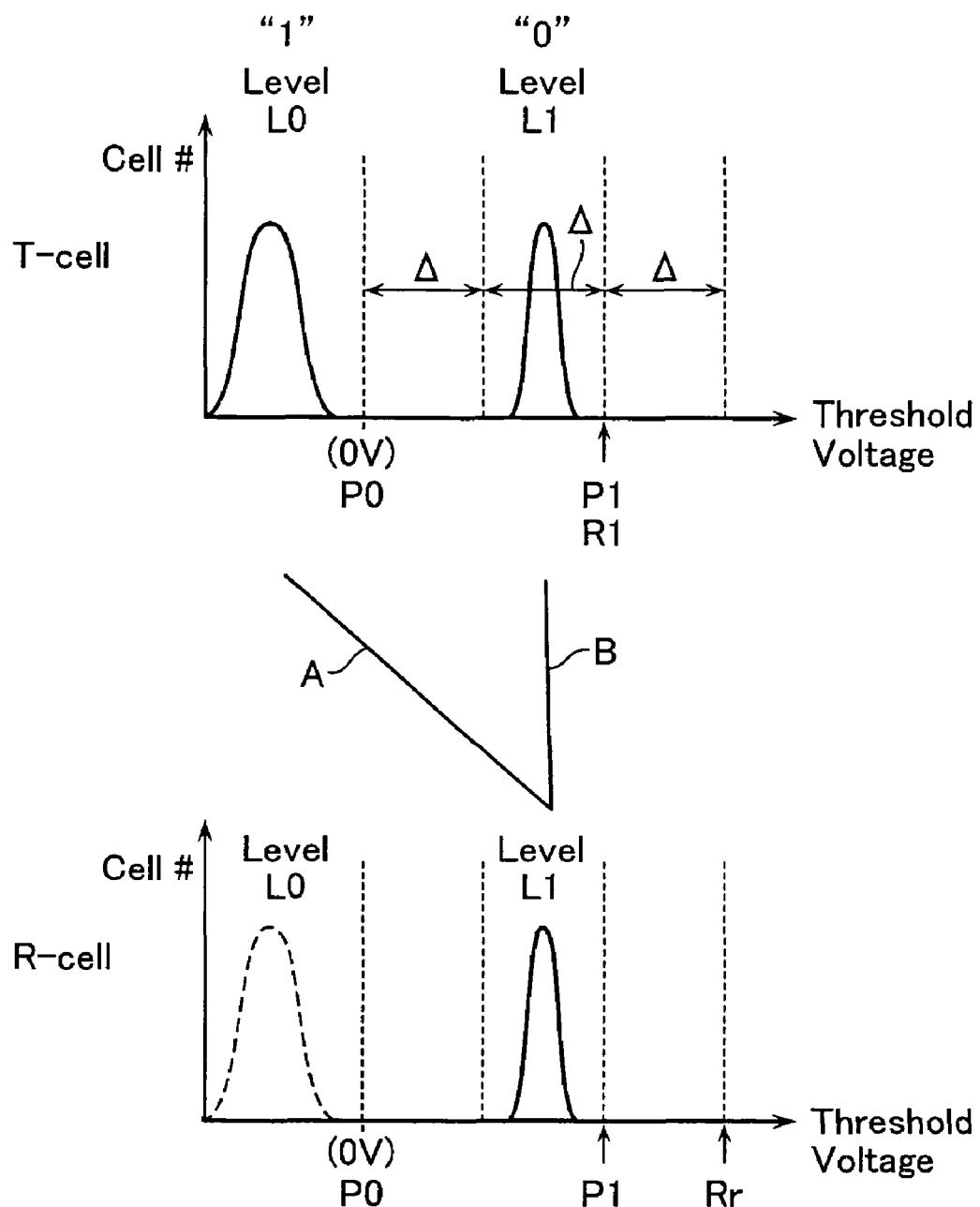
FIG. 11 shows level setting and a data bit assignment method with reference to T-cell and C-cell in a binary data storage scheme (part 2).
Figure 12:
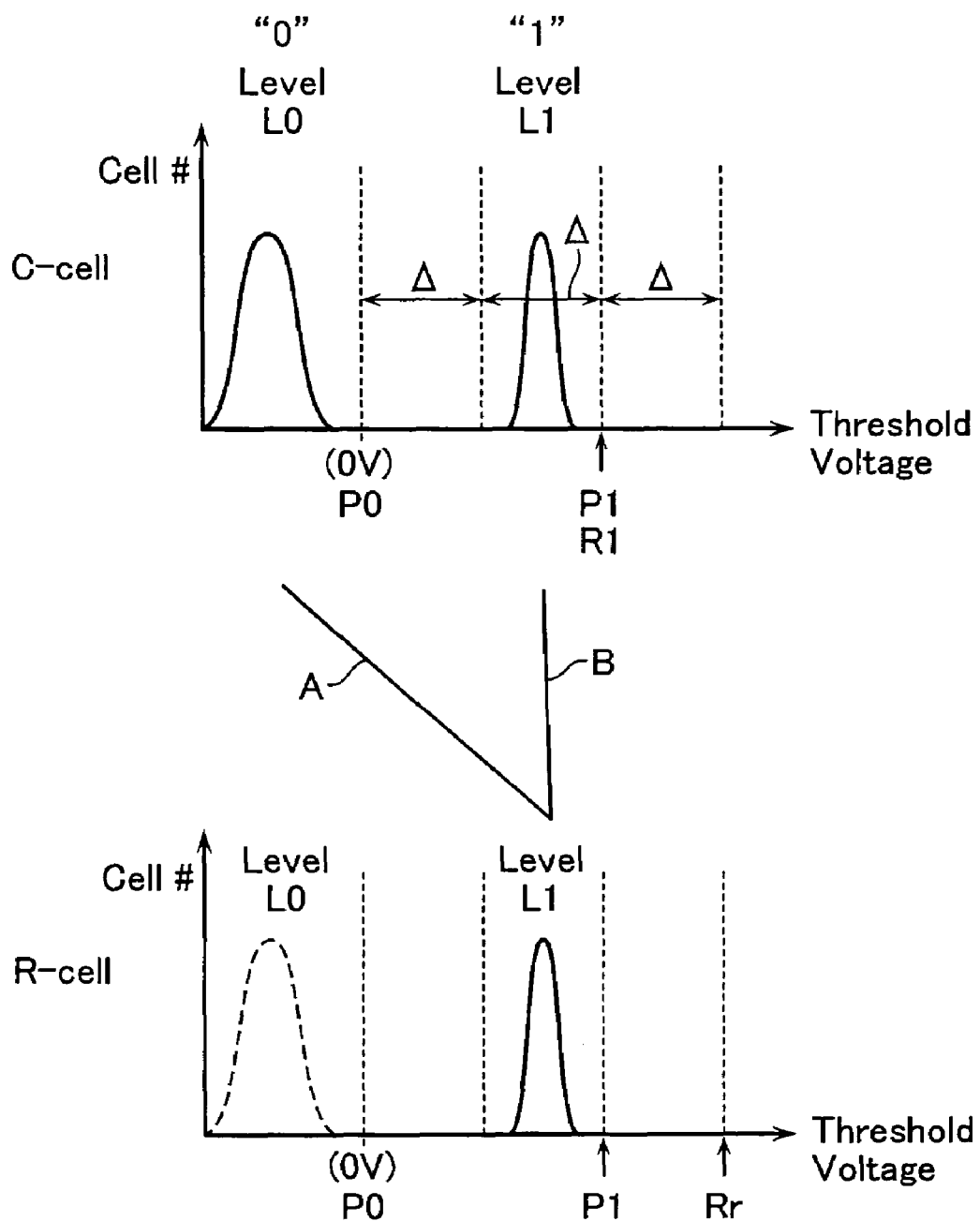
FIG. 12 shows level setting and the data bit assignment method with reference to T-cell and C-cell in the binary data storage scheme (part 2).

FIGS. 11 and 12 show another example in correspondence with FIGS. 7 and 8, in which the threshold level of the reference cell R-cell is set to be equal to the upper threshold level L1 of the information cells T-cell and C-cell. Otherwise, FIGS. 11 and 12 are the same as FIGS. 7 and 8.

At a read time, read voltage R1 applied to the information cell T-cell or C-cell is set to be equal to or higher than the upper threshold level L1 (for example, equal to the verify voltage P1) while read voltage Rr applied to the reference cell R-cell is set to be higher than the verify voltage P1, for example, by $\Delta$ (i.e., Rr=R1+$\Delta$=3$\Delta$).

With these read voltages, the following expressions (5) and (6) are satisfied, which are required for satisfying the cell current relationship for data read.

$$R1-L0 > Rr-L1 \quad (5)$$

$$Rr-L1 > R1-L1 \quad (6)$$

As a result of that the expressions (5) and (6) are satisfied, in case that the information cell T-cell and the reference cell R-cell are selected, cell current Icell(0) and Icell(1) of T-cell in levels L0 and L1, respectively, and cell current Icell(r) of R-cell are satisfied with the following expressions (7) and (8).

$$Icell(0) > Icell(r) \quad (7)$$

$$Icell(1) < Icell(r) \quad (8)$$

Detecting the cell current difference between the information cell T-cell and the reference cell R-cell based on the above-described expressions (7) and (8), data "0" and "1" of T-cell may be distinguished from each other. Further, detecting the cell current difference between another information cell C-cell and the reference cell R-cell, logically inverted data will be read out.

[4-value Data Storage Scheme (part 1)]

Figure 13:
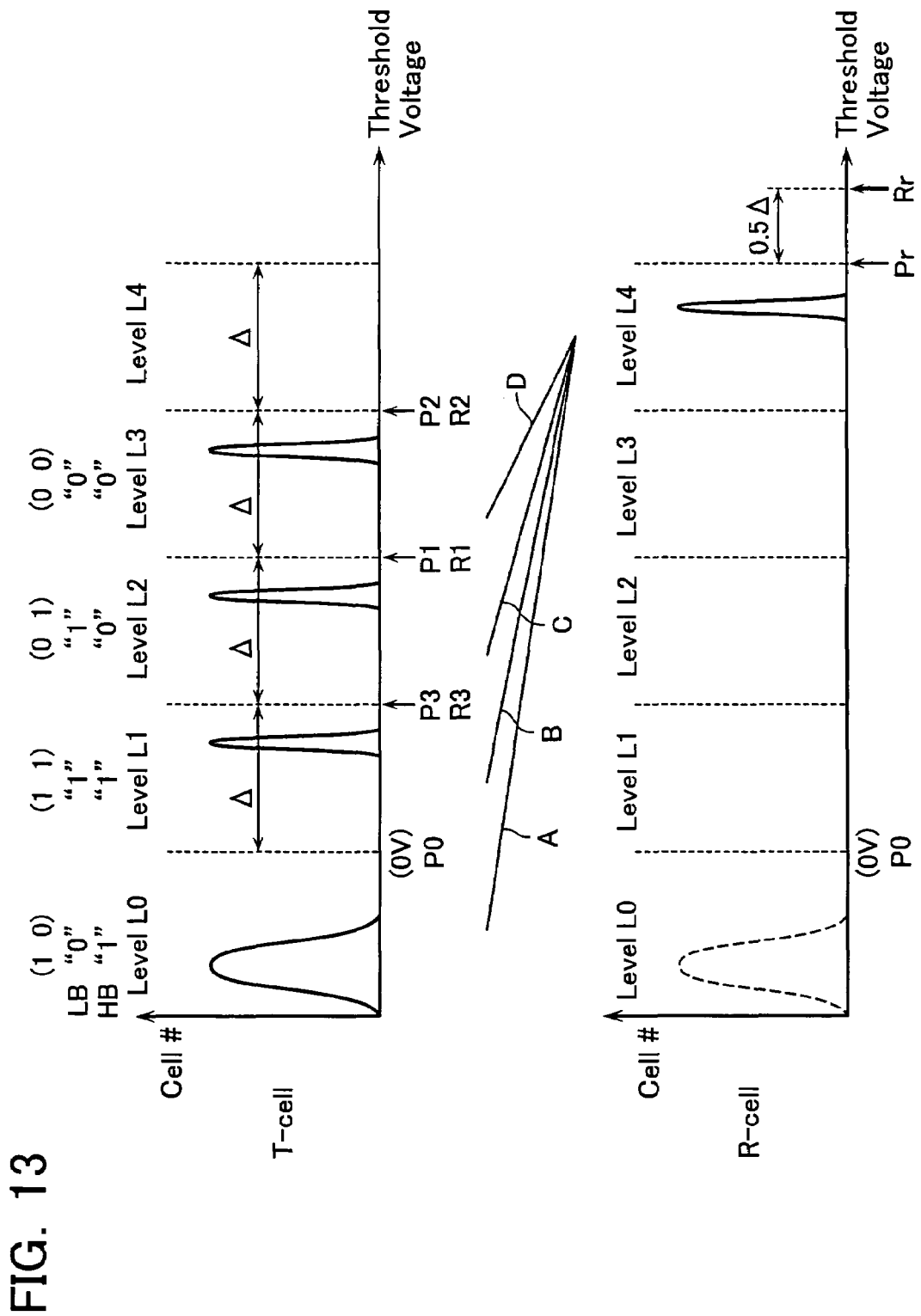
FIG. 13 shows level setting and a data bit assignment method with reference to T-cell and C-cell in a 4-value data storage scheme (part 1).
Figure 14:
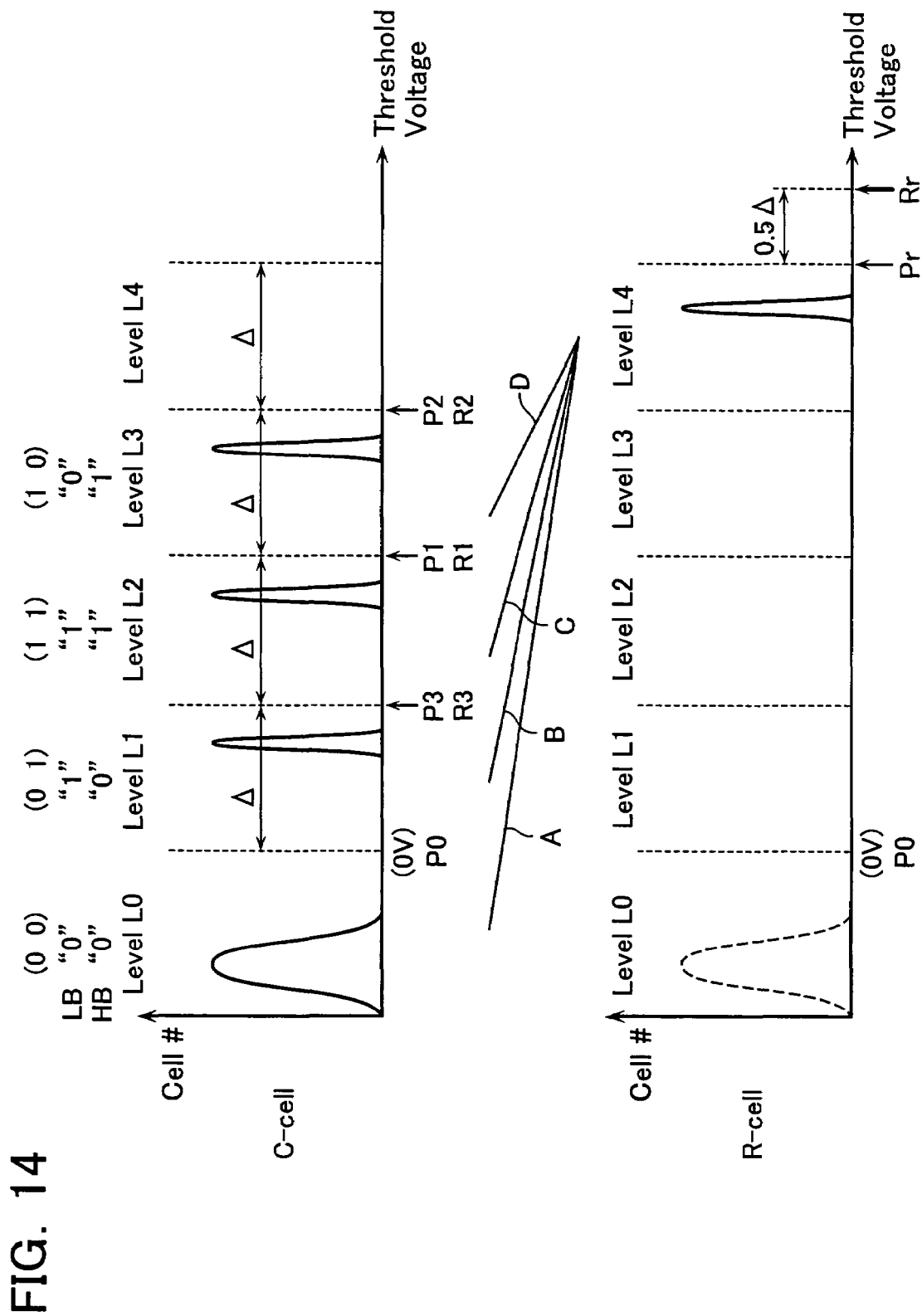
FIG. 14 shows level setting and the data bit assignment method with reference to T-cell and C-cell in the 4-value data storage scheme (part 1).

FIGS. 13 and 14 show data threshold level distributions and bit assignment of a 4-value data storage scheme with respect to information cells, T-cell and C-cell, and a reference cell R-cell. Each of the information cells T-cell and C-cell is set to have one of four threshold levels L0, L1, L2 and L3. L0 is an erased state defined by an erase-verify voltage P0(=0V) while L1, L2 and L3 are written states, the upper limits of which are defined by write-verify voltages P3(=P0+$\Delta$), P1(=P0+2$\Delta$) and P2(=P0+3$\Delta$), respectively. The threshold level L4 of the reference cell R-cell is set to be higher than the highest level L3 in the information cell, the upper limit of which is defined by write-verify voltage Pr(=P0+4$\Delta$).

4-value data is defined by combination states A, B, C and D between the levels L0, L1, L2 and L3 of T-cell and reference level L4 of R-cell. Supposing that 4-value data is expressed by (HB, LB) with a higher bit HB and a lower bit LB, data (1,0), (1,1), (0,1) and (0,0) are assigned to the levels L0, L1, L2 and L3, respectively, of T-cell. The combination states between C-cell and R-cell are defined by logic data reversed to those shown in FIG. 13. With these cell level states, it is possible to store 4-value data.

Figure 15:
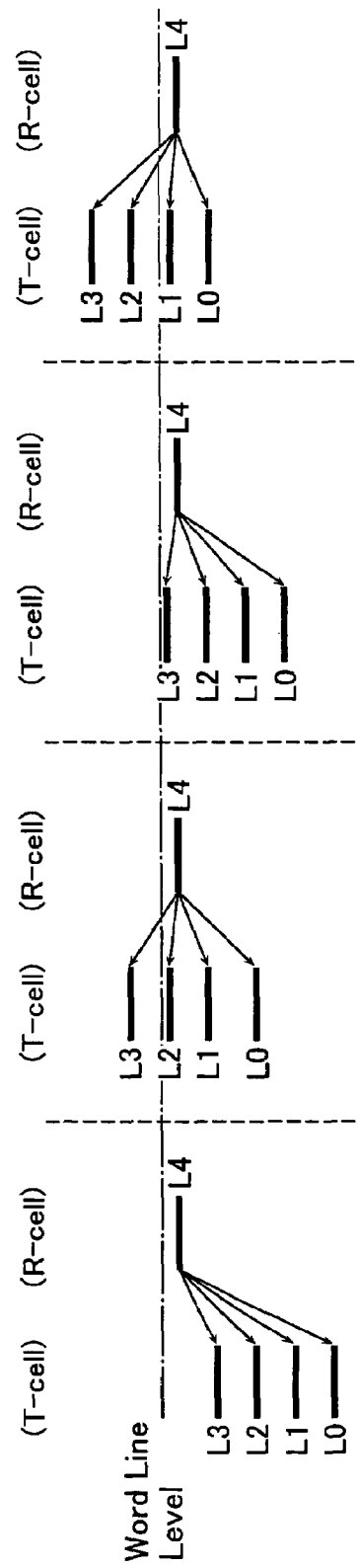
FIG. 15 shows a level relationship of the 4-value data storage scheme (part 1) viewed from a word line level base and a Vss base.
Figure 15:
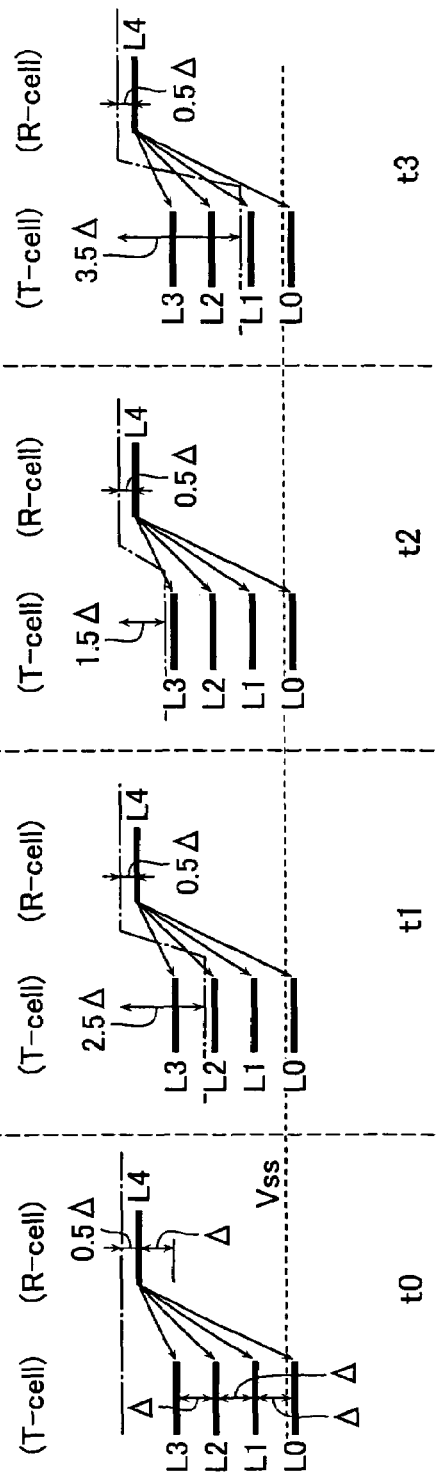

FIG. 15 shows level relationships for reading the 4-value data through read cycles (steps) t1-t3 from the initial state t0 with respect to T-cell and R-cell. The upper column in FIG. 15 shows that 4-value data may be sensed with relative biases applied to levels of T-cell and R-cell on the assumption that the read voltage (i.e., word line level) applied to a selected word line TWL and the reference word line RWL is kept constant through read cycles.

By contrast, the lower column in FIG. 15 shows that the 4-value data may be practically sensed with word line levels exchanged in accordance with read cycles.

In the initial state (data shrinking time) "t0", level L4 of the reference cell R-cell is near the word line level, and levels L0-L3 of T-cell are positioned as lower than it. Therefore, suppose that it is detected a difference between cell currents of T-cell and R-cell, it is impossible to distinguish between levels L0-L3 of T-cell.

At the read cycle "t1", the word line level of the information cell T-cell is set to be near the threshold level L2. For example, as shown in FIG. 13, read voltage R1 equal to the verify voltage P1 is applied to a selected word line TWL. The read voltage Rr applied to the reference cell R-cell is kept constant through the entire read cycles.

At this time, if the information cell T-cell is in the level L2 or L3, the cell current is smaller than that of the reference cell R-cell, so that it will be sensed as data "0". By contrast, if the information cell T-cell is in the level L0 or L1, the cell current is larger than that of the reference cell R-cell, so that it will be sensed as data "1". Therefore, at this read cycle, the upper bit HB may be read out.

At the read cycle "t2", the word line level of the information cell T-cell is set to be near the threshold level L3. For example, as shown in FIG. 13, read voltage R2 equal to the verify voltage P2 is applied to a selected word line TWL. If the information cell T-cell is in the level L3, the cell current is smaller than that of the reference cell R-cell, so that it will be sensed as data "0". By contrast, if the information cell T-cell is lower than L3, the cell current is larger than that of the reference cell R-cell, so that it will be sensed as data "1". Therefore, at this read cycle, the levels L2 and L3 of T-cell may be distinguished from each other. In other words, the lower bit LB when the higher bit HB is "0" may be read out.

At the read cycle "t3", the word line level of the information cell T-cell is set to be near the threshold level L1. For example, as shown in FIG. 13, read voltage R3 equal to the verify voltage P3 is applied to a selected word line TWL. If the information cell T-cell is in the level L1 or higher than it, the cell current is smaller than that of the reference cell R-cell, so that it will be sensed as data "0", while if the information cell T-cell is in the level L0, it will be sensed as data "1". Therefore, at this read cycle, the levels L0 and L1 of T-cell may be distinguished from each other. In other words, the lower bit LB when the higher bit HB is "1" may be read out.

Figure 16:
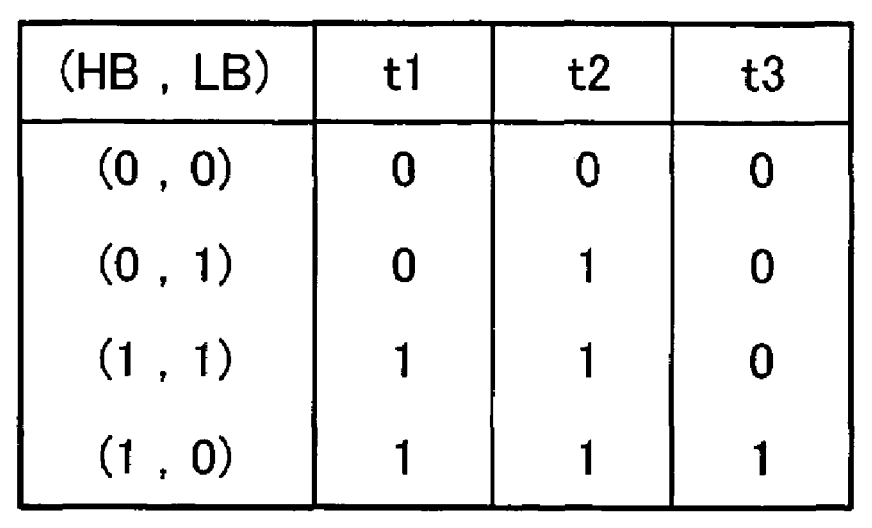

FIG. 16 shows that 4-value data (1,1), (1,0), (0,1) and (0,0) defined in FIGS. 13 and 14 may be read based on the data transition through the above-described three read cycles t1, t2 and t3.

Figure 17:
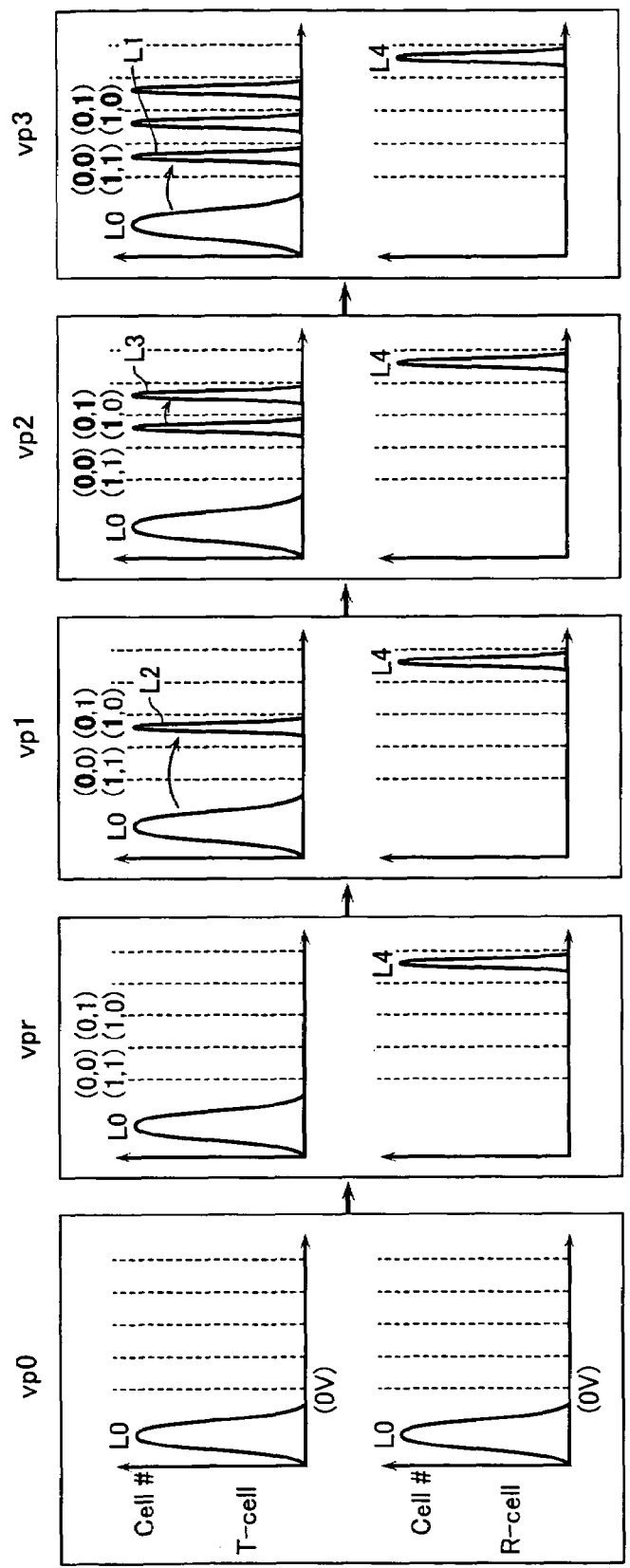
FIG. 17 shows a write sequence in the 4-value data storage scheme (part 1).

FIG. 17 shows an erase/write sequence in the above-described 4-value data storage scheme (part 1) by giving attention to the information cell T-cell and the reference cell R-cell. With respect to the information cell C-cell, the same sequence will be used as shown in FIG. 17.

"vp0" is an erase-verify step of the entire cells in a block as similar to that in the binary data storage scheme. At this step, the entire cells are set to be in the lowest threshold level L0, where the cell current is certainly detected as data "1".

"vpr", "vp1", "vp2" and "vp3" are verify-write steps for sequentially writing the reference cell R-cell and the information cell T-cell (or C-cell) with the erased threshold distribution. At these steps, write data "0" or "1" is transformed to a cell level, and then applied to a selected cell.

At the reference cell write step "vpr", write data "0" or "1" is applied, so that the threshold level of the reference cell R-cell is increased to L4. As similar to the binary data storage scheme, one reference cell block is selected from one of the cell array 1t and 1c; the entire word lines (reference word lines) RWL are sequentially selected; and the entire reference cells are sequentially written into level L4. Following it another reference cell block is selected from another cell array, the same write operation is performed for the entire reference cells as described above.

At the following write step "vp1", in accordance with the upper bits (HB) "1" and "0", the information cells T-cell and C-cell with the eased level L0 are selectively increased in threshold level to L2.

At the next write step "vp2", the information cells T-cell and C-cell with the upper bit (HB) data "0" written are selectively written into the threshold level L3, and then at the next write step "vp3", the information cells T-cell and C-cell with the upper bit (HB) data "1" written are selectively written into the threshold level L1.

Note here that it is permitted to insert a read mode between the write steps vpr, vp1, vp2 and vp3. In this case, to restart the suspended write modes, it is often required to read out written data from the cell array or load write data again from the external.

[4-value Data Storage Scheme (part 2)]

In the above-described 4-value data storage scheme (part 1), the threshold level (i.e., reference level) of the reference cell R-cell is set to be L4 higher than the uppermost level L3 in four levels set in the information cells T-cell and C-cell. By contrast, the reference level of the reference cell may be set at another suitable value.

Figure 18:
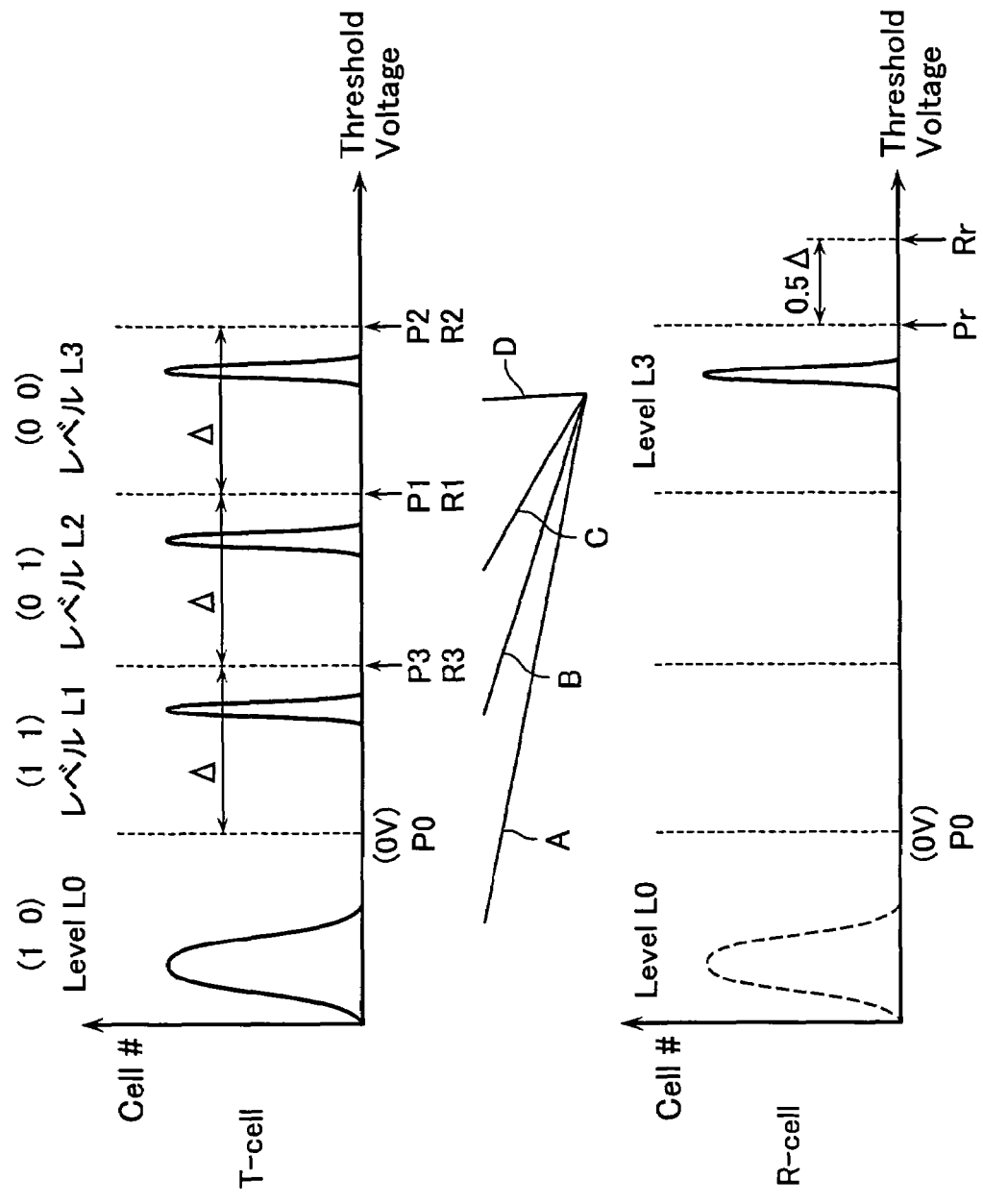
FIG. 18 shows level setting and a data bit assignment method with reference to T-cell and C-cell in another 4-value data storage scheme (part 2).
Figure 19:
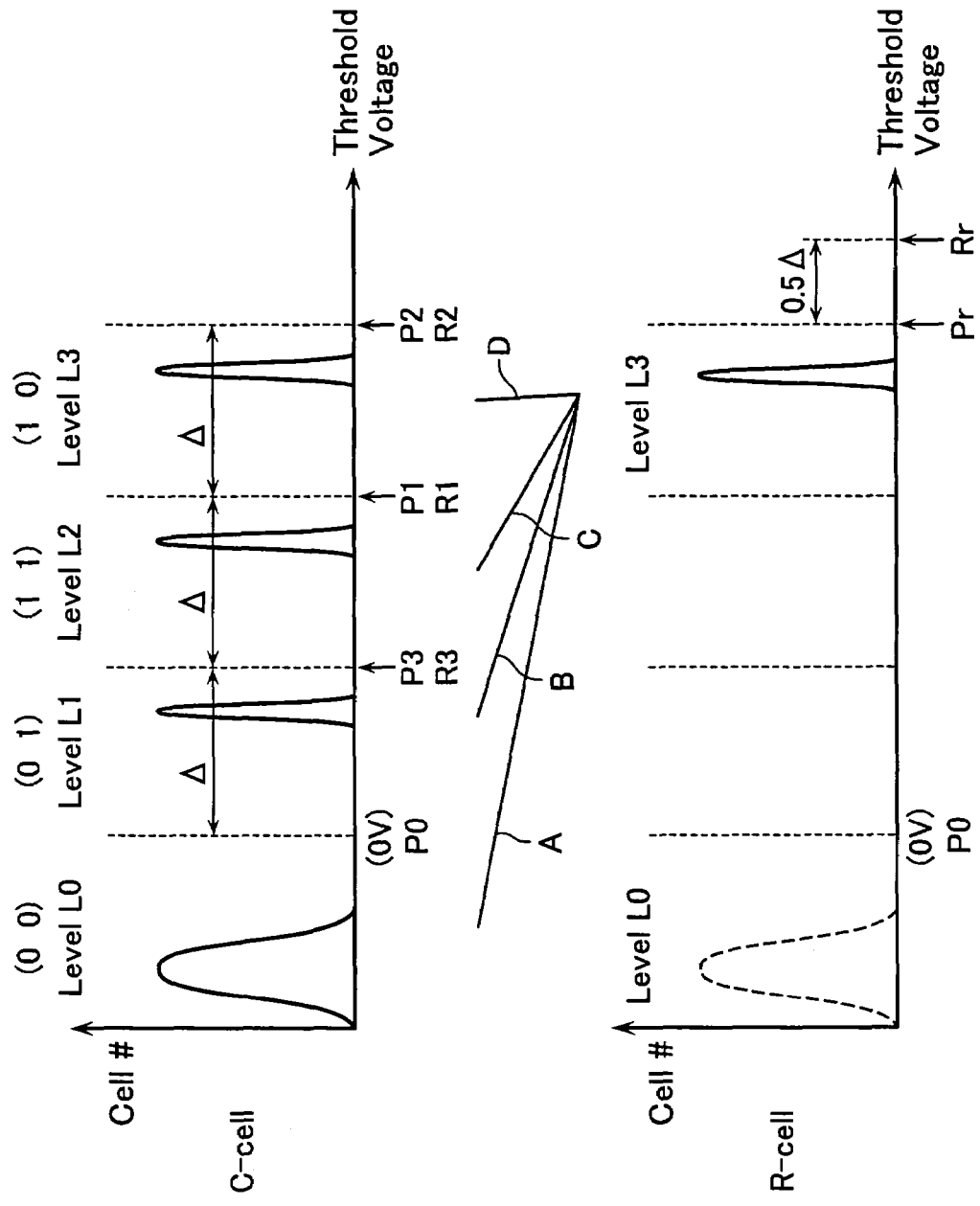
FIG. 19 shows level setting and the data bit assignment method with reference to T-cell and C-cell in the 4-value data storage scheme (part 2).

FIGS. 18 and 19 show another example, in which the threshold level of the reference cell R-cell is set to be equal to the highest level L3 in the information cells T-cell and C-cell, in correspondence with that shown in FIGS. 13 and 14. Except the reference cell level, FIG. 18 and 19 are the same as FIGS. 13 and 14.

At data read times, read voltages R1, R2 and R3 to be applied to the information cells T-cell and C-cell are set to be near the data levels L2, L3 and L1, respectively (for example, equal to write verify voltages P1, P2 and P3, respectively), while read voltage Rr applied to the reference cell R-cell is set to be higher than the verify voltage P3 (=Pr) of the level L3 by $0.5\Delta$ (i.e., $Rr=Pr+0.5\Delta$).

With these read voltages, as similar to the case shown in FIGS. 13 and 14, it may be satisfied with cell current relationships necessary for detecting bit data at the read cycles t1-t3, whereby 4-value data may be read out.

So far, the principles of binary data and 4-value data storage schemes have been explained. Although there is not shown in the drawings, it will be easily understood that the above-described principle may be expanded to 8-value or 16-value data storage scheme. In general, supposing that $M(\geq 2)$-value data is defined by $n(\geq 1)$ bit(s), it is required of the sense unit to have "n" data latches for storing M-value data.

[Detailed Description of the Binary Data Storage Scheme (part 1)]

(Sense Unit Configuration)

Figures 20, 21:
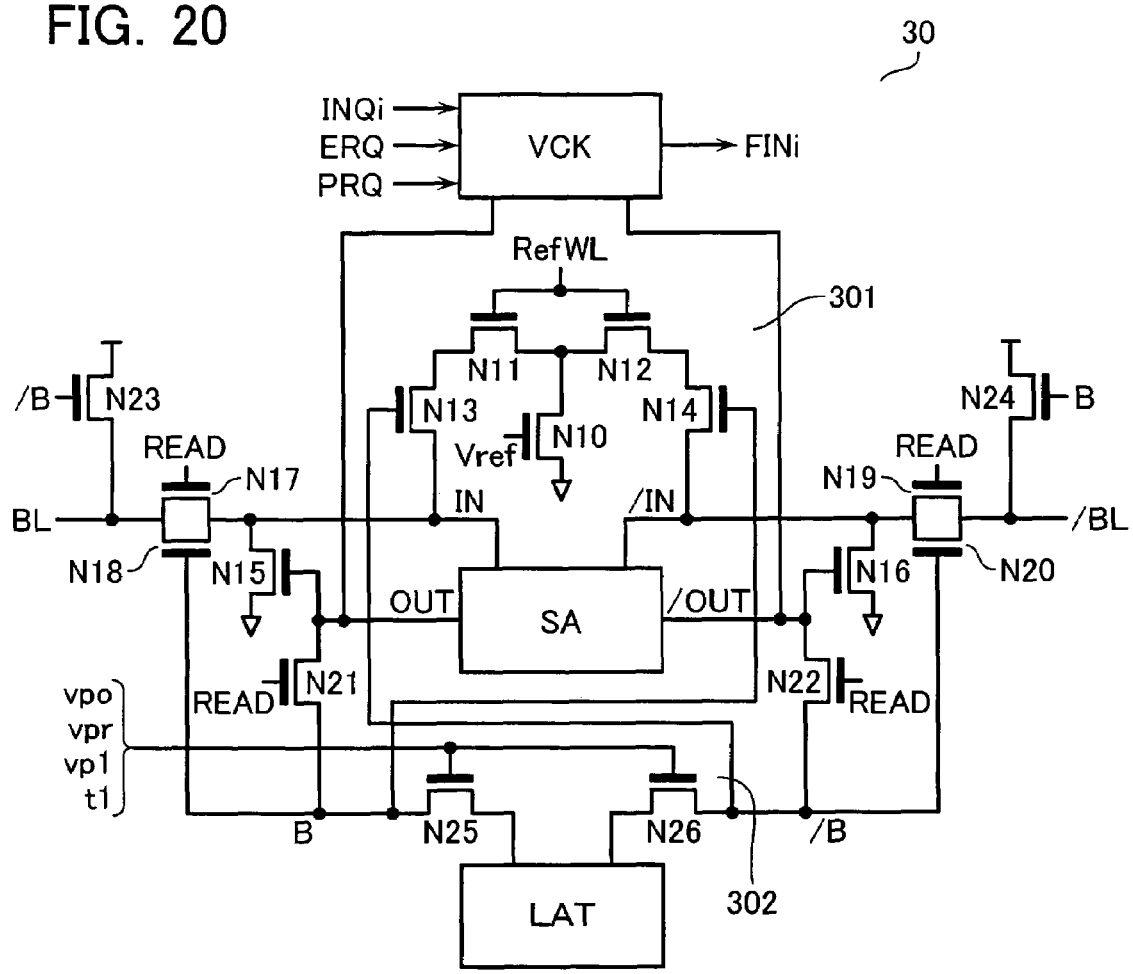
FIG. 20 shows a sense unit configuration used in the binary data storage scheme.
FIG. 21 shows data latch data in the sense unit at an erase time and a reference cell write time.

FIG. 20 shows a configuration of the sense unit 30 coupled to a pair of bit lines BL and /BL, which is used in this scheme. As explained with reference to FIG. 5, the sense unit 30 is shared in practice by plural bit line pairs.

The sense unit 30 includes a sense/latch system with a differential sense amplifier SA of current detecting type and a data latch LAT and a verify-check circuit VCK (i.e., verify/result judge system). Two input nodes IN and /IN of the differential sense amplifier SA are coupled to bit lines BL and /BL via NMOS transistors N17 and N19, which turn on with a read control signal READ. A reference current source circuit 301 is disposed for supplying a reference current to either of input nodes IN and /IN at a write-verify or erase-verify time.

Data latch LAT is prepared for storing write data at a write time and for holding read data of the sense amplifier SA. Held in the data latch LAT at an erase time or a reference cell write time is data used for sequentially selecting T-cell array 1*t* and C-cell array 1*c*.

Data latch LAT has data transferring nodes B and /B for transferring data between the sense amplifier SA and itself. Nodes B and /B are coupled to output nodes OUT and /OUT of the sense amplifier SA via NMOS transistors N21 and N22, which are driven by the read control signal READ.

Disposed between the nodes B and /B and data latch LAT is a data transfer circuit 302 with NMOS transistors N25 and N26. The data transfer circuit 302 turns on with timing signals at the read step t1, erase step vp0 and write steps vpr and vp1.

The reference current source 301 has an NMOS transistor N10, the gate of which is applied with a reference voltage Vref. This NMOS transistor N10 is a reference transistor, which serves for outputting a reference current used for comparing a cell current to be sensed with itself at a write-verify time and an erase-verify time. For this purpose, NMOS transistor N10 is selectively coupled to one of the input nodes IN and /IN of the sense amplifier SA. In detail, the NMOS transistor N10 is coupled to the input nodes IN and /IN via NMOS transistors N11 and N12, which are driven by a reference word line RefWL and via NMOS transistors N13 and N14, which are driven by data transferring nodes /B and B, respectively.

NMOS transistors N18 and N20 are connected in parallel with NMOS transistors N17 and N19, respectively, which are complementarily driven by the nodes B and /B. That is, at a read time, NMOS transistors N17 and N19 turn on, so that bit lines BL and /BL are coupled to the input nodes IN and /IN, respectively. At this time, the reference current source 301 is not coupled to the sense amplifier SA.

At a write time or an erase time, while NMOS transistors N17 and N19 are kept off, one of NMOS transistors N18 and N20 turns on in accordance with data held in data latch LAT and one of NMOS transistors N13 and N14 turns on in the reference current source 301. As a result, one of bit lines BL and /BL is coupled to one input node of the sense amplifier SA while NMOS transistor (i.e., reference transistor) N10 is coupled to another input node thereof as a reference current source.

NMOS transistors N15 and N16 are connected to the input nodes IN and /IN for feeding back the sensed result to the input nodes IN and /IN, thereby forcedly resetting one of them to Vss. Further connected to bit lines BL and /BL, pull-up NMOS transistors N23 and N24, which selectively turn on in accordance with data at the nodes /B and B, respectively.

It is material to this embodiment that sense amplifier SA is a current detecting type of differential amplifier, and a current difference of a pair cell is detected at a normal data read time. This makes the flash memory have a high speed read performance. In the conventional NAND-type flash memory, the sense amplifier precharges a bit line, and then the bit line is discharged in accordance with data of a selected cell. In case that the selected cell is off (for example, data "0"), the bit line is not discharged while in case that the selected cell is on (for example, data "1"), the bit line will be discharged. Therefore, detect the bit line potential after having discharged the bit line for a certain period, and it is able to judge data.

However in the conventional sense amplifier scheme, as the cell current becomes smaller, and as the bit line capacitor becomes larger, it is required to take a long bit line discharge time for data detecting, and this makes impossible to do high speed data read. Especially in case of a multi-value data storage scheme, it is in need of performing plural sense operations. Therefore, it becomes material how to achieve a high speed read performance.

The sense amplifier SA in accordance with this embodiment detects the cell current difference between the information cell T-cell or C-cell and the reference cell R-cell, which constitute a pair, via a pair of bit lines. As explained in detail later, the reference current source circuit is used for verify-reading in a write mode and an erase mode in such a way that the cell current difference is detected between one of bit line pair, which is connected to a cell to be verified, and a reference transistor. In this case, it is in need of taking a certain bit line precharge time for detecting the cell current difference because the load capacitances connected to the input nodes of the differential amplifier are largely different from each other.

However, in a normal read mode, the cell current difference between the information cell and the reference cell is detected without the reference current source circuit. Therefore, the input nodes of the differential amplifier are balanced in capacitance, so that the cell current level relationship will be determined just after data read starting (i.e., cell drive starting). As a result, being activated at an early timing after data read starting, the sense amplifier will not erroneously sense. In other words, it is possible to sense data within a very short time, and this becomes material to achieve a high speed read performance especially in a multi-value data storage scheme.

Further, the current detecting type of differential amplifier may detect certainly a small cell current difference. This means that even if the threshold level difference is set to be small in case of a multi-value data storage scheme, data may be sensed certainly. Therefore, the data sensing scheme in accordance with this embodiment makes possible to secure a sufficient data margin in such a case that many levels are set in multi-value data.

Figure 22:
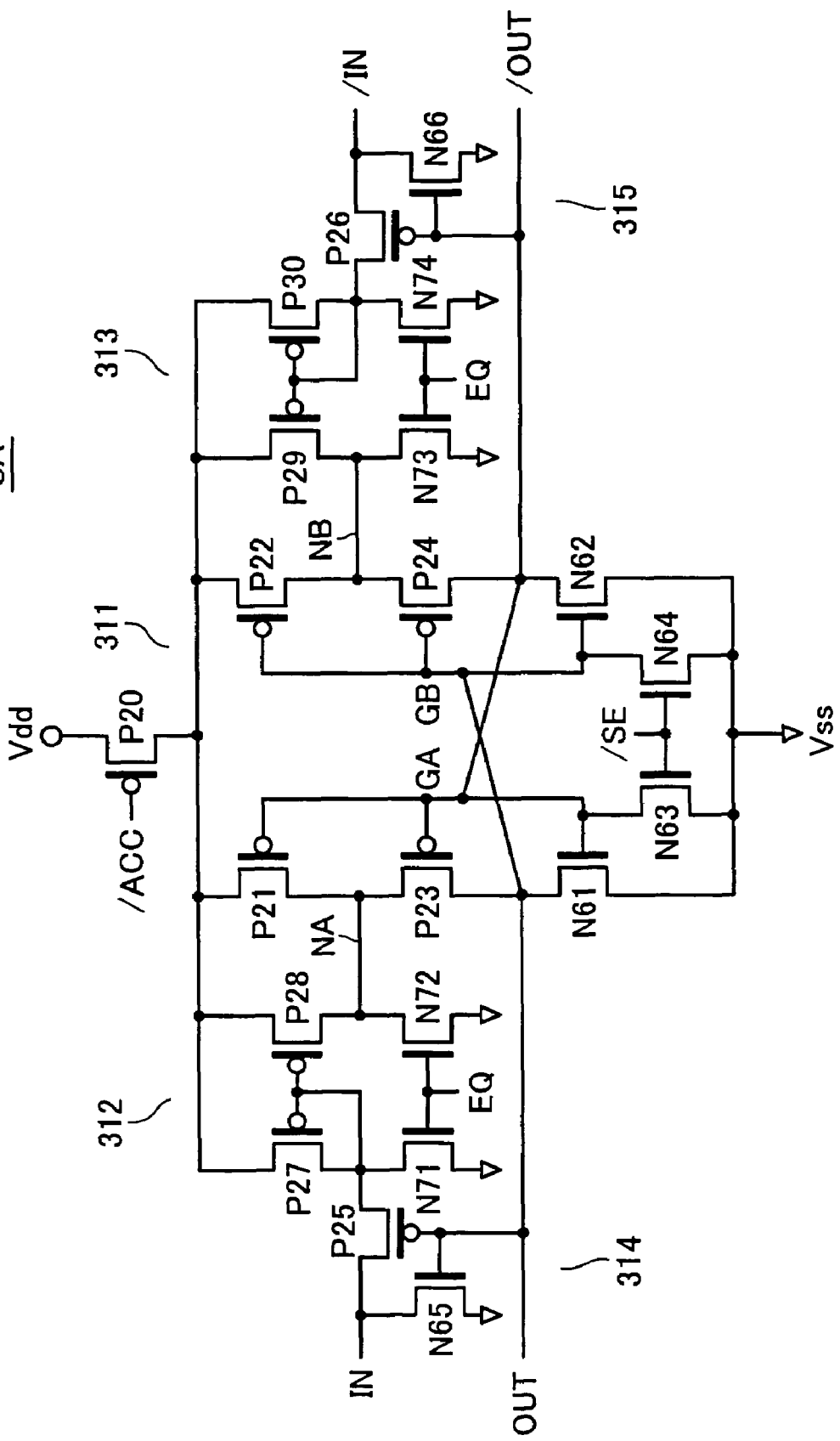
FIG. 22 shows a sense amplifier used in the sense unit.

FIG. 22 shows a detailed example of the above-described sense amplifier SA. This sense amplifier SA is formed of a kind of flip-flop, but it is not a usual flip-flop.

A common drain of PMOS transistor P23 and NMOS transistor N61, which are connected in series with a common gate GA, is coupled to one output node OUT. Similarly, another common drain of PMOS transistor P24 and NMOS transistor N62, which are connected in series with another common gate GB, is coupled to the other output node /OUT. These common gates GA and GB are cross-coupled to the output nodes /OUT and OUT, respectively.

PMOS transistors P23 and P24 are coupled to the power supply node Vdd via PMOS transistors P21 and P22, respectively, and via PMOS transistor P20 serving as a power switch device. The gates of PMOS transistors P21 and P22 are coupled to the common gate nodes GA and GB, respectively.

Sources of NMOS transistors N61 and N62 are coupled to the ground potential node Vss. Common gate nodes GA and GB are coupled to the ground potential via activating NMOS transistors N63 and N64, respectively.

Connection node NA of the serially connected PMOS transistors P21 and P23 and that NB of serially connected PMOS transistors P22 and P24 serve as cell current input nodes. In detail, a current mirror circuit 312 with PMOS transistors P27 and P28 is disposed between the node NA and the input node IN connected to the bit line TBL; and another current mirror circuit 313 with PMOS transistors P29 and P30 is disposed between the node NB and the input node /IN connected to the bit line CBL. With these current mirror circuits 312 and 313, replicated currents corresponding to cell currents are supplied to the nodes NA and NB.

Disposed between drains of PMOS transistors P27, P28, P29 and P30 and the ground potential node Vss are NMOS transistors N71, N72, N73 and N74, respectively, which are driven by an initializing signal EQ. That is, prior to sense-starting, nodes NA and NB are initialized at Vss with EQ="H".

Disposed at the input nodes IN and /IN are feed-back circuits 314 and 315, respectively, which serve for feeding-back the sensed result to the nodes IN and /IN and controlling levels thereof. That is, PMOS transistor P25 is disposed between the input node IN and the current mirror circuit 312; and PMOS transistor P26 between the input node /IN and the current mirror circuit 313. Further disposed between the ground potential node Vss and the input nodes IN and /IN are NMOS transistors N65 and N66, the gates of which are driven by the output nodes OUT and /OUT, respectively.

The operation of this sense amplifier SA will be explained below. In a normal data read mode, the reference current source 301 shown in FIG. 20 is not used. In a non-activated state with /ACC="H" and /SE="H", NMOS transistors N63 and N64 are on, so that the output nodes OUT, /OUT and the common gate nodes GA and GB are kept at Vss.

When a word line TWL (or CWL) and a reference word line RWL, which constitute a pair, is selected in the two cell arrays; and bit lines BL and /BL are coupled to the input nodes IN and /IN, /ACC becomes "L", and then /SE becomes "L" a little late, so that the sense amplifier SA will be activated. In this state, cell currents of selected two cells T-cell (or C-cell) and R-cell are supplied to the nodes NA and NB, respectively.

Just after the sense amplifier activation, NMOS transistors N61 and N62 are kept off, and power supply current and cell current superimposed thereon flow through the output nodes OUT(=GB), /OUT(=GA) and through NMOS transistors N64, N63 toward Vss. Make /SE "L" at a time when a potential difference is generated between the output nodes OUT and /OUT (i.e., between gate nodes GA and GB) based on the cell current difference, and a positive feed-back operation is performed for amplifying the cell current difference in the flip-flop 311 so that the differential voltage between the output nodes OUT and /OUT are rapidly increased.

Supposing that, for example, OUT(=GB) is lower than /OUT(=GA), NMOS transistors 61 turns on while NMOS transistor 62 off; and PMOS transistors P22 and P24 turn on while PMOS transistors P21 and P23 off. As a result, the output nodes OUT and /OUT become Vss and Vdd, respectively.

With the above-described current detecting scheme, it is possible to sense the cell current difference between the information cell and the reference cell in a short time. In response to that one of the output nodes OUT and /OUT becomes Vss while the other becomes Vdd, one of NMOS transistors N65 and N66 turns on, and such a feed-back control is performed that one of the input nodes IN and /IN is reset to be Vss. This is because that it is in need of controlling the bit lines in accordance with a verify-read result in a write-verify mode.

As described above, the sense amplifier SA detects the cell current difference in a short time based on the positive feed-back operation via NMOS transistors N63 and N64. Therefore, it becomes possible to achieve a high speed read performance. Further, the power consumption of the sense amplifier is a little because there is no through-current carried through the flip-flop 311.

Figure 23:
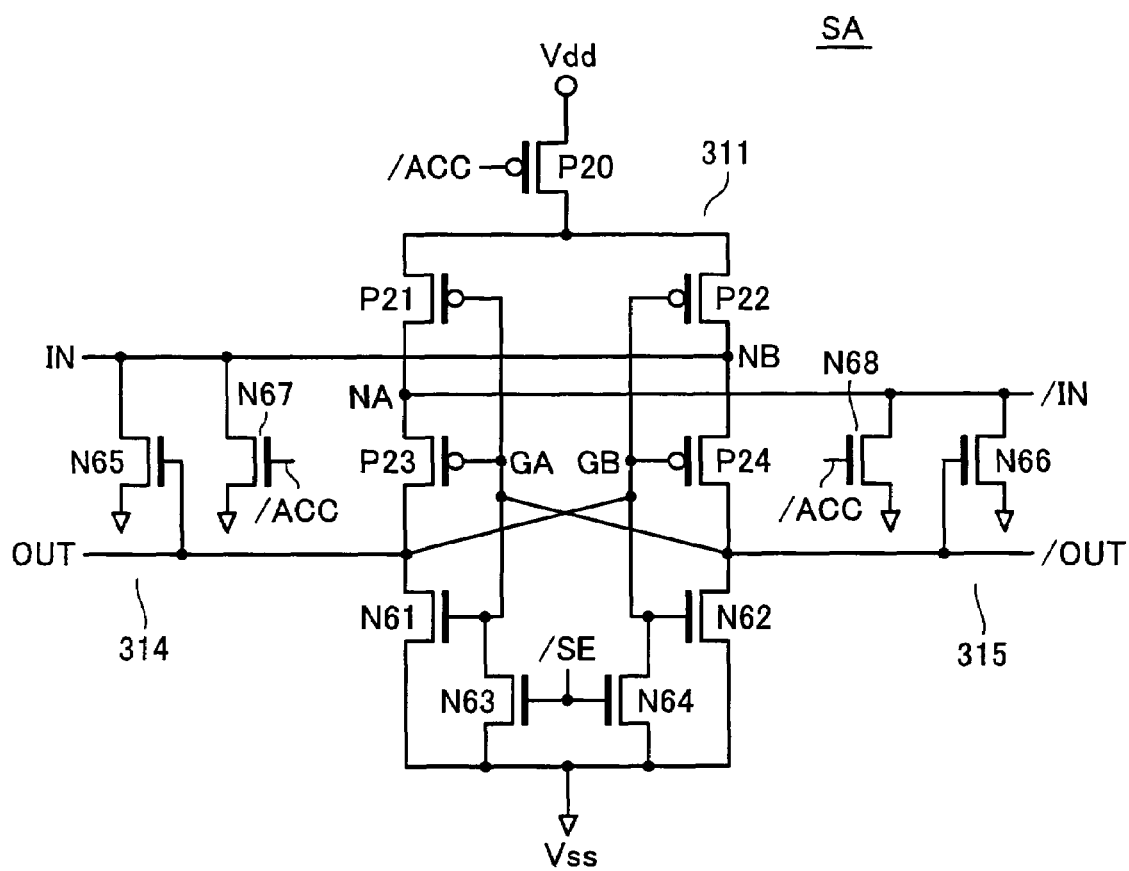
FIG. 23 shows another sense amplifier configuration.

FIG. 23 shows a more simplified sense amplifier SA, which basically includes the same flip-flop 311 as shown in FIG. 22. In this case, the current-mirror circuits 312 and 313 used in FIG. 22 are omitted. In case the replicated currents are supplied to the nodes NA and NB with the current mirror circuits 312 and 313, the cell currents are added to the power supply current. By contrast, in case the cell currents are directly supplied to the nodes NA and NB, these will be subtracted from the power supply current. Therefore, by contrast to that shown in FIG. 22, the input nodes IN and /IN are coupled to the nodes NB and NA, respectively.

Reset-use NMOS transistors N67 and N68, which turn on or off as complementary to the power switch PMOS transistor P20, are coupled to the nodes NA and NB, respectively. With these NMOS transistors, nodes NA and NB are reset to be Vss before sensing. The feed-back circuits 314 and 315 are formed of only NMOS transistors N65 and N66, respectively, which make one of the input nodes IN and /IN be Vss (="L") when "H" and "L" of the output nodes OUT, /OUT are decided.

Figure 24:
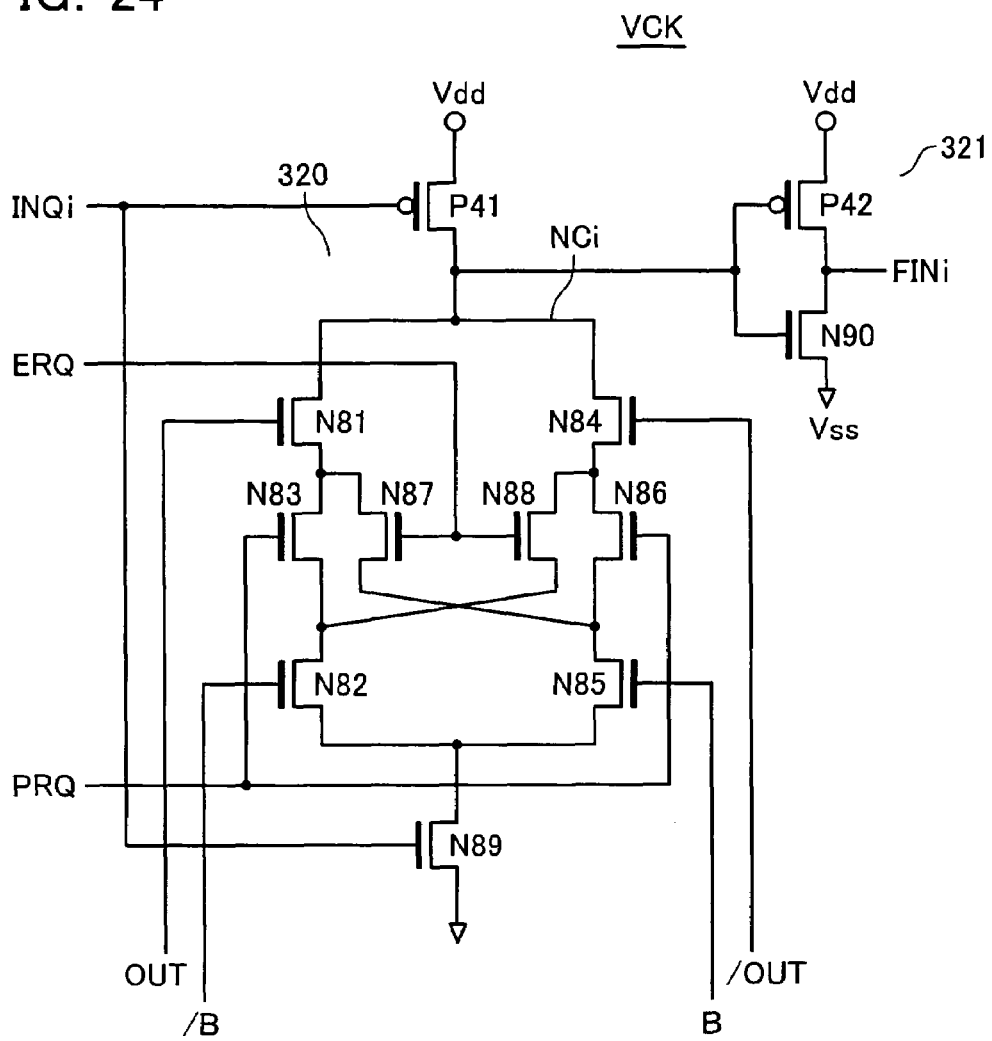
FIG. 24 shows a verify-check circuit used in the sense unit.

FIG. 24 shows a detailed configuration of the verify-check circuit VCK shown in FIG. 20. This verify-check circuit VCK includes a data comparing circuit 320, which detects whether the verify-read data at the output nodes OUT, /OUT of the sense amplifier SA is identical with the expectance data at the nodes B, /B read from the data latch HBL or LBL or not at a write-verify time or an erase-verify time.

Note here that the expected cell state at the erase-verify time is different from that at the write-verify time. That is, erase-verify is performed for verifying that a cell's threshold level is sufficiently lowered while write-verify is for verifying that a cell's threshold level is increased to a certain level. In detail, the erase-verify is to be finished at a time when it is detected that data are reversed in logic between nodes B and /OUT, or between nodes /B and OUT while the write-verify is to be finished at when it is detected that data at nodes B and /OUT, or at nodes /B and OUT, are the same.

To satisfy the above-described requirement, there is prepared four current passages between PMOS transistor P41 and NMOS transistor N89, which are driven by a check input signal INQi to be turned on or off complementarily to each other.

A first current passage is formed of NMOS transistors N81 and N82, the gates of which are coupled to the nodes OUT and /B, respectively, and NMOS transistor N83 disposed therebetween and driven by a check signal PRQ at the write-verify time; and a second current passage is formed of NMOS transistors N84 and N85, the gates of which are coupled to the nodes /OUT and B, respectively, and NMOS transistor N86 disposed therebetween and driven by the check signal PRQ at the write-verify time. These two current passages constitute a data comparing circuit used at the write-verify time.

A third current passage is formed of NMOS transistors N81 and N85, the gates of which are coupled to the nodes OUT and B, respectively, and NMOS transistor N87 disposed therebetween and driven by a check signal ERQ at the erase-verify time; and a fourth current passage is formed of NMOS transistors N84 and N82, the gates of which are coupled to the nodes /OUT and /B, respectively, and NMOS transistor N88 disposed therebetween and driven by the check signal ERQ at the erase-verify time. These two current passages constitute another data comparing circuit used at the erase-verify time.

Drain node NCi of PMOS transistor P41, the source of which is coupled to Vdd, is charged-up to a "H" level during INQi="L". When INQi="H" is input, and verify-read data becomes expectance data, the node NCi will be discharged to be an "L" level. In response to the "L" level transition of the node NCi, inverter 321 outputs FINi="H".

Figure 25:
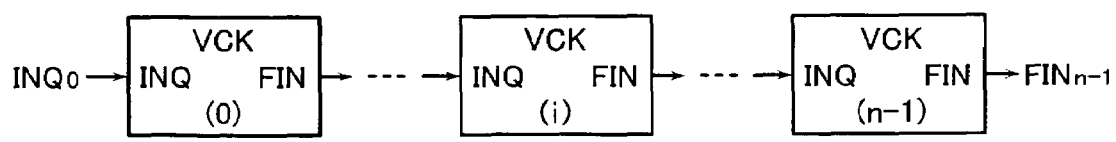
FIG. 25 shows a verify-judgment circuit configuration.

In practice, as shown in FIG. 25, verify-check circuits VCKi used in the entire sense units, into which one page data are read out simultaneously, are connected like a domino effect in such a manner that the check output FINi serves as the following check input INQi+1. At the verify-judge time, check input INQ0 is input to a first stage verify-check circuit VCK0. In case there is at least one insufficiently erased cell or insufficiently written cell in one page, the final check output FINn×1 is kept "L". By contrast, in case the entire cells in one page are sufficiently erased or written, FINn−1="H" will be generated. This becomes a pass flag for designating write completion or erase completion.

Next, with reference to the sense unit, data read, verify-erase and verify-write will be explained in detail below.

(Read)

As explained above, data read is performed at one read step t1. An information cell T-cell and a reference cell R-cell are selected to be applied with read voltages Rl and Rr via a selected word line TWL on the bit line BL side and a selected reference word line RWL on the bit line /BL side, respectively. If the T-cell data is "0", the level step down of the bit line BL is less than that of the bit line /BL, so that OUT="L", and /OUT="H" will be obtained.

As similar to this, in case of that an information cell C-cell and a reference cell R-cell are selected with a selected word line CWL on the bit line /BL side and a selected reference word line RWL on the bit line BL side, these are applied with the read voltages R1 and Rr, respectively. In this case, C-cell data will be read as a logic data reversed to the above-described T-cell data.

It is able to perform high-speed data read with the read scheme in accordance with this embodiment because it is for detecting a cell current difference of a pair cell. For example, in the verify-read explained later, a cell current is compared with that of the reference transistor N10 attached to the sense amplifier. In this case, since only one in the bit line pair is coupled to one of the differential input nodes of the sense amplifier, the capacitance unbalance between the differential input nodes of the sense amplifier is so large that it is in need of comparing DC currents after a certain bit line charging time.

By contrast, in the normal data read operation, the cell current difference is detected between the pair of bit lines, to which two cells are coupled. Therefore, the input nodes of the differential amplifier are balanced in capacitance, so that it is possible to sense data within a very short time without waiting the bit line charging time, and achieve a high speed read performance.

(Verify-Erase)

Data erase is performed by repeat of an erase voltage applying operation for the entire cells in an erase unit and an operation for verifying the erase state. At a data erase time, a NAND block serves as the minimum erase unit, or a bank shown in FIG. 4 serves as an erase unit if necessary.

The data erase is defined as an operation for setting cells to be in the threshold level L0. For the purpose, Vss is applied to the entire word lines in a selected block; and a large erase voltage Vera to the cell well, on which the cell array is formed. With this voltage application, electrons in the floating gates of all cells will be discharged.

Erase-verify is performed for each block as such a read operation that the read voltage (i.e., verify voltage) P0 shown in FIGS. 7 and 8 is applied to the entire word lines in the selected block. It is required of the erase-verify to compare a cell current with the reference current of the reference current source 301 disposed in the sense unit 30. Therefore, it is in need of verify-reading the T-cell array and C-cell array at different timings from each other.

In detail, a first erase-verify is performed with data "1" held in the data latch LAT; and a second erase-verify with data "0" held in the data latch LAT. For example, as shown in FIG. 21, the erase step vp0 shown in FIG. 10 is divided into two verify-erase steps of vp0(1) and vp0(2).

At the step vp0(1), T-cell array is subjected to the verify-erase based on "1" data held in the data latch LAT. At the step vp0(2), C-cell array is subjected to the verify-erase based on "0" data held in the data latch LAT. While the erase-verify voltage P0 is applied to the entire word lines in the selected block, a "H" level is applied to the reference word line RefWL, and the reference transistor N10 is coupled to the input nodes /IN and IN at the steps vp0(1) and vp0(2), respectively.

Following the data erase, the reference cells will be subjected to the reference threshold level write by use of the data held in the data latch LAT. Two reference cell blocks, which are distributively disposed at the both sides of the sense amplifier, are sequentially written. Therefore, as shown in FIG. 21, the reference cell write step vpr shown in FIG. 10 is divided into two write steps, vpr(1) and vpr(2), with different data held in the data latch LAT.

In detail, the reference word lines in the reference cell block are selected one by one, and write voltage application and verify-read are repeatedly performed for each selected word line. At a data write time, the selected word line is applied with write voltage Vpgm while the remaining word lines are applied with write pass voltage Vpass. Write data applied simultaneously to the bit lines are data "0", and "0" write is performed in the entire reference cells coupled to the bit lines.

Write-verify is performed as a read operation with verify voltage Pr applied to the selected word line as shown in FIGS. 7 and 8. At this time, the reference word line RefWL is applied with a "H" level, and the reference transistor N10 is coupled to one of the input nodes IN and /IN in accordance with the write step vpr(1) or vpr(2).

(Verify-Write)

Data write is, as shown in FIG. 10, performed with such a write step vp1 that the threshold level L1 is written into the information cell T-cell or C-cell in the erased state L0 in accordance with write data.

This data write unit is, for example, a set of cells simultaneously coupled to the entire sense units in a certain page bank. In detail, the data write unit (i.e., one page) is defined by a set of cells, which are selected by a word line TWL (or CWL) and selected by plural bit lines simultaneously selected with the bit line select circuit 31t (or 31c).

Initially, write data are loaded in the data latch LAT. It should be noted here that "0" write data is loaded as "1" data. With this write data, a bit line at the data "1" side in the nodes B and /B is coupled to one of the input nodes of the sense amplifier; and the reference transistor N10 to the other input node. The bit lines connected to the sense units are set to be Vss (in case of "0" write) or Vdd-Vth (in case of write-inhibiting) via the sense units. With the above-described bit line voltage setting, NAND cell channels are preset in potential in accordance with the write data in such a manner that the electron injection into the floating gate occurs in a selected cell with "0" data supplied.

Thereafter, a write operation is performed with write voltage Vpgm applied to the selected word line TWL (or CWL). Non-selected word lines in the selected NAND block are applied with a certain write pass voltage Vpass set to prevent the non-selected cells from being written.

Write-verify is performed as a read operation with verify voltage P1 applied to the selected word line as shown in FIGS. 7 and 8. At this time, the reference word line RefWL is applied with a "H" level, and the reference transistor N10 is coupled to one of the input nodes IN and /IN.

Data may be sensed based on the current comparison between the information cell and the reference transistor. If the threshold level of a "0" write cell is not sufficiently increased, the data sense results in that the bit line becomes Vss while it is sufficiently increased, the bit line becomes Vdd-Vth. Therefore, in case the threshold level of "0" write cell is sufficiently increased, after data sensing, data at the node B becomes reversed to that at the output node OUT; and data at the node /6 becomes reversed to that at the output node /OUT. This fact may be used for judging the write completion.

With respect to the cell, which has been judged as insufficiently written, the NAND cell channel potential control and write voltage application will be performed again based on the sensed data Vss. The above-described operations will be repeatedly performed until the write completion is judged in the entire sense units.

Note here that since write data and read data are inverted in logic, it is in need of using an interface circuit between the sense amplifier circuit and the chip external.

[Detailed Description of the 4-value Data Storage Scheme (part 1)]

The sense amplifier SA and verify-check circuit VCK, which constitute the sense unit 30, used in the binary data storage scheme are used in this scheme as it is. In this 4-value data storage scheme, at least two data latches are prepared in the sense unit 30. In the following description, the sense amplifier SA and verify-check circuit VCK will be omitted, and data read, erase and write will be explained with reference to the sense unit 30, in which only the data latch circuit portion is referred to.

(Read)

Figures 26, 27:
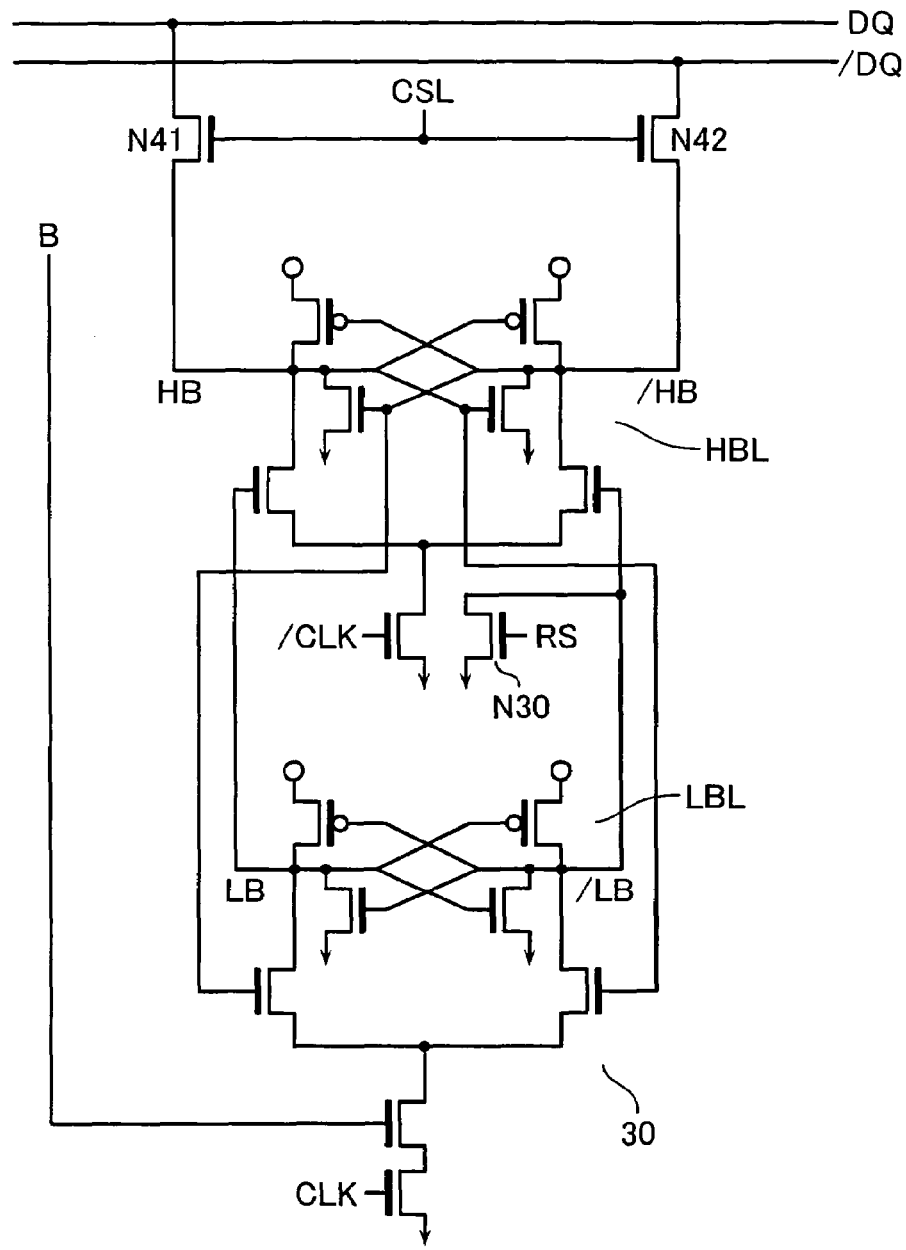
FIG. 26 shows a read data latch system in the sense unit used in the 4-value data storage scheme.
FIG. 27 shows a relationship between read cycles and clocks at a read time thereof.

FIG. 26 shows a data latch circuit configuration concerned in the data read in the sense unit 30. Data node B is, as similar to the binary data storage scheme, coupled to the output node OUT of the sense amplifier SA at a read time. In the 4-value data storage scheme, it is required for writing the upper bit HB and the lower bit LB, and two data latches HBL and LBL are prepared for storing these write data bits. However, as shown in FIG. 26, these data latches HBL and LBL are connected to constitute a two-bit shift register at the read time.

This is for making the upper bit data and the lower bit data be read out independently from each other. As apparent from FIG. 16, the upper bit data HB is "0" or "1" obtained at the read cycle t1. The lower bit data LB is determined as follows: in case the number of "1" obtained through the cycles t2 and t3 is odd, LB is "1"; and in case it is even, LB is "0". Therefore, judge the oddness/evenness of the number of "1" obtained through the two-bit shift register operation, and both of the upper bit HB and the lower bit LB may be read out independently from each other.

In detail, the data latch HBL disposed on the upper side serves as one storing the final read data. This data latch HBL is coupled to data lines DQ, /DQ via column gates N41 and N42.

The data latch HBL is reset to be in a data "0" state as an initial state. Explaining in detail, with reset NMOS transistor N30 driven by a reset signal RS, data latch LBL is reset to be in a data "1" state (LB="H"), and in response to this, data latch HBL is reset to be in the data "0" state (HB="L").

Data transfer of the shift register with these data latches HBL and LBL is controlled with complementary clocks CLK and /CLK, which are, as shown in FIG. 27, generated through OR operation of drive signals for read cycles t1, t2 and t3.

Figure 28:
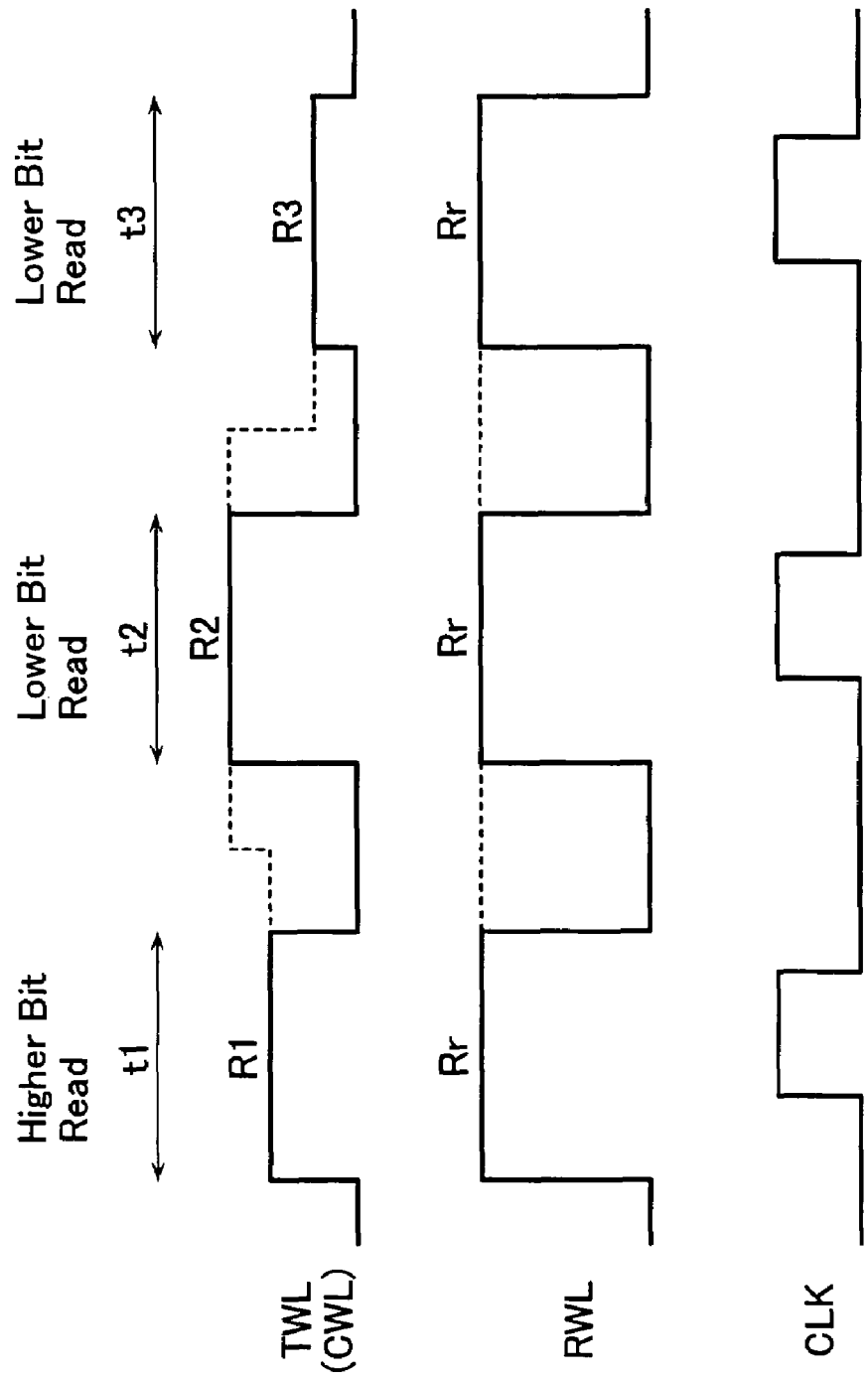
FIG. 28 shows waveforms of word line voltages and clocks at the read time.

FIG. 28 shows waveforms for driving the word lines TWL (or CWL) and the reference word line RWL and clock CLK. At the upper bit read cycle t1, as shown in FIG. 13, the word line TWL (or CWL) of T-cell array (or C-cell array) is applied with read voltage R1 while the reference word line RWL is applied with read voltage Rr. In case the upper bit HB is "0", T-cell current is smaller than R-cell current while in case the upper bit HB is "1", the cell current relationship will be reversed.

At the lower bit read cycles t2 and t3, the word line TWL (or CWL) is applied with read voltages R2 and R3, respectively, while the reference word line RWL is applied with the same read voltage Rr as that at the first cycle t1. At the cycle t2, in case the lower bit LB is "0", bit line BL becomes higher than the bit line /BL (data "00") while in case the lower bit LB is "1", revered data is obtained (data "01"). At the cycle t3, these relationships are inverted.

To execute continuously these read cycles t1-t3, as shown by dotted lines, the read voltage Rr may be continuously applied to the reference word line RWL through cycles t1-t3. Although, in the example shown in FIG. 28, the read voltages applied to the word line TWL are stepped down to Vss at each blanking time, these may be exchanged as shown by dotted lines. Note here that, although there is not shown in FIG. 28, it is in need of disabling the sense amplifier after each read cycle and then activating it again.

It is not always necessary to make the read cycles t1-t3 continuous. For example, to read only the upper bit HB, only the read cycle t1 is executed; and to read only the lower bit LB, only the read cycles t2 and t3 are executed. The order of the cycles t2 and t3 are not limited to that shown in FIG. 28.

The sensed data at the cycle t1 is transferred to data latch LBL via data node B with clocks CLK="H" and /CLK="L" synchronized with the cycle t1, and then shifted to data latch HBL. As a result, data in data latch HBL becomes identical with that in data latch LBL.

That is, in accordance with read data "0" or "1" at the node B, data in the data latch HBL is "0" or "1", which serves as the upper bit data HB. This upper bit dada HB may be output to the data line pair DQ, /DQ in response to the column select signal CSL.

The lower bit data read is performed with data shift operations through two read steps t2 and t3. If "1" is sensed at either one of steps t2 and t3 (i.e., the number of "1" is odd), data latch HBL finally stores "1". If "0" data or "1" data are continued (i.e., the number of "1" is even), data latch HBL finally stores "0".

As described above, it is determined at the step t1 whether the upper bit HB is "0" or "1", while the lower bit LB "0" or "1" is determined through steps t2 and t3 without regard to the upper bit HB.

In the read scheme in accordance with this embodiment, the cell current is detected on the condition that the sense amplifier load is balanced, the data read may be performed at a high rate. In other words, it is not required to take a bit line precharging time, and data may be sensed in a very short time.

Figure 29:
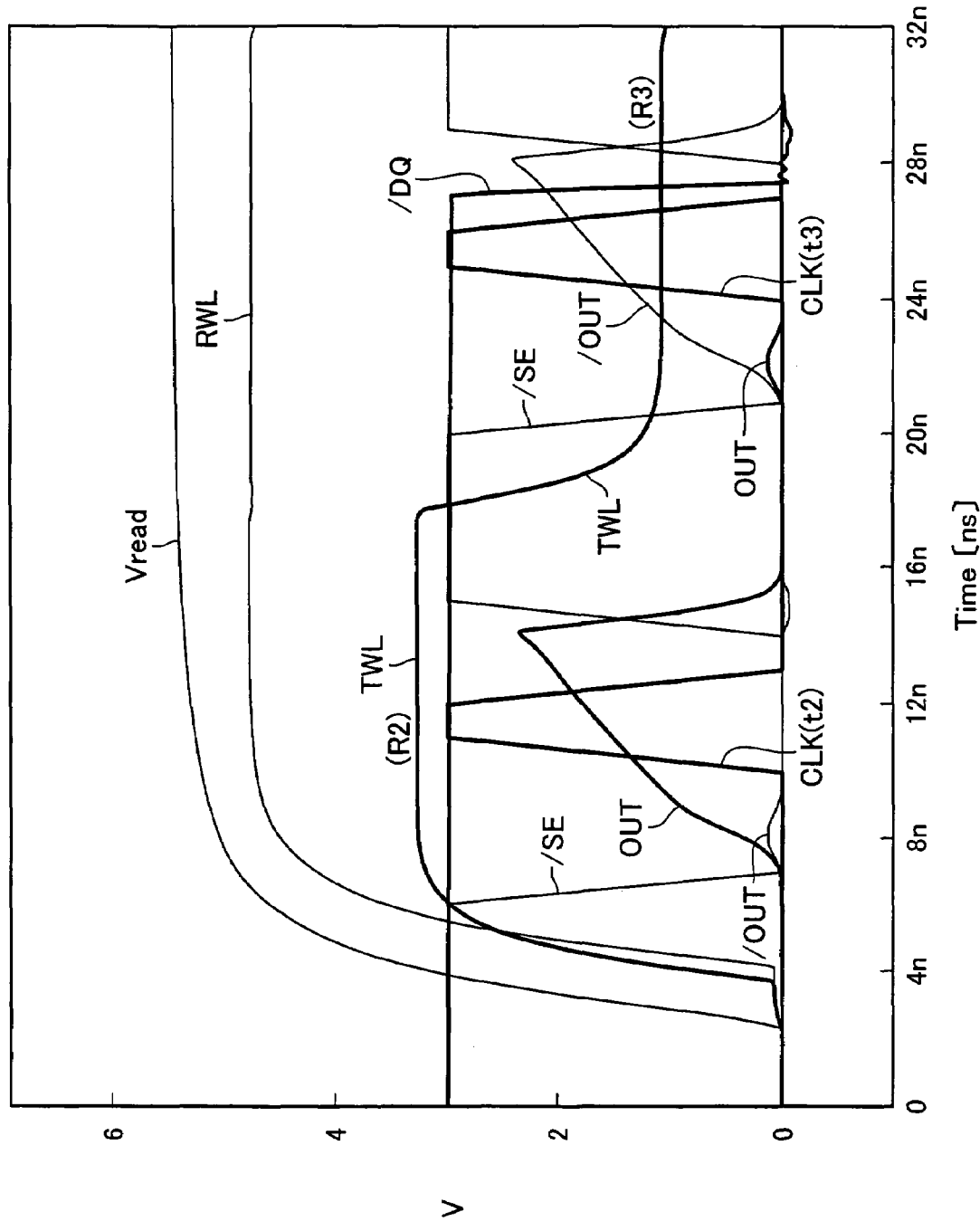
FIG. 29 shows simulated read waveforms.

FIG. 29 shows read operation waveforms as a result of a simulation for a 3V memory system. There are shown the lower bit read waveforms through steps t2 and t3 in case of (HB,LB)=(1,1).

While the reference word line RWL is applied with boosted read voltage Rr of about 4.5V through steps t2 and t3, the word line TWL is applied with: read voltage R2 boosted as slightly higher than the power supply voltage at step t2; and read voltage R3 lower than the power supply voltage at step t3. Vread is a boosted write pass voltage of about 5V, which is applied to non-selected word lines in the selected block.

After the sense amplifier activation signal /SE is set to be "L" in a state that the word lines are applied with the respective voltages as described above, clock CLK(t2) rises. The sense amplifier will be temporally made inactive between cycles t2 and t3. Thereafter, the word line levels are set, and the sense amplifier is activated again, following it clock CLK (t3) rises.

In the example shown in FIG. 29, data "1" (OUT="H") is obtained at the first cycle t2; and data "0" (OUT="L") at the following cycle t3. Therefore, data latch HBL finally stores data "1", and this sense data is read out as /DQ="0" (="L") in the example shown in FIG. 29.

According to the result shown in FIG. 29, it takes about 26 ns through two cycles after the word line rise time to output the lower bit data. Therefore, it will be understood that the word line rising being sufficiently rapid, it is able to read data at a high rate, which has never been achieved in the prior arts.

(Verify-erase)

Figures 30, 31:
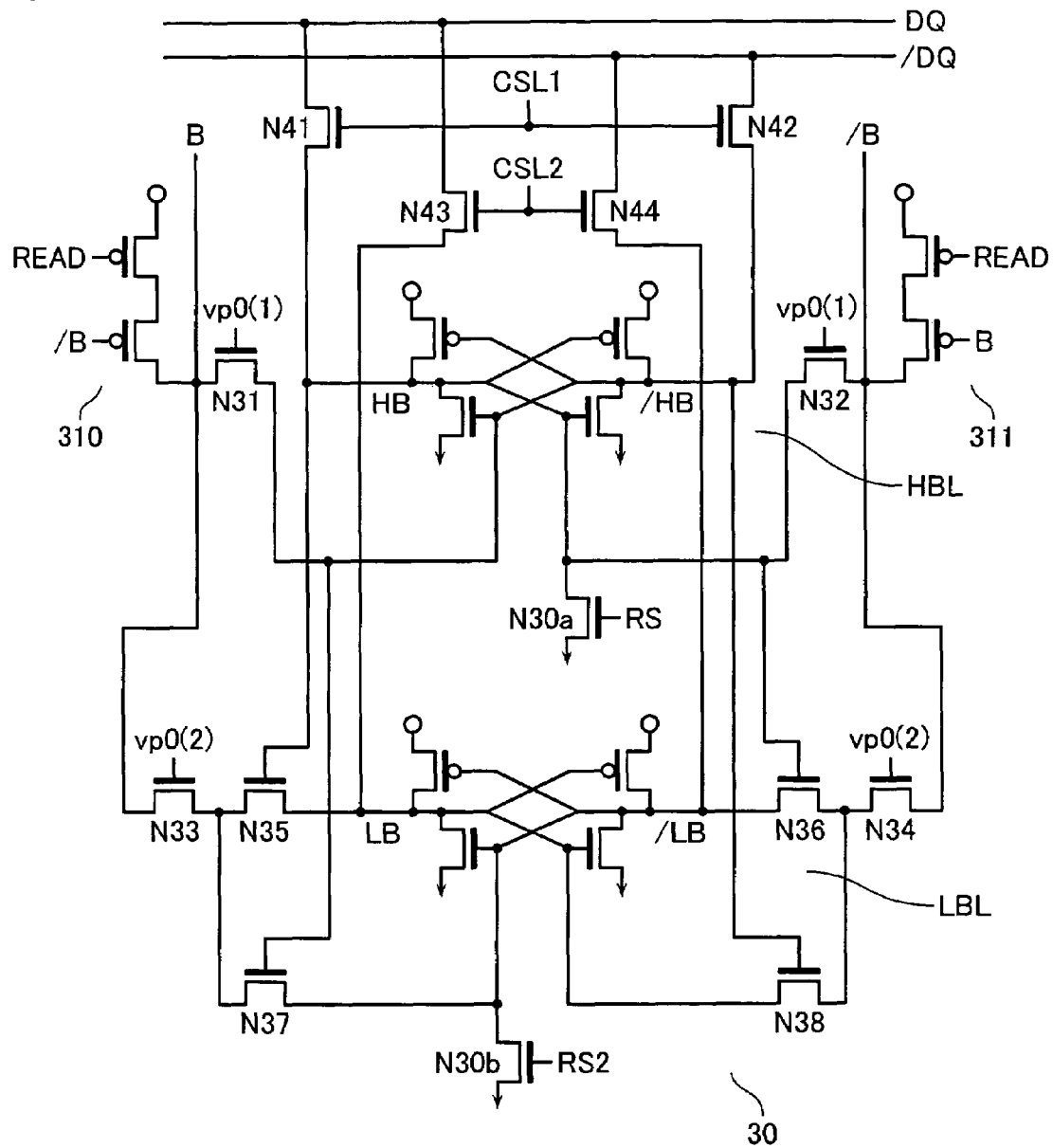
FIG. 30 shows an erase data latch system in the sense unit used in the 4-value data storage scheme.
FIG. 31 shows data latch data in the sense unit at an erase time in the 4-value data storage scheme.
Figure 32:
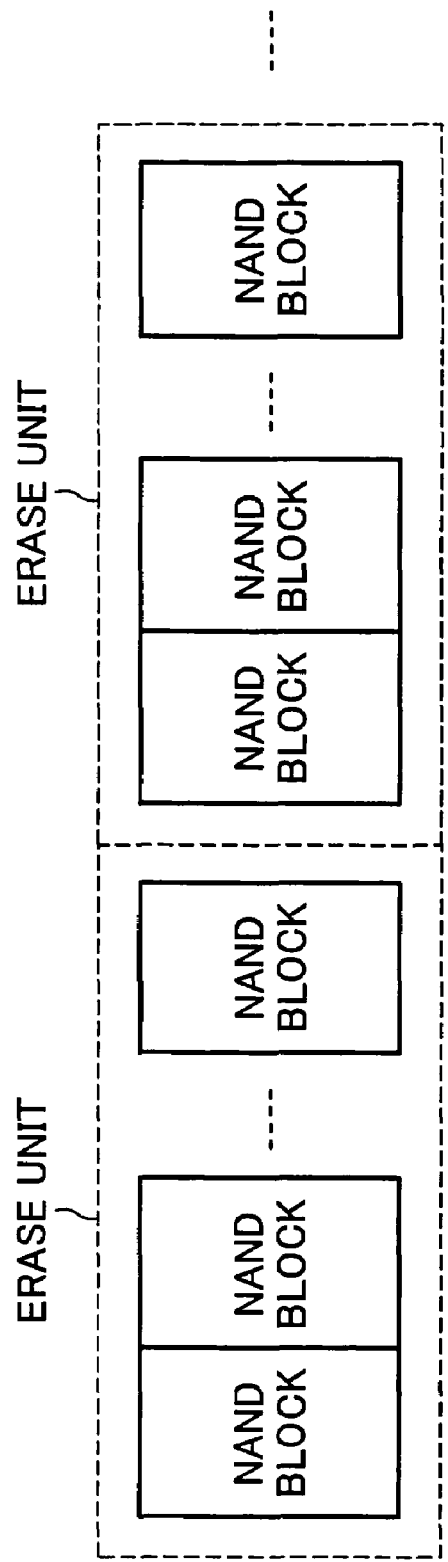
FIG. 32 shows an example of an erase unit.

FIG. 30 shows a data latch circuit configuration concerned in the verify-erase in the sense unit 30. Data erase is performed by repeat of an erase voltage application to the entire cells in an erase unit and a verify operation for verifying the erase state. The erase unit is, for example, constituted by plural NAND blocks as shown in FIG. 32, or each NAND block serves as the erase unit.

An erase operation is for setting cells to be in the lowest threshold level L0. For the purpose, the entire word lines in a selected block is applied with Vss; and the cell well, on which the cell array is formed, is applied with the erase voltage Vera. With this voltage application, electrons in the floating gates of the entire cells are released.

Data erase may be executed simultaneously for the whole cells coupled to the bit lines BL and /BL disposed on the both sides of the sense unit, but it is required for comparing a cell current with the reference current of the reference current source circuit 301 in the erase-verify mode. Therefore, the erase-verify for the cell array 1t on the bit line BL side and that for the cell array 1c on the bit line /BL side are executed at different timings from each other.

To do such the erase-verify, two data latches HBL and LBL store complementally data, which serves for sequentially selecting the cell arrays 1t and 1c. For example, data latches HBL and LBL store data "0" and "1", respectively. In FIG. 30, the data latches HBL and LBL are not connected as shown in FIG. 26. For the convenience of explanation, FIG. 30 shows a reset transistor N30a, which is driven by a reset signal RS for storing data "0" in the data latch HBL and another reset transistor N30b, which is driven by another reset signal RS2 for storing data "1" in the data latch LBL. However, in practice, as shown in FIG. 26, two data latches LBL and HBL are so constituted as to have complementally data with a reset circuit.

The erase step vp0 shown in FIG. 17 is divided into two verify-erase steps vp0(1) and vp0(2). As shown in FIG. 31, at the step vp0(1), the cell array 1t on the bit line BL side is subjected to the verify-erase based on data "0" stored in the data latch HBL; and at the step vp0(2), the cell array 1c of the bit line /BL side is subjected to the verify-erase based on data "1" stored in the data latch LBL.

Coupled to the data nodes B and /B, which serve for controlling connection/disconnection of the bit lines BL and /BL, are charge-up circuits 310 and 311, respectively, which are off in the read mode (READ="1"); and otherwise charge-up one of the data nodes B and /B to Vdd.

At the step vp0(1), transferring NMOS transistors N31 and N32 are turned on, so that one of the bit lines BL and /BL is coupled to one input node of the sense amplifier via the node B or /B; and the other is disconnected.

At the step vp0(2), transferring NMOS transistors N33 and N34 are turned on. At this time, transferring NMOS transistors N35 and N36 are driven by the data latch HBL to be turned on.

The cell array selection may be reversed to that as described above. That is, supposing that HBL="1", and LBL="0", cell array 1t is selected at the step vp0(1); and cell array 1c at the step vp0(2). In this case, transferring NMOS transistors N37 and N38 are turned on together with NMOS transistors N33 and N34 at the data latch LBL side.

Figure 33:
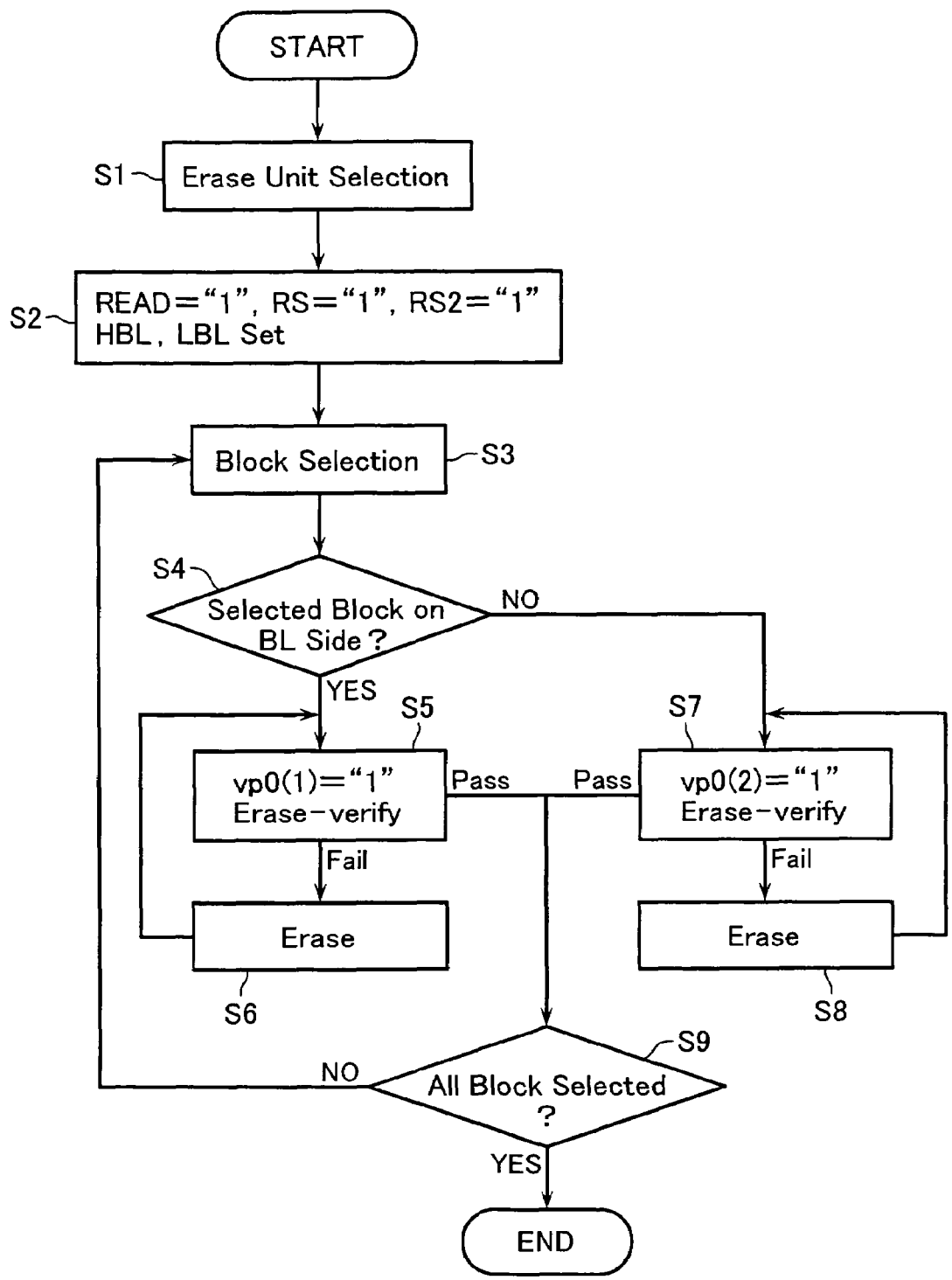
FIG. 33 shows an erase operation flow of the erase unit.

The verify-erase operation will be explained in detail with reference to FIGS. 33 and 34 below. Following command input, address is input to select an erase unit (step S1). As described above, the erase unit is at least one NAND block or preferably includes plural NAND blocks.

Following it READ="1" and RS=RS2="1" being set, data latches HBL and LBL in the sense unit 30 are set to store complementally data (step S2). In the above-described example, HBL="0" and LBL="1" are set.

Next, in case the erase unit includes plural NAND blocks, select one block therein (step S3) and go to verify-erase step. First, it is judged whether the selected block is disposed on the bit line BL side or not (step S4). If "YES", the cell array disposed on the bit line BL side is subjected to the erase-verify (step S5) in accordance with vp0(1)="1". In case there is an insufficiently erased cell (i.e., judged as "FAIL"), the erase voltage is applied (step S6). If judged is "NO" at the step S4, the cell array disposed on the bit line /BL side is subjected to the erase-verify (step S7) in accordance with vp0(2)="1". In case there is an insufficiently erased cell (i.e., judged as "FAIL"), the erase voltage is applied (step S8).

The above-described verify-read and erase are repeated until when the verify step is passed. If judged is "PASS", it will be judged whether the entire selected blocks have been completely erased or not (step S9). If "NO", the following block is selected (step S3), and the same verify-erase operations as described above will be repeated until when the entire blocks are erased.

Verify-read in the erase mode is performed for each NAND block with Vss (i.e., verify voltage P0) applied to the entire word lines in the selected NAND block. If the entire cells in a NAND cell unit have been set to be in a negative threshold level lower than the verify voltage P0, the cell current of the NAND cell unit is detected as larger than the reference current, whereby it will be fudged that the NAND cell unit has been erased.

The erase verify-check operations at the steps S5 and S7 are performed with the same verify-check circuit VCK in the sense unit as described in the binary data storage scheme. If data erase has been completed in the entire sense units 30, FINn−1="H" (pass flag) will be generated.

Figure 34:
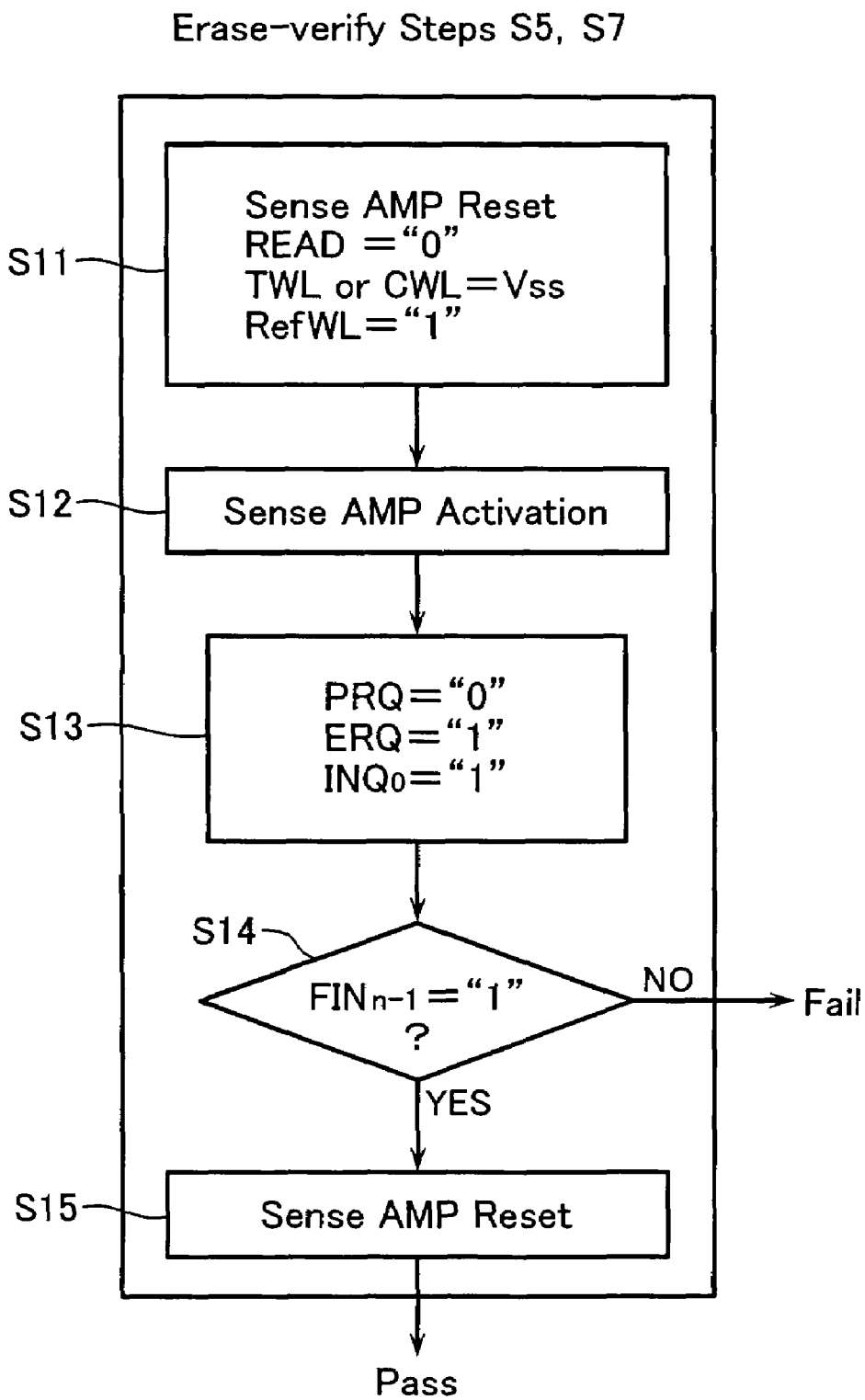
FIG. 34 shows a detailed flow of the verify steps S5 and S7 in FIG. 33.

FIG. 34 shows a detailed flow adapted to the verify-read steps S5 and S7. Initially, the sense amplifier is reset; the read control signal, READ, is set to be "0"; the entire word lines in a selected NAND block are set to be Vss; and the reference word line RefWL is set to be "1" (step S11). As a result, one of the input nodes IN and /IN is coupled to a bit line; and the other to the reference transistor.

Following it the sense amplifier is activated (step S12). Next, PRQ="0", ERQ="1" and INQ0="1" being applied, the verify-check circuit VCK is made operable in the erase-verify mode (step S13). "Pass" or "Fail" is judged whether FINn−1 becomes "1" or not (step S14). If "Fail", erase will be performed while if "Pass", the sense amplifier SA is reset (step S15).

(Reference Cell Write)

After data erase for NAND blocks containing the reference cell block, the reference cell block should be written into the threshold level L4. The data write of the reference cell block is performed in such a way that word lines in the block are sequentially selected one by one; and write voltage Vpgm is applied to each word line so as to inject electrons into cell's floating gate. In this case, the write voltage application and verify-read will be repeated. As different from the data write for the information cells, T-cell and C-cell, cell data "0" is written into the entire reference cells, R-cell, simultaneously selected as one page data of all "0".

It is in need of setting one reference cell block at each side of the bit lines BL and /BL. Since, in the reference cell write mode, write data supplied to the entire selected bit lines is set as all "0", it is not necessary to load write data in the sense unit unlike the ordinary data write mode.

Figures 35, 36:
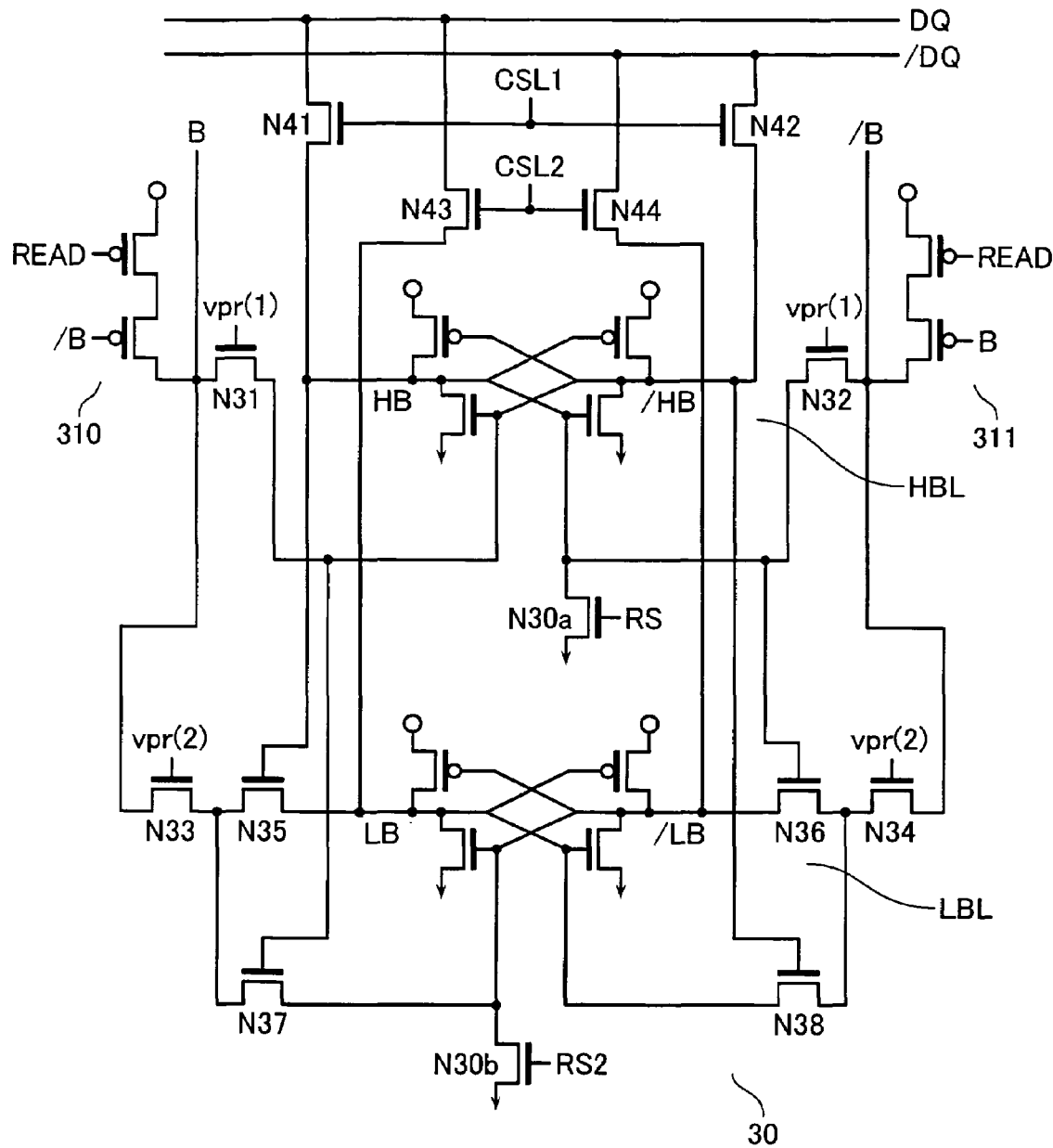
FIG. 35 shows a reference cell write data latch system in the sense unit used in the 4-value data storage scheme.
FIG. 36 shows data latch data in the sense unit at a reference cell write time.

Therefore, as shown in FIG. 35, the same data latch system in the sense unit 30 is formed as in the erase mode. Data latches HBL and LBL store complementally data, whereby the bit lines BL and /BL are sequentially selected.

The step "vpr" shown in FIG. 17 is, as shown in FIG. 36, divided into two steps "vpr(1)" and "vpr(2)", the former being for writing the reference cell on the bit line BL side based on data "0" stored in data latch HBL; and the latter being for writing the reference cell on the bit line /BL side based on data "1" stored in data latch LBL. Transferring NMOS transistors (N31, N32) and (N33, N34) are driven by the respective timing signals corresponding to the steps vpr(1) and vpr(2).

Write-verify is for comparing the cell current with the reference current to verify that cell data becomes "0" on the condition that verify voltage Pr is applied to the selected word line; and at the same time the reference word line RefWL is raised. Data write will be repeated until when there is not detected an insufficiently written cell.

(Information Cell Write)

Figures 37, 38:
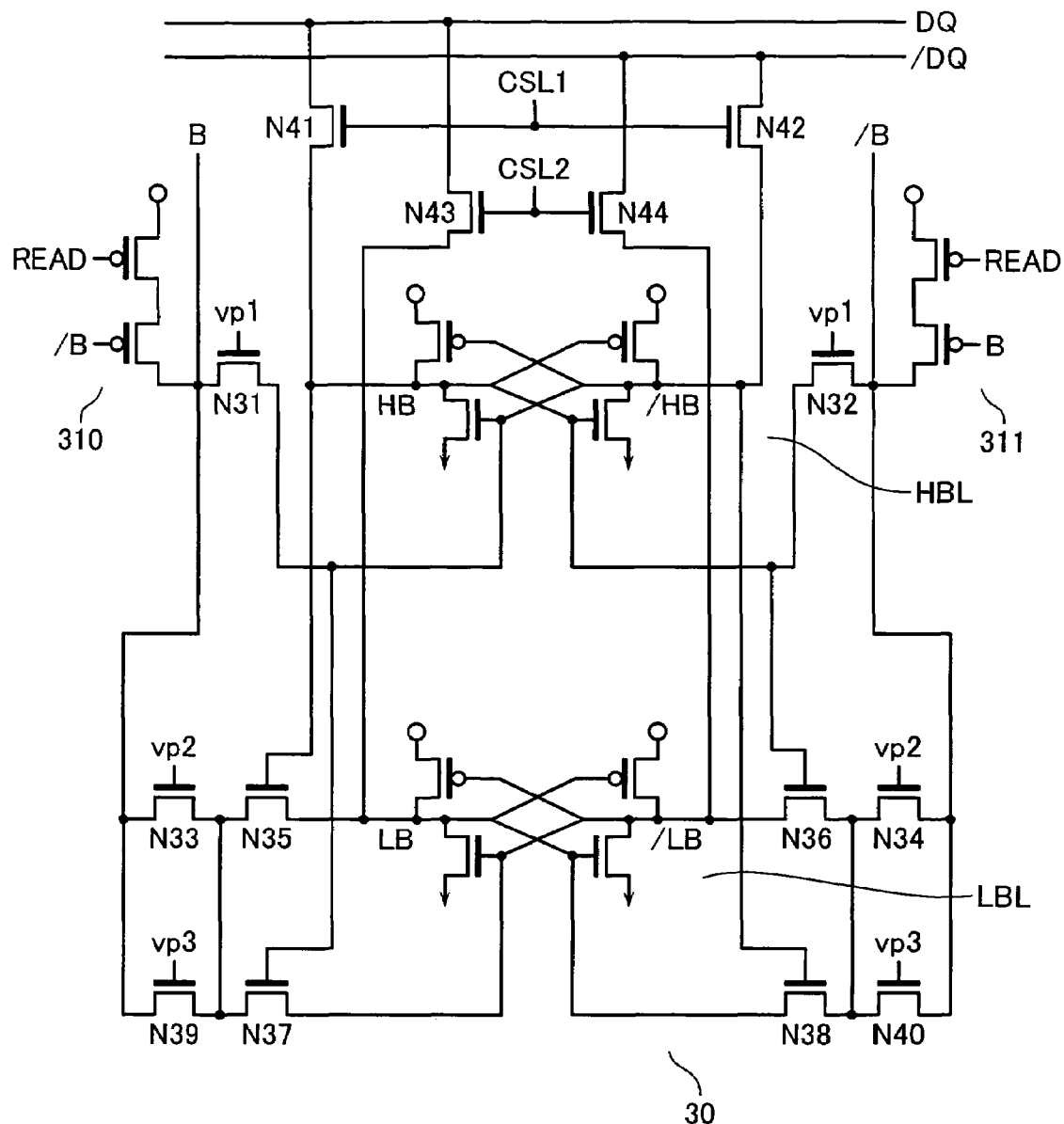
FIG. 37 shows information cell write data latch system in the 4-value data storage scheme.
FIG. 38 shows data latch data at the information cell write time.

FIG. 37 shows a data latch circuit configuration concerned in the verify-write in the sense unit 30. As externally supplied write data, the upper bit (i.e., the upper page) data and the lower bit (i.e., the lower page) data are loaded in the data latches HBL and LBL, respectively. That is, the upper bit and the lower bit write data supplied via data lines DQ, /DQ are transferred to data latches HBL and LBL via column select gates (N41, N42) and (N43, N44), which are driven by column select signals CSL1 and CSL2, respectively.

Data write is, as shown in FIG. 17, performed with the upper bit write-verify step "vp1" and the lower bit write-verify steps "vp2" and "vp3". At the lower bit (LB) write time, it is required that the upper bit (HB) has already been determined because data set at the nodes B and /B is to be inverted in correspondence with the upper bit data. Therefore, in case the data write sequence is interrupted with a read operation inserted after the write step vp1, to restart the following write steps vp2 and vp3, it is in need of reading out the upper bit data, which has already been written into the cell array, and transferring it to the data latch HBL.

FIG. 38 shows that the upper bit (HB) "0" or "1" is determined at the write step vp1; the lower bit (LB) "0" or "1" in case of HB="0" is determined at the write step vp2; and the lower bit (LB) "0" or "1" in case of HB="1" is determined at the write step vp3. Determined data are shown with bold strokes in FIG. 38.

FIG. 37 shows that the upper bit data transferring NMOS transistors (N31, N32), the lower bit data transferring NMOS transistors (N33, N34) and (N39, N40) are driven by timing signals corresponding to the write steps vp1, vp2 and vp3, respectively.

Data write is performed in such a manner that a set of cells selected by plural bit lines BL (or /BL) simultaneously coupled to the entire sense units in a certain page bank and a word line TWL (or CWL) serves as a write unit (i.e., one page).

The upper bit write and the lower bit write are the same in the write principle. That is, write voltage application for applying the write voltage Vpgm to a selected word line TWL (or CWL) and verify-read for verifying the write state are repeatedly performed.

In order that electron injection into the floating gate occurs in a "0" data supplied cell at the write voltage application time, the NAND cell channel is preset in potential in accordance with write data. Non-selected word lines in a selected NAND block are applied with a certain write pass voltage necessary for preventing the non-selected cells from being written.

Figure 39:
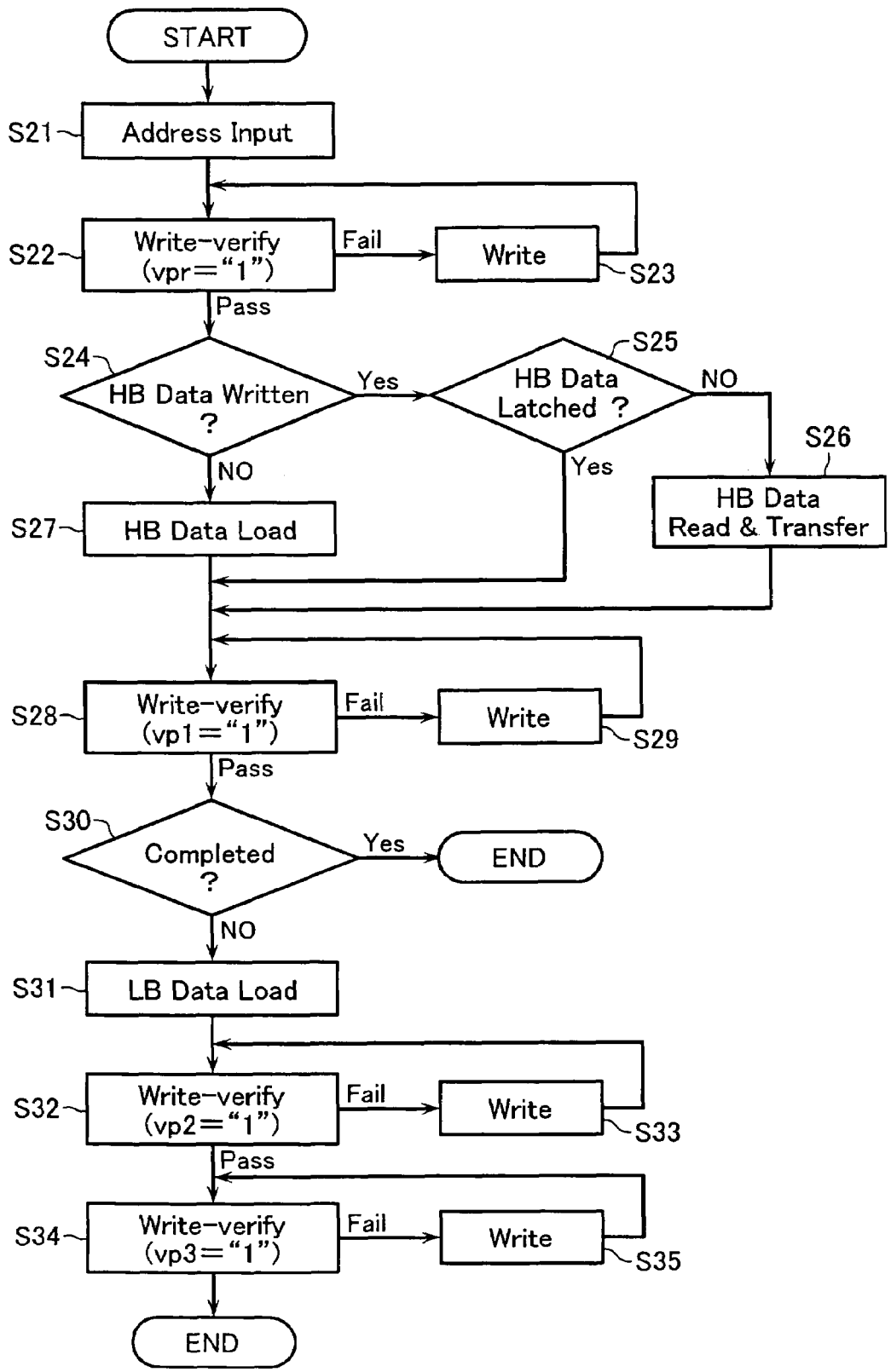
FIG. 39 shows an information cell write flow for one page.

FIG. 39 shows a page write sequence. Following command input, address is input, and a main page is selected (step S21). Following it the write-verify is performed for verifying whether a reference cell corresponding to the selected page (i.e., reference cell, R-cell, coupled to a bit line opposed to a selected bit line) has been written or not (step S22). Having not written, the reference cell will be written (step S23).

Having verified the reference cell write, go to the next step. Here, it is considered that the write sequence may be temporarily interrupted with, for example, a read access for the same page. Therefore, judge whether the upper sub-page data (HB) has been written or not (step S24). In case it has not been written, HB data is externally input and loaded in the data latch HBL (step S27).

In case HB data has been written, it is further judged whether it is held at the data latch HBL or not (step S25). If "NO", it will be read out from the cell array and transferred to the data latch HBL (step S26).

Next, HB data write-verify will be performed (step S28). At this time, HB data in the data latch HBL is output to data node B, /B in response to a write timing signal "vp1". As a result, the write-verify is performed on the condition that a bit line is coupled to one of the input nodes IN and /IN of the sense amplifier SA; and the reference transistor N10 to the other.

The write-verify being failed, the data write is performed (step S29). In case HB data has already been written, the verify step S28 will be passed soon. The data write is performed with write voltage Vpgm applied to the selected word line TWL (or CWL). In a cell, the channel of which is set to be Vss in accordance with HB data, electrons are injected into floating gate thereof, and the cell's threshold level will be increased ("0" write). By contrast, in another cell, the channel of which is set to be in a high potential floating state, electron injection is not generated ("1" write or write inhibiting).

The above-described operation will be repeated until when the verify step is passed. And it is judged whether the entire selected sub-page data have been written or not. If "NO", the lower sub-page (LB) data is externally loaded and held in the data latch LBL (step S31).

LB data write is, as described above, performed through two steps in accordance with HB data. That is, write-verify step S32 in accordance with write timing signal vp2="1" and write step S33 are repeated until when the verify step is passed, and write-verify step S34 in accordance with write timing signal vp3="1" and write step S35 are repeated until when the verify step is passed. As a result, one page data write has been completed.

Figure 40:
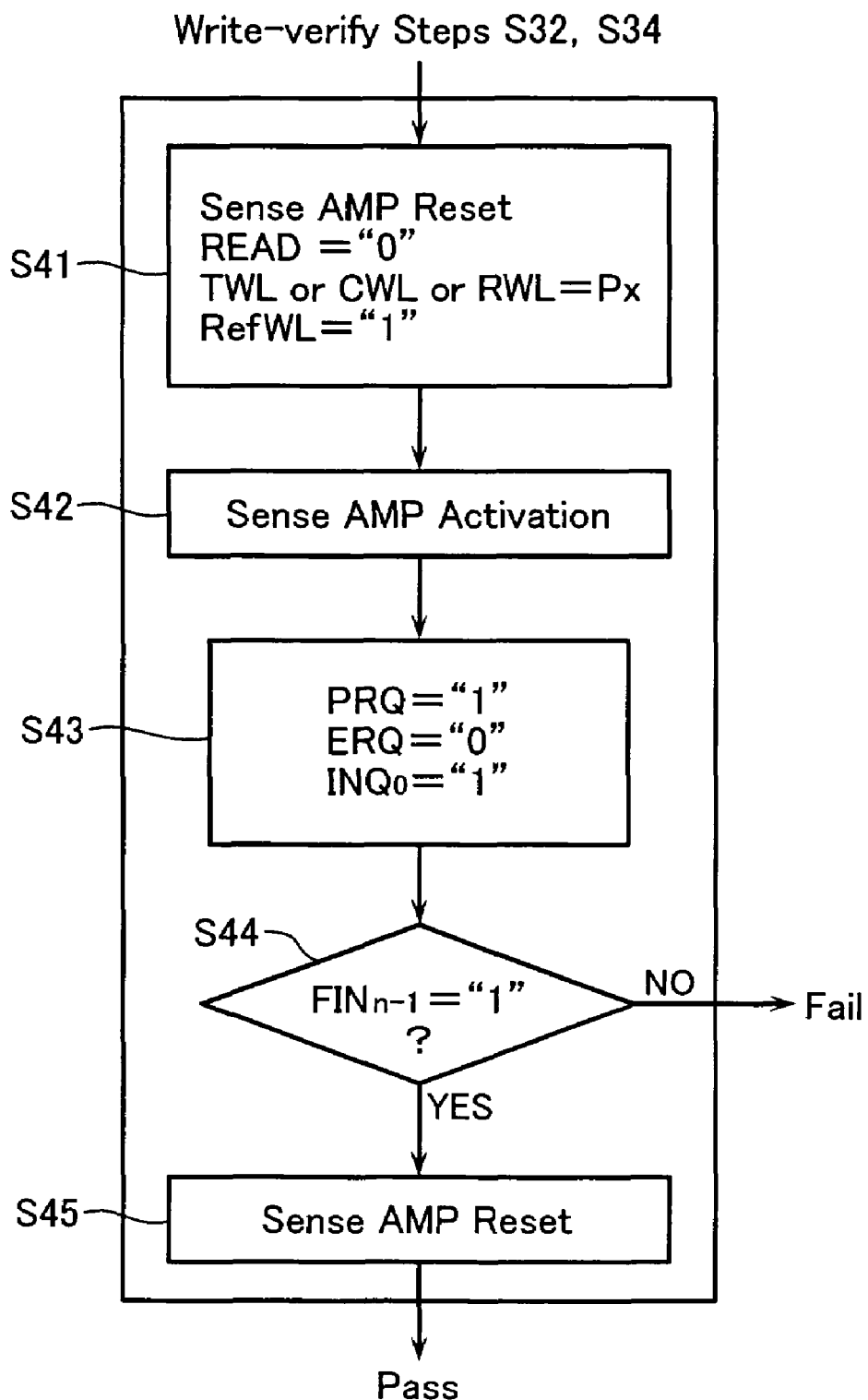
FIG. 40 shows a detailed flow of the verify steps S32 and S34 in FIG. 39.

FIG. 40 shows a detailed flow of the write-verify steps S32 and S34. The sense amplifier SA is reset; the sense amplifier and data latch are separated from each other with read control signal READ="0"; word lines TWL, CWL and RWL are applied with the respective verify voltages Px; and the reference word line RefWL is applied with "1" (="H") (step S41).

The verify voltages Px are set as follows: P1 used in case of HB data write, which is set to be necessary for verifying that the threshold level has reached L2; and P2 and P3 used in case of LB data write, which are set to be necessary for verifying that the threshold level has reached L3 and L2, respectively (as shown in FIG. 13). Each of these verify voltages Px is defined as a read word line voltage, which makes the cell current less than the reference current. That is, each of these verify voltages is set to be slightly higher than the upper limit of the corresponding threshold level distribution.

Thereafter, the sense amplifier SA is activated to sense data (step S42). After sensing, one of the bit lines BL and /BL is set to be Vdd; and the other Vss. Then, the verify-check circuit VCK is made operable in a write-verify mode with PRQ="1", ERQ="0" and INQ0="1" applied (step S43), and it will be judged "Pass" with FINn−1="1" or "Fail" (step S44). If "Fail", the data write is performed while if "Pass", the sense amplifier SA is reset (step S45).

Note here that the verify-read data is reversed in logic to the corresponding write data held in data latch HBL or LBL. The reason is as follows: cell data for increasing the threshold level is supplied as an "L" level for setting the bit line to be "L" (=Vss) while when the cell is written into a desirable threshold level, it is read as a "H" level data of the selected bit line. Considering this point, it is required to constitute a certain interface circuit for transferring read/write data.

Figure 41:
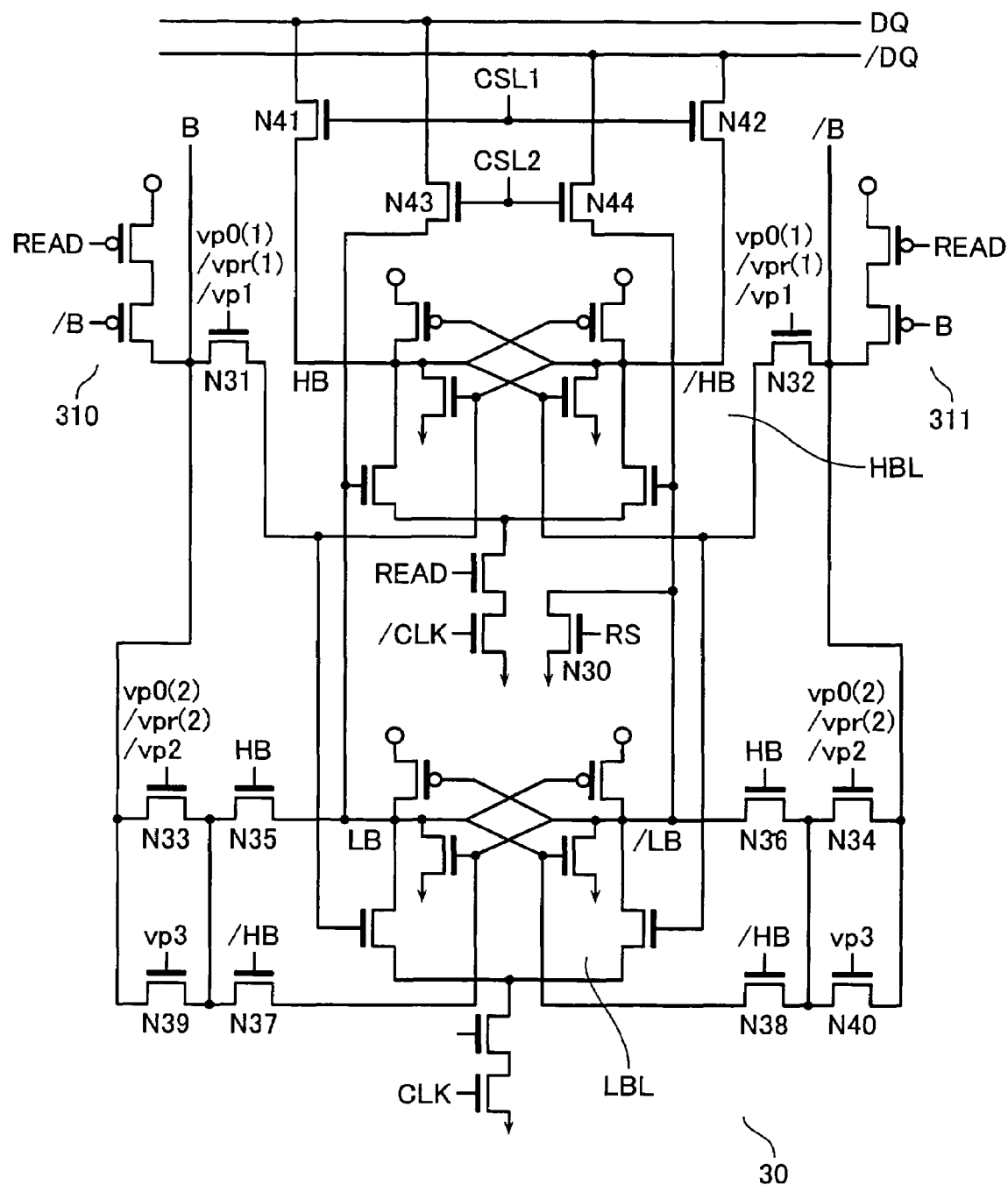
FIG. 41 shows a summed-up data latch system containing those shown in FIGS. 26, 30, 35 and 37.

FIG. 41 shows a summed-up data latch system containing the above-described read system (FIG. 26), erase system (FIG. 30), R-cell write system (FIG. 35) and T-cell, C-cell write system (FIG. 37). Two data latches HBL and LBL used for write-verifying and erase-verifying are used as those for constituting a shift register in the read mode.

With the above-described data latch system, even if the write sequence is interrupted with a read operation, the written data being read out the cell array, it is possible to restart the suspended write sequence. Data setting at the erase time or T-cell write time is performed in such a way that data latch LBL is set in the data "1" state on the condition of: CLK="0", /CLK="1"; and read control signal READ and reset signal RS are "1", and data latch HBL is set in the data "0" state in response to the data in the data latch LBL. As a result, bit line BL may be selected with the timing signal vp1="1"; and bit line /BL with the timing signal vp2="1".

Figure 42:
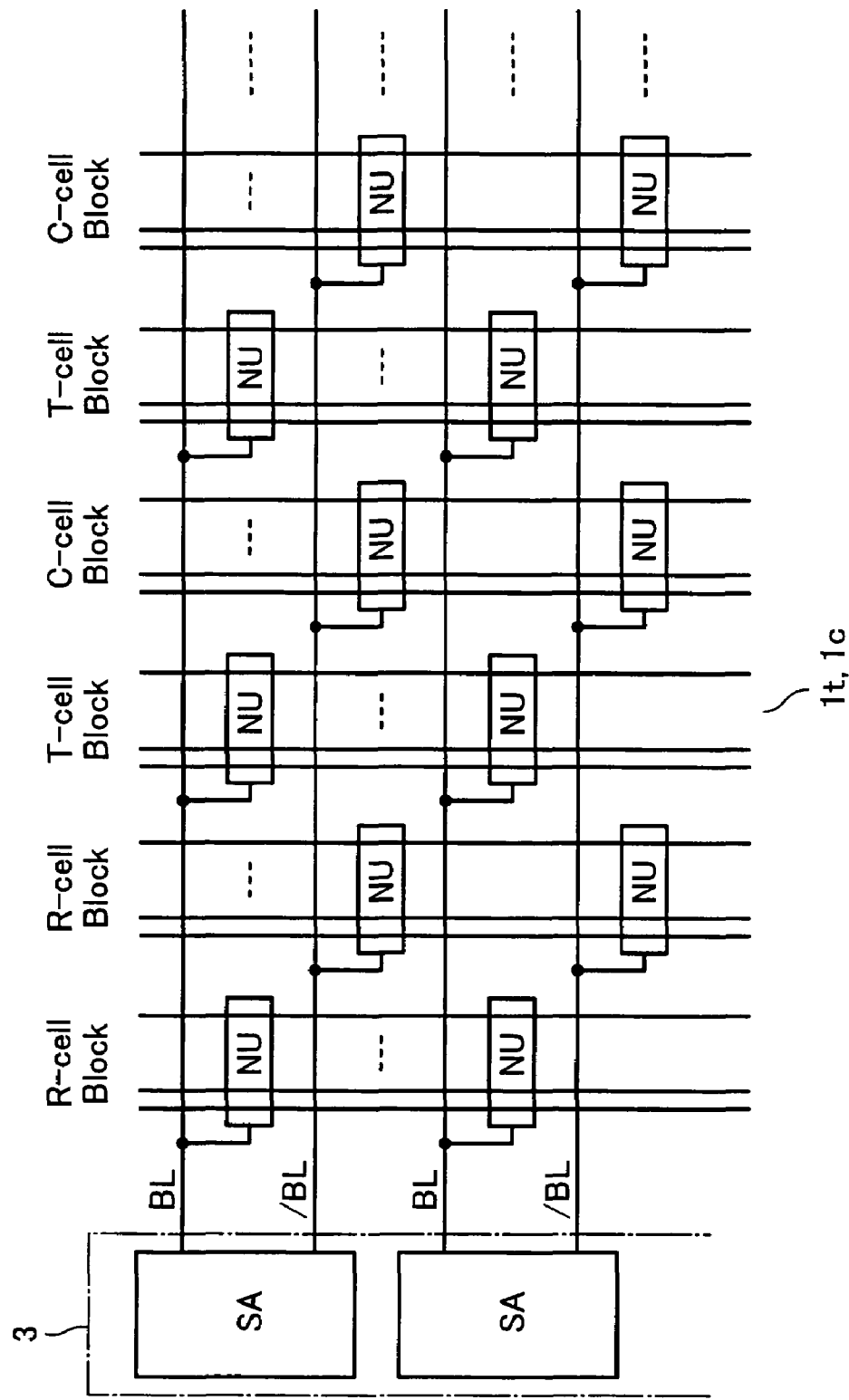
FIG. 42 shows a layout of a cell array and a sense amplifier circuit with a folded bit line scheme.

In the above-described embodiment, such an open bit line scheme is used that bit lines BL and /BL are disposed dispersedly on the both sides of the sense amplifier. By contrast, it is effective to use such a folded bit line scheme that one of the cell array 1t and 1c is folded on the other side, i.e., as shown in FIG. 42, cell arrays 1t and 1c are disposed on one side of the sense amplifier circuit 3.

While the memory cell in the above-described embodiment has such a stacked gate structure that a floating gate and a control gate are stacked, other non-volatile memory cell structures may be used such as SONOS (Silicon Oxide Nitride Oxide Silicon) structure, MONOS (Metal Oxide Nitride Oxide Silicon) structure and the like.

Further, the present invention may be adapted to other non-volatile memories, each of which stores a kind of physical quantity level not limited to a threshold level, such as a phase-change memory PRAM (Phase-change PAM), a resistance memory RRAM (Resistance RAM), an ovonic memory OUM (Ovonic Unified Memory), a magnetoresistive memory MRAM (Magnetoresistive RAM), a ferroelectric memory (Ferroelectric RAM), and the like.

[Application Devices]

As an embodiment, an electric card using the non-volatile semiconductor memory device according to the above-described embodiment of the present invention and an electric device using the card will be described bellow.

Figure 43:
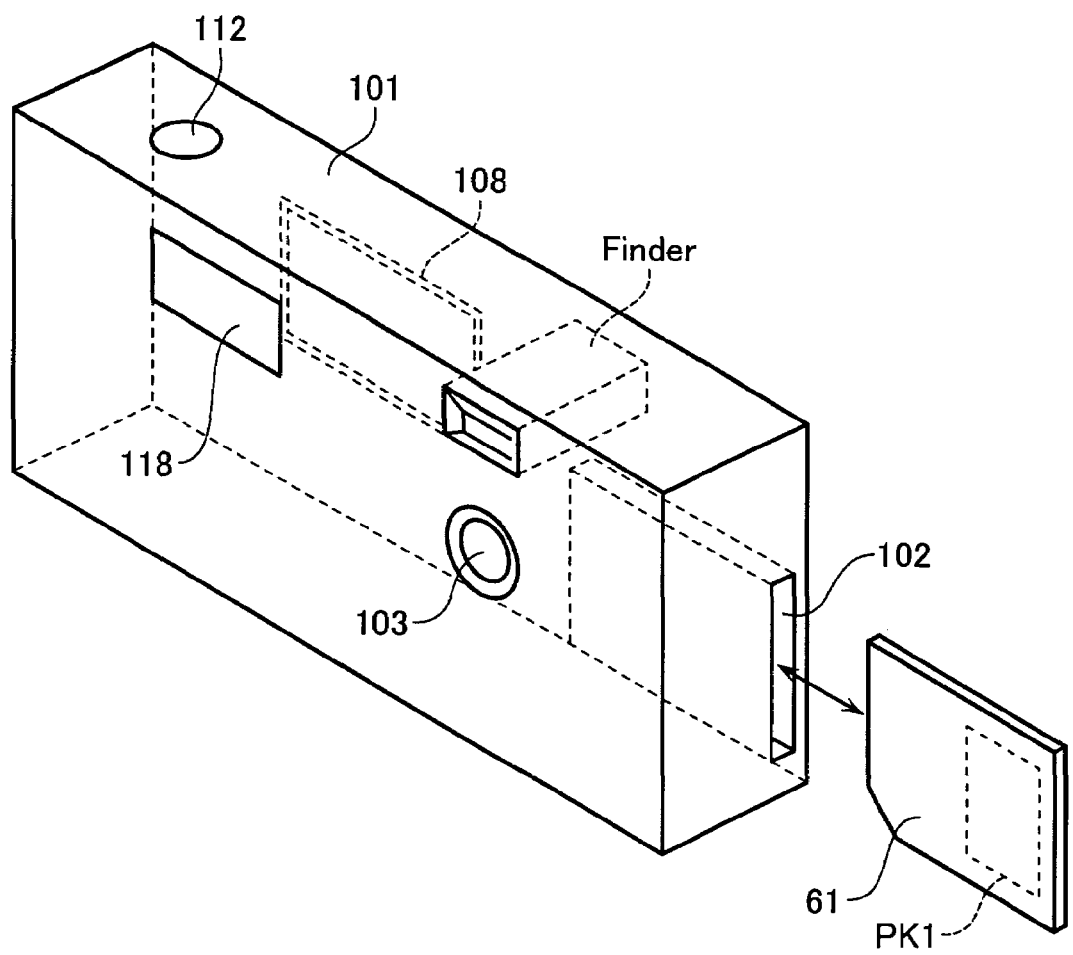
FIG. 43 shows another embodiment applied to a digital still camera.

FIG. 43 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 44:
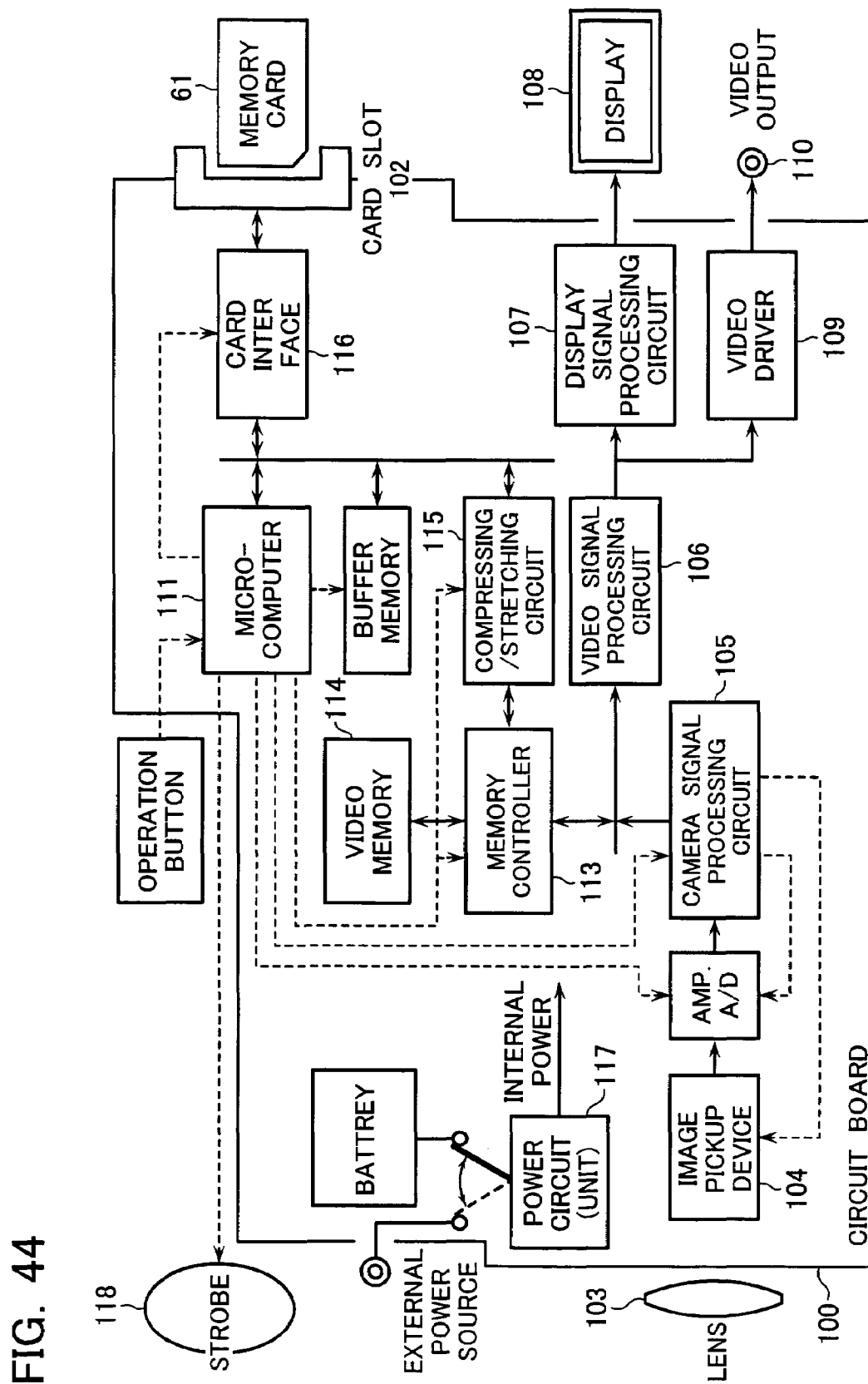
FIG. 44 shows the internal configuration of the digital still camera.
Figure 45A:
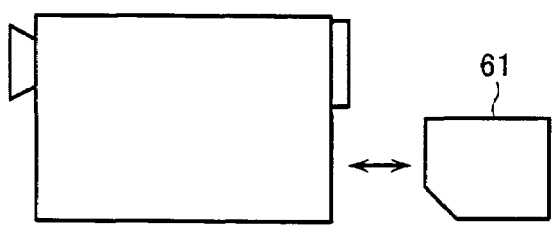
FIGS. 45A to 45J show other electric devices to which the embodiment is applied.
Figure 45F:
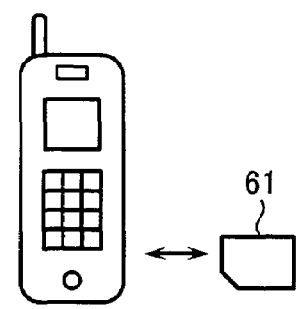
Figure 45B:
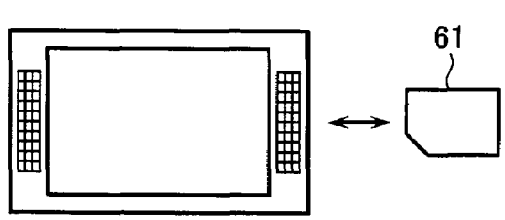
Figure 45G:
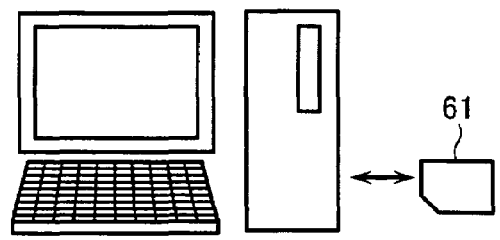
Figure 45C:
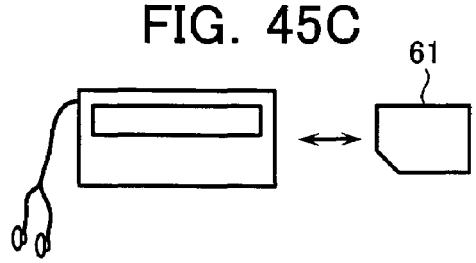
Figure 45H:
Figure 45D:
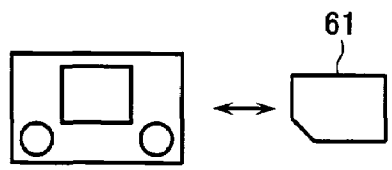
Figure 45I:
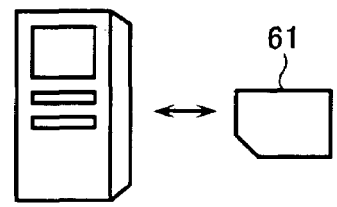
Figure 45E:
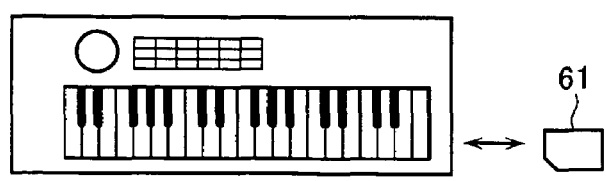
Figure 45J:
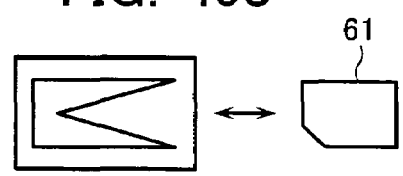

FIG. 44 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 45A to 45J, as well as in portable electric devices. That is, the electric card can also be used in a video camera shown in FIG. 45A, a television set shown in FIG. 45B, an audio apparatus shown in FIG. 45C, a game apparatus shown in FIG. 45D, an electric musical instrument shown in FIG. 45E, a cell phone shown in FIG. 45F, a personal computer shown in FIG. 45G, a personal digital assistant (PDA) shown in FIG. 45H, a voice recorder shown in FIG. 45I, and a PC card shown in FIG. 45J.

What is claimed is:

1. A semiconductor memory device comprising:
   a memory cell array with electrically rewritable and non-volatile memory cells arranged therein; and
   a sense amplifier circuit configured to read out data of the memory cell array, wherein
   a plurality of information cells, in each of which one of M(M≧2) threshold levels is written, and at least one reference cell, in which a reference threshold level is written, are defined in the memory cell array,
   at the data reading, a read voltage applied to the information cell is set to be equal to or near a verify-read voltage for verifying an m-th higher threshold level (m is equal to 1 or a natural number from 1 to M−1) in M threshold levels written into the information cell while a reference read voltage applied to the reference cell is set to be higher than a verify-read voltage for verifying the reference threshold level written into the reference cell by a predetermined level, and the predetermined level is lower than a difference between a verify-read voltage for verifying an m+1-th higher threshold level written into the information cell and the read voltage, and
   the sense amplifier circuit detects a cell current difference between information cell currents generated by sequentially applying various read voltages to the information cell and a fixed reference current generated by applying the reference read voltage to the reference cell selected simultaneously in the memory cell array to sense data defined by the M threshold levels of the information cell.

2. The semiconductor memory device according to claim 1, wherein
   the memory cell array is formed of NAND cell units arranged therein, each NAND cell unit including a plurality of the memory cells connected in series.

3. The semiconductor memory device according to claim 1, wherein
   one of four threshold levels L0, L1, L2 and L3 (where, L0<L1<L2<L3) is written into the information cell while reference threshold level L4 is written into the reference cell, and wherein
   four-value data (HB,LB) (where, HB is an upper bit; and LB a lower bit) is stored as being defined by combinations between the threshold levels L0, L1, L2 and L3 of the information cell and the reference threshold level L4 of the reference cell.

4. The semiconductor memory device according to claim 3, wherein
   the four-value data is read out through:
   a first read step for reading out the upper bit data with a first read voltage applied to the information cell and a reference read voltage applied to the reference cell, the first read voltage being substantially equal to or near the threshold level L2, the reference read voltage being higher than the threshold level L4;
   a second read step for reading out the lower bit data in case the upper bit data is in a first logic state with a second read voltage applied to the information cell and the reference voltage applied to the reference cell, the second read voltage being substantially equal to or near the threshold level L3; and
   a third read step for reading out the lower bit data in case the upper bit data is in a second logic state with a third read voltage applied to the information cell and the reference voltage applied to the reference cell, the third read voltage being substantially equal to or near the threshold level L1.

5. The semiconductor memory device according to claim 4, wherein
   the lower bit data is read out independently of the upper bit data based on judging oddness/evenness of the number of "1" obtained though the second and third read steps.

6. The semiconductor memory device according to claim 3, wherein
   the four-value data is written through:
   a first write step for writing the reference threshold level L4 into the reference cell, which has been erased in the threshold level L0;
   a second write step for selectively writing the threshold level L2 into the information cells, which have been erased in the threshold level L0, in accordance with the upper bit data;
   a third write step for selectively writing the threshold level L3 into the information cells, which have been set in the threshold level L2, in accordance with the upper bit data and the lower bit data; and
   a fourth write step for selectively writing the threshold level L1 into the information cells, which have been erased in the threshold level L0, in accordance with the upper bit data and the lower bit data.

7. The semiconductor memory device according to claim 1, wherein
   the memory cell array comprises first and second cell arrays, each of which includes bit lines and word lines disposed as intersecting each other, and memory cells disposed at crossings thereof plural memory cells being so connected in series as to constitute a NAND cell unit;
   each of the first and second cell arrays has plural NAND blocks in the direction of the bit line, each NAND block being defined by a set of plural NAND cell units arranged in the direction of the word line;

one NAND block selected in each of the first and second cell arrays serves as a reference cell block, and the remaining NAND blocks serve as information cell blocks; and the sense amplifier circuit comprises a plurality of sense units each having a current detecting type of a differential amplifier, which detects a cell current difference between the information cell in the information cell block selected in one of the first and second cell arrays and the reference cell in the reference cell block selected in the other, thereby sensing data.

8. The semiconductor memory device according to claim 7, wherein the memory cell array is formed with an open bit line scheme, in which simultaneously selected bit lines constitute a pair and are coupled to the sense amplifier circuit disposed between the first and second cell array, or formed with a folded bit line scheme, in which the first and second cell arrays are disposed on one side of the sense amplifier circuit.

9. The semiconductor memory device according to claim 7, wherein each of the sense units comprises a reference transistor, which is coupled to one input node of the differential amplifier in a verify-write mode and a verify-erase mode and supplies a reference current serving for detecting that a selected information cell becomes to have a certain threshold level.

10. The semiconductor memory device according to claim 7, wherein each of the sense units comprises n-data latches, which are selectively coupled to the differential amplifier or the bit line pair for storing $n(\geq 1)$-bit data in $M(\geq 2)$-value data.

11. The semiconductor memory device according to claim 10, wherein in a verify-write mode, externally supplied write data are loaded in the corresponding data latches, and while one bit line selected in the first and second cell arrays is coupled to one input node of the differential amplifier, the reference transistor is coupled to the other input node in accordance with bit data held in the data latches.

12. The semiconductor memory device according to claim 10, wherein in a verify-erase mode, the first and second cell arrays are sequentially selected in accordance with complementary data loaded in the two data latches, and while the bit line in a selected cell array is coupled to one input node of the differential amplifier, the reference transistor is coupled to the other input node.

13. The semiconductor memory device according to claim 10, wherein in a read mode, it is detected whether the number of "1" read data is even or odd based on the data shift operation of a shift register constituted by the two data latches.

14. The semiconductor memory device according to claim 10, wherein each of the first and second cell arrays includes bit lines and word lines disposed as intersecting each other, and memory cells disposed at crossings thereof, plural memory cells being so connected in series as to constitute a NAND cell unit;

each of the first and second cell arrays has plural NAND blocks arranged in the direction of the bit line, each NAND block being defined by a set of plural NAND cell units arranged in the direction of the word line;

one NAND block selected in each of the first and second cell arrays serves as the reference cell block, and the remaining NAND blocks serve as the information cell blocks; and in a read mode, one information cell block in one of the first and second cell arrays and the reference cell block in the other cell array are simultaneously selected.

15. A semiconductor memory device comprising:

first and second cell arrays each having electrically rewritable and non-volatile memory cells arranged therein and a plurality of information cell blocks and at least one reference cell block defined therein, each memory cell in the information cell blocks serving as a information cell to be written into one of M threshold levels, where $M=2^n$ (n: an integer equal to or more than 2), each memory cell in the reference cell block serving as a reference cell to be written into a reference threshold level; and a sense amplifier circuit configured to detect cell currents generated by sequentially applying various read voltages to an information cell selected in one of the first and second cell arrays in comparison with a reference current generated by applying a fixed reference read voltage to a reference cell selected in the other cell array, thereby sensing M-value data defined by the M threshold levels, wherein at the data reading, the read voltage applied to the information cell is set to be equal to or near a verify-read voltage for verifying an m-th higher threshold level (m is equal to a natural number from 1 to M−1) in M threshold levels written into the information cell while the reference read voltage applied to the reference cell is set to be higher than a verify-read voltage for verifying the reference threshold level written into the reference cell by a predetermined level, and the predetermined level is lower than a difference between a verify-read voltage for verifying an m+1-th higher threshold level written into the information cell and the read voltage.

16. The semiconductor memory device according to claim 15, wherein one of four threshold levels L0, L1, L2 and L3 (where, L0<L1 <L2<L3) is written into each information cell while reference threshold level L4 is written into each reference cell, and wherein four-value data (HB,LB) (where, HB is an upper bit; and LB a lower bit) is stored as being defined by combinations between the threshold levels L0, L1, L2 and L3 of the information cell and the reference threshold level L4 of the reference cell.

17. The semiconductor memory device according to claim 16, wherein the upper bit data of the four-value data is read out in such a way that a cell current of a selected information cell applied with a first read voltage near the threshold level L2 is detected in comparison with a reference current of a selected reference cell applied with a reference read voltage higher than the reference threshold level L4;

the lower bit data of the four-value data is read out independently of the upper bit data in such a way that it is detected whether the number "1" obtained through first and second read steps, the first read step being defined by: a second read voltage is applied to a selected information cell, the second read voltage being near the threshold level L3, while the reference read voltage is applied to a selected reference cell, the second read step being defined by: a third read voltage is applied to the selected information cell, the third read voltage being near the threshold level L1, while the reference read voltage is applied to the reference cell.

18. The semiconductor memory device according to claim 15, wherein the sense amplifier circuit comprises a plurality of sense units, which detect cell currents of a plurality of the information cells simultaneously selected in one of the information cell blocks in one of the first and second cell arrays in comparison with the corresponding reference currents of a plurality of the reference cells simultaneously selected in the reference cell block in the other cell array, in each of the first and second cell arrays, main page addresses each serving for simultaneously selecting the information cells corresponding to the number of the sense units, and sub-page addresses each serving for simultaneously selecting n-bit in each main page address, and n-bit data in the M-value data are assigned in such a manner that the sub-page addresses are accessed independently of each other in each main page address in a read mode.

19. The semiconductor memory device according to claim 18, wherein each of the sense units comprises a differential amplifier and a reference transistor, which is coupled to one input node of the differential amplifier in a verify-write mode and a verify-erase mode and supplies a reference current serving for verifying that a selected information cell becomes to have a certain threshold level.

20. The semiconductor memory device according to claim 19, wherein each of the sense units comprises n-data latches, which are selectively coupled to the differential amplifier or the bit line pair for storing n-bit data in M-value data.

* * * * *